US006979864B2

(12) United States Patent
Negoro et al.

(10) Patent No.: US 6,979,864 B2
(45) Date of Patent: Dec. 27, 2005

(54) SEMICONDUCTOR DEVICE AND METHOD FOR FABRICATING SUCH DEVICE

(75) Inventors: Takaaki Negoro, Kishiwada (JP); Keiji Fujimoto, Hyogo-ken (JP)

(73) Assignee: Ricoh Company, Ltd., (JP)

( * ) Notice: Subject to any disclaimer, the term of this patent is extended or adjusted under 35 U.S.C. 154(b) by 0 days.

(21) Appl. No.: 11/115,340

(22) Filed: Apr. 27, 2005

(65) Prior Publication Data

US 2005/0194639 A1    Sep. 8, 2005

Related U.S. Application Data

(62) Division of application No. 10/179,371, filed on Jun. 26, 2002, now Pat. No. 6,911,694.

(30) Foreign Application Priority Data

Jun. 27, 2001  (JP) ............................. 2001-195380
Jul. 19, 2001  (JP) ............................. 2001-219446

(51) Int. Cl.$^7$ ..................... H01L 29/76; H01L 29/94; H01L 31/062; H01L 31/113; H01L 31/119

(52) U.S. Cl. ..................... 257/335; 257/337; 257/343

(58) Field of Search ............................. 257/335, 337, 257/343

(56) References Cited

U.S. PATENT DOCUMENTS

| 37,424 A | 1/1863 | Meyers |
| 4,887,142 A | 12/1989 | Bertotti et al. |
| 5,610,421 A | 3/1997 | Contiero et al. |
| 5,917,222 A | 6/1999 | Smayling et al. |
| 6,130,458 A | 10/2000 | Takagi et al. |

(Continued)

FOREIGN PATENT DOCUMENTS

JP    07-302903    11/1995

(Continued)

OTHER PUBLICATIONS

Kim. et al., "Fabricating High-Current Integrated Circuit Having Lateral Trench Gate DMOS Power Device", Derwent Acc No. 2002-730211.

Primary Examiner—Jerome Jackson
Assistant Examiner—Edgardo Ortiz
(74) Attorney, Agent, or Firm—Dickstein Shapiro Morin & Oshinsky LLP

(57) ABSTRACT

An LDMOS transistor and a bipolar transistor with LDMOS structures are disclosed for suitable use in high withstand voltage device applications, among others. The LDMOS transistor includes a drain well region 21 formed in P-type substrate 1, and also formed therein spatially separated one another are a channel well region 23 and a medium concentration drain region 24 having an impurity concentration larger than that of drain well region 21, which are simultaneously formed having a large diffusion depth through thermal processing. A source 11s is formed in channel well region 23, while a drain 11d is formed in drain region 24 having an impurity concentration larger than that of drain region 24. In addition, a gate electrode 11g is formed over the well region, overlying the partially overlapped portions with well region 23 and drain region 24 and being separated from drain 11d. Since the source 11s, well region 23, and drain region 24 are respectively self-aligned to the gate electrode 11g, resultant transistor characteristics are stabilized, and the decrease in the on resistance and improved drain threshold voltages can be achieved. Also disclosed herein are bipolar transistors with LDMOS structures, which are capable of obviating the breakdown of gate dielectric layers even at high applied voltage and achieving improved stability in transistor characteristics.

20 Claims, 31 Drawing Sheets

U.S. PATENT DOCUMENTS

| | | |
|---|---|---|
| 6,267,479 B1 | 7/2001 | Yamada et al. |
| 6,894,349 B2 * | 5/2005 | Beasom ...................... 257/343 |
| 6,911,694 B2 * | 6/2005 | Negoro et al. .............. 257/336 |

FOREIGN PATENT DOCUMENTS

| | | |
|---|---|---|
| JP | 10-335663 | 12/1998 |

* cited by examiner

SEMICONDUCTOR DEVICE AND METHOD FOR FABRICATING SUCH DEVICE

CROSS-REFERENCE TO RELATED APPLICATION

This application is a divisional of U.S. patent application Ser. No. 10/179,371, filed on Jun. 26, 2002 U.S. Pat. No. 6,911,694, the subject matter of which is incorporated in its entirety by reference herein.

FIELD OF THE INVENTION

This patent specification relates generally to a semiconductor device and methods for fabricating such device, and more specifically to a semiconductor device incorporating either an LDMOS transistor or a bipolar transistor with LDMOS structure, for suitable use in device applications with high withstand voltage.

BACKGROUND OF THE INVENTION

As the use of semiconductor devices incorporating regulator and DC/DC converter circuits becomes more widespread, it is increasingly important to meet the demands for higher output currents of these devices among others.

In one approach to achieve the high output currents, LDMOS transistors have been attracting much attention, which operate with low on resistance. In addition, the LDMOS transistors are known to have a structure suitable for miniaturization with a decreased chip area yet attaining high withstand voltages.

The "LDMOS (lateral double-diffusion MOS) transistor" is a field effect transistor, including at least a low concentration impurity doped layer (channel well region) formed to surround a source, and for the surface portions of the channel well region under a gate electrode to serve as a channel. In addition, by "conventional MOS transistor" is meant herein one having a drain with an impurity concentration larger than that of a channel region.

FIG. 8A is a diagrammatic cross-sectional view illustrating an N-type LDMOS transistor previously known.

Referring to FIG. 8A, the LDMOS transistor comprises an N-type high resistance silicon substrate 102 and the structure including a polysilicon gate electrode 106 formed with a contiguously underlying gate oxide layer 104, and a channel well region 108 formed by implanting, using the source side edge portion of the gate electrode 106 as a mask, then thermally diffusing P-type impurity ions so as for a portion thereof to serve as a channel.

In addition, N-type low resistance source and drain 110 and 112, respectively, are formed by implanting, using the gate electrode 106 as a mask, and then thermally diffusing P-type impurity ions. Also included are an interlayer dielectric layer 114, and electrode wirings, 116 and 118, connected to the N-type source and drain, 110 and 112, respectively (Japanese Laid-Open Patent Application No. 7-302903).

When an LDMOS transistor is utilized as a high voltage CMOS transistor, several improvements are made to relax the electric field strength in the region between drain and gate electrode. As an example, the thickness at the drain side edge of a gate oxide 104a is increased, as illustrated in FIG. 8B, or alternatively, a field oxide layer 104b is formed in the vicinity of the drain edge portion contiguously under the gate oxide 106, having a thickness larger than that of the gate oxide layer, as illustrated in FIG. 8C.

In addition, the drain 120 in the above structures is formed as a medium concentration drain region contiguously under the thick oxide layer, 104a or 104b, having a concentration of N-type impurity higher than that of the silicon substrate 102, and lower than that of the N-type drain 112. Also, the region 108a in these structures serves as a contact region to be connected to the channel well region 108.

In these structures, however, there arise several drawbacks which will be described as follows. For example, the size of the transistor has to be increased in proportion to the area required for forming the thick oxide layer, 104a or 104b. In addition, the drain resistance is also increased in a similar manner. As a result, the on resistance of the transistor increases.

Also, in the structure of FIG. 8B, another difficulty may arise during photolithography and etching process steps for forming the gate oxide 104a. Namely, transistor characteristics may vary considerably depending on the degree of precision in these alignment and etching steps.

Although the precision in forming the field oxide layer 104b in the drain edge portion shown in FIG. 8C can be increased by using the LOCOS (local oxidation of silicon) method, the transistor characteristics may be deteriorated by the crystal structural disorder which is induced by the field oxide layer formed as above at the region under the gate oxide. In these structures of FIGS. 8B and 8C, therefore, difficulties arise in implementing the miniaturization of the transistors.

In contrast, in the structure without increasing the gate oxide layer thickness in the drain edge portion as shown in FIG. 8A, the concentration of the electric field in this portion may cause the deterioration in threshold voltage by the N-type drain 112 at the region contiguously formed under the gate oxide 104.

Although this deterioration in the withstand voltage can be reduced to a certain degree by lowering the N-type impurity concentration in the oxide side portion of the drain 112, this lowered concentration region, in turn, may cause deteriorating effect on the withstand voltage, since a depletion layer extends to the low concentration region with relative ease even at relatively low voltages applied to the drain 112.

In order to improve the characteristics of the LDMOS transistor by increasing the withstand voltage, there disclosed is a structure including a high concentration drain formed spatially separated from a gate electrode. The structure is illustrated in FIG. 9 as a diagrammatic cross-sectional view of an N-channel type LDMOS transistor previously known (which is hereinafter referred to as 'Prior art 1').

Referring to FIG. 9, an N-type drain well region 21 is formed in a P-type semiconductor substrate 1. In the N-type drain well region 21, a P-type well region 23 is subsequently formed. An N-type source 11s is formed in the P-type well region 23.

Also formed in the N-type well region 21 is a medium concentration N-type drain 11d, which is situated spatially separated from the P-type well region 23 having a concentration of N-type impurities introduced higher than that of the N-type well region 21.

Furthermore, an N-type gate electrode 11g, made of polysilicon, is formed with an underlying gate oxide layer 11ox interposed between the gate electrode 11g and the well region 21. This gate electrode 11g is formed in intermediate between N-type source 11s and N-type drain 11d above N-type well region 21, overlying the P-type well region 23, and being separated from the N-type drain 11d. Therefore, the surface of the P-type channel well region 23 under the N-type gate electrode 11g serves as a channel region.

The on resistance of LDMOS transistor is determined by the sum of channel resistance, drain resistance, and source resistance. In the aforementioned N-channel type LDMOS transistor (Prior art 1), its source resistance is decreased by forming the N-type source 11s in the self-aligned manner with respect to the N-type gate electrode 11g.

However, the drain resistance for drain 21a is relatively high due to a large resistance component of the N-type well region 21, and the drain resistance becomes dominant compared with a decreasing channel resistance in the range of high gate voltage. As a result, there arises a difficulty in the previous channel type LDMOS transistor, in that drain current cannot be increased as desired with the increase in the gate voltage, as illustrated in FIG. 11. Namely, although the drain current Id increases with increasing drain voltage Vg up to approximately 3V, almost no increase in Id is observed beyond this voltage.

In addition, there encountered is another difficulty as illustrated in FIG. 12A, in which a drain breakdown is caused with relative ease after parasitic bipolar operations in the high voltage range for MOS transistor drain.

In order to obviate such difficulties, an LDMOS transistor is disclosed in Japanese Laid-Open Patent Application No. 7-302903, in which its source and drain are formed by double diffusion to thereby improve the transistor characteristics.

Although the electric field strength in vicinity of the drain is relaxed to a certain degree in this stricture through the double diffusion, an overlap exists between the high concentration drain and the edge portion of the gate electrode.

When the present inventors fabricated an LDMOS transistor according to that disclosure, it was found that the drain withstand voltage was obtained approximately 10 V at most, possibly due to a relatively small width of the aforementioned low concentration diffusion region formed by the double diffusion and a concomitant gate modulation effect.

A further assumption was made also by the present inventors from the above results that it was appropriate for a high concentration drain to be formed spatially separated sufficiently from the gate electrode with a distance of 1.0 μm or greater, for example. This and related points will be detailed later on.

In order to improve the drain voltage characteristics, another structure of the LDMOS transistor is disclosed in Japanese Laid-Open Patent Application No. 10-335663, in which implantation and subsequent diffusion process steps are carried out into the surface of a well region between a gate electrode and a high concentration drain in the self-aligned manner for forming a low resistance region.

In this structure, however, a source of the transistor is not formed in the self-aligned manner, thereby resulting in remaining source resistance. As a result, there remains some source resistance, which is insufficient for reducing the on resistance of the transistor.

The present inventor then formed another LDMOS transistor according to the disclosure, with the exception that both source and drain were formed in the self-aligned manner (FIG. 10).

FIG. 10 is a diagrammatic cross-sectional view of the thus formed N-channel type LDMOS transistor (which is hereinafter referred to as 'Prior art 2'), in which components operating in a similar manner to those of FIG. 9 are shown with identical numerical representation and descriptions thereof are herein abbreviated.

Referring to FIG. 10, there formed are N-type source, drain, gate oxide layer, gate electrode and drain well region, 11s, 11d, 11ox, 11g and 21, respectively, and a P-type channel well region 23. The N-type source 11s is formed in the self-aligned manner with respect to the N-type gate electrode 11g.

An N-type medium concentration drain region 24 is formed in the surface region of the N-type drain well region 21 on the side of the N-type drain 11d. The N-type medium concentration drain region 24 is formed also in the self-aligned manner with respect to the N-type gate electrode 11g. In addition, the N-type medium concentration drain region 24 is formed with a depth from the surface smaller than that of the N-type drain 11d.

In the thus formed structure provided with the N-type medium concentration drain region 24, drain currents Id during MOS operations have been improved in the range of high gate voltage Vg over those obtained with the structure of the aforementioned Prior art 1, as shown in FIG. 11.

However, the drain thermal breakdown takes place during parasitic bipolar operations at a drain current Id of approximately 12 mA in the higher range of the applied gate voltage Vg, as shown in FIG. 12B. This is therefore indicative of a still persisting difficulty of low withstand voltage which is unsatisfactory in practice for the LDMOS transistor.

The improvements in transistor characteristics such as withstand voltage and on resistance have been described herein above with respect to the LDMOS transistors, in that its on resistance is reduced and transistor characteristics are stabilized for the LDMOS transistor. It is desirable, however, for the LDMOS transistor to have additional improvements in the reduced on resistance for use in practical device applications as well.

As an example, the gate oxide layer 104 is formed relatively thin so as to reduce the on resistance, and this small thickness has an effect on the voltage applied thereto. That is, the LDMOS transistor has to be operated under the voltage applied to the gate electrode 106 so as not to breakdown the gate oxide layer 104.

When the gate oxide layer 104 is formed with a thickness of 25 nm, for example, a voltage of 25 V or larger is known to cause the layer breakdown with relative ease, thereby indicating the voltage normally applied to the gate electrode 106 in the order of 15 V at most. As a result, the range of the gate voltage has to be set different from that of the drain voltage for driving the LDMOS transistors.

This is exemplified by DC/DC device products, in which the efficiency is one of the factors of practical importance for the products. In order to achieve the efficiency, inverter outputs are necessitated at the input potential (source voltage) and the ground potential.

Although one of the means for achieving the efficiency is to control the voltage input to the gate electrode, which is carried out by lowering this voltage by an internal stepdown circuit, for example, this method is not so efficient after all, since the efficiency is reduced to a certain degree since the steps of lowering the voltage are already involved. It is desirable, therefore, to obviate such a difficulty mentioned above.

There is a method previously known for preventing such difficulty, in which a bipolar transistor is utilized as a switching element having high withstand voltages in place of the LDMOS transistor.

Since the function of the base diffusion layer of bipolar transistor corresponds to that of the gate electrode of LDMOS transistor, the bipolar transistor is operated to control the input not by applied voltage, but by forward current flow. As a result, the input voltage is known as small as on the order of one volt.

In order to achieve low on resistance values for a bipolar transistor, the vertical type thereof is generally formed. In the vertically constructed bipolar transistor, however, the structure includes an epitaxial layer as the collector, a buried layer, and a collector wall diffusion layer for decreasing collector resistance. In addition, the structure has to also include an isolation diffusion layer for implement the diffusion isolation from other elements. The vertical bipolar transistor, therefore, has a drawback such as complicated process steps for the fabrication.

In contrast, another type of bipolar transistor is known with laterally constructed structure (lateral bipolar transistor), which can be fabricated with relatively simpler process steps.

In the lateral bipolar transistor, however, its collector-emitter distance has to be sufficiently separated to satisfy high withstand voltage requirements. Therefore, a difficulty arises in the lateral bipolar transistor, in that current amplification remains low compared with the vertical bipolar transistor, since the base width increases and the surface portion only between collector and gate is available for the current flow.

Thus, the present inventors have investigated in detail an LDMOS structure of the bipolar transistor, which can be fabricated with simpler process including the step of forming double diffusion structure with the layers of different conductivity types, which is carried out in the self-aligned manner with respect to a polysilicon gate electrode.

This LDMOS structure includes a drain diffusion layer, a channel diffusion layer, and a source diffusion layer. These layers are constructed to have a lateral bipolar structure in the region directly below a gate oxide layer, and a vertical bipolar transistor structure further below.

Therefore, when the drain, channel, and source diffusion layers are operated to function as a collector, base, and emitter, respectively, the bipolar transistor with the LDMOS structure may be capable of retaining high withstand voltages even after decreasing its base width.

However, there remains a difficulty yet to be solved for the LDMOS structure of the bipolar transistor, in that the gate oxide layer is deteriorated when high voltages are applied to the gate electrode.

BRIEF SUMMARY OF THE INVENTION

Accordingly, the present invention provides a semiconductor device incorporating an LDMOS transistor or a bipolar transistor for use in high withstand voltage device applications, and its method of fabrication.

The semiconductor device disclosed herein includes at least an LDMOS transistor. The LDMOS transistor comprises a semiconductor substrate; a uniformly thick gate oxide layer provided on the semiconductor substrate; a gate electrode provided on the gate oxide layer; a drain well region of a first conductivity type formed in a region including the gate electrode; a channel well region of a second conductivity type, which is opposite to the first conductivity type, with an ion impurity concentration greater than the drain well region; the channel well region formed in the drain well region having a partial overlap with the gate electrode; a source of the first conductivity type formed contiguously to one side of the gate electrode in the channel well region; a medium concentration drain region of a first conductivity type with an ion impurity concentration greater than the drain well region; the medium concentration drain region formed in the drain well region having a partial overlap with a different side of the gate electrode; and a drain of a first conductivity type with an ion impurity concentration greater than the medium concentration drain region; the drain of a first conductivity type formed in the medium concentration drain region which is spatially separated from the gate electrode.

Therefore, in this fabricated LDMOS transistor, the drain is formed in the drain well region having a partial overlap with one of the sides of the gate electrode. Accordingly, a suitable drain threshold and a low on resistance is achieved for the LDMOS transistor.

In another aspect, a method for fabricating an LDMOS transistor is disclosed herein, which comprises the steps of forming a drain well region of a first conductivity type in a semiconductor substrate; forming a uniformly thick gate oxide layer contiguously above the surface of the drain well region; forming a gate electrode contiguously above the gate oxide layer; forming a channel well region of a second conductivity type which is opposite to the first conductivity type, in an area in the drain well region that is contiguous to one side of the gate electrode in a self-aligned manner respective to the gate electrode, by first implanting impurity ions of a second conductivity type into the region and then thermally diffusing the impurity ions; forming a medium concentration drain region of a first conductivity type in an area in the drain well region opposite to the channel well region in a self-aligned manner respective to the gate electrode, by implanting impurity ions of a first conductivity type into the region, and forming a source, and a drain of a first conductivity type in the medium concentration drain region and the channel well region, respectively, by implanting impurity ions of a first conductivity type; such that the drain is spatially separated from the gate electrode having a depth smaller than the medium concentration drain region and the channel well region, and such that the source is self-aligned with respect to the gate electrode.

Accordingly, an LDMOS transistor fabricated with the methods herein, has an improved on resistance and drain threshold voltage. In addition, the source's resistance is decreased and the fabricated transistor's characteristics are more stabilized since the source is formed in a self-aligned manner with respect to the gate electrode. Similarly, the drain resistance is decreased and the fabricated transistor's characteristics are more stabilized since the medium concentration drain region is self-aligned with respect to the gate electrode. The fabricated transistor's characteristics are further stabilized since the channel well region is self-aligned with respect to the gate electrode.

It is another object of the present disclosure to provide a bipolar transistor device having an LDMOS structure capable of preventing the breakdown of gate oxide layers; whereby, stable operational characteristics are acquired with as desirable current amplification factor linearity despite reduced base width.

The bipolar transistor device includes at least a collector, comprising a diffusion layer of a first conductivity type, formed within a semiconductor substrate; a gate dielectric layer provided on the semiconductor substrate; a gate electrode provided on the gate dielectric layer; a base, comprising a diffusion layer of a second conductivity type opposite to the first conductivity type, formed in the collector having a partial overlap with the gate electrode; an emitter, made of a diffusion layer of a first conductivity type, formed in near one side of the gate electrode in the base; a high concentration ohmic diffusion layer for connecting the base, comprising a diffusion layer of a second conductivity type, opposite to the first conductivity type, formed in the base which is spatially separated from the emitter; and a high concentration ohmic diffusion layer for connecting the collector, comprising a diffusion layer of a first conductivity type, formed in the collector on an opposite side of the gate electrode, in which a wiring is formed to connect the gate electrode with the base, such that they are equipotential to each other.

In an exemplary embodiment, the bipolar transistor can be fabricated in an analogous manner as described above, with the exception that the wiring is formed to connect the gate electrode with the emitter, such that they are equipotential to each other.

In either exemplary embodiment of a bipolar transistor: (1) the gate electrode and the base are equipotential to each other, or (2) the gate electrode and the emitter are equipotential to each other, assuming that the emitter and base are first brought to be equipotential to each other and then the transistor is turned off. If a potential difference is created between the collector (corresponding to the drain of DMOS) and the base (corresponding to the channel of DMOS), a depleted region is created at an interface between the collector and base. Alternatively, a depleted region can be created in the interface region on both sides of the collector and the base, in a similar manner to the off-state of the LDMOS transistor; whereby, high withstand voltages then can be maintained.

However, if the emitter and base are not brought to be equipotential to each other again, in either embodiments of (1) or (2) with the transistor turned on, the potential between the base and emitter becomes forward-biased, which is in contrast to DMOS (double-diffused MOS).

In addition, in the first exemplary embodiment (1), with the bipolar transistor turned on, when a potential is applied to the emitter and gate electrode, the voltage created between the base and the emitter is only a forward-biased voltage. A high voltage does not appear at the gate electrode of the transistor. Accordingly, the breakdown of the gate dielectric layer can be prevented even when a high voltage (i.e., the source potential) is applied. Therefore, stable operational characteristics is obtained for a bipolar transistor.

In the second exemplary embodiment (2), with the bipolar transistor turned on, when a potential is applied to the base and gate electrode, the potential applied becomes forward-biased because of the forward-biased voltage that exists between the base and emitter. As a result, a forward-biased voltage is applied to the gate electrode. Accordingly, breakdown of the gate dielectric layer can be prevented even when a high voltage (i.e., the source potential) is applied. Therefore, stable operational characteristics is also obtained for a bipolar transistor.

Furthermore, when the emitter and high concentration ohmic diffusion layer (both are high concentration diffusion layers) are in close proximity to each other in the base, a junction leak between emitter and base can increase in either exemplary embodiments (1) or (2). Therefore, the emitter and high concentration ohmic diffusion layer (which connects the base) are spatially formed separate from each other in the fabricated transistor.

In addition, the fabricated structures with respective wiring as illustrated in exemplary embodiments (1) and (2), the function of the transistor depends on the lateral bipolar structure in the region directly below the gate oxide layer. This lateral structure enables formation of a concentration gradient through the collector, base, and emitter layers in the transistor, thereby decreasing the base width. Accordingly, bipolar transistors can be fabricated with reduced chip areas a having high efficiency.

In another aspect of the present invention, a method for fabricating a bipolar transistor is disclosed which comprises the steps of forming a collector, comprising a diffusion layer of a first conductivity type within a semiconductor substrate; providing a gate dielectric layer contiguously above the surface of the collector; providing a gate electrode contiguously above the gate dielectric layer; providing a base, comprising a diffusion layer of a second conductivity type opposite to the first conductivity type, within the collector contiguous to one side of the gate electrode, self-aligned with respect to the gate electrode; first by implantation of impurity ions of a second conductivity type into the region and then thermally diffusing the impurity ions; forming a high concentration ohmic diffusion layer that connects the collector of a first conductivity type in the base, which is in close proximity to the gate electrode on the other side of the gate electrode with respect to the base, self-aligned with respect to the gate electrode, by implantation of impurity ions of a first conductivity type; forming an emitter, comprising a diffusion layer of a first conductivity type in the base, a self-aligned with respect to the gate electrode; forming a high concentration ohmic diffusion layer to connect the base of a second conductivity type, in the base spatially separated from the emitter, by implantation of impurity ions of a second conductivity type; and forming a wiring to connect the gate electrode with the base such that they are equipotential to each another.

In an exemplary embodiment, a bipolar transistor can be fabricated in an analogous manner, as described above, with the exception that the wiring is formed to connect the gate electrode with the emitter, such that they are equipotential to each other. This step is in lieu of forming a wiring to connect the gate electrode with the base, such that they are equipotential to each other.

According to the varying embodiments, a bipolar transistor can be fabricated with the gate electrode and the base connected, such that they are equipotential to each other, or a bipolar transistor can be fabricated with the gate electrode and the emitter connected, such that they are equipotential to each other.

In addition, the base and emitter are formed self-aligned to the gate electrode. This enables one to determine the current amplification factor of the bipolar transistor with the lateral bipolar transistor structure, and also the base width as small as predetermined, through which most of the current flow exists.

Furthermore, by forming the base and emitter self-aligned to the gate electrode, the dispersion in alignment of the base width during photolithographic processing steps can be made small enough so that it is disregarded. Accordingly, a bipolar transistor with high-efficiency formed with a reduced chip area.

The features and advantages thereof of the present invention will be more readily apparent from the following detailed description and appended claims when read in conjunction with the drawings.

DETAILED DESCRIPTION OF THE INVENTION

Figure 1:
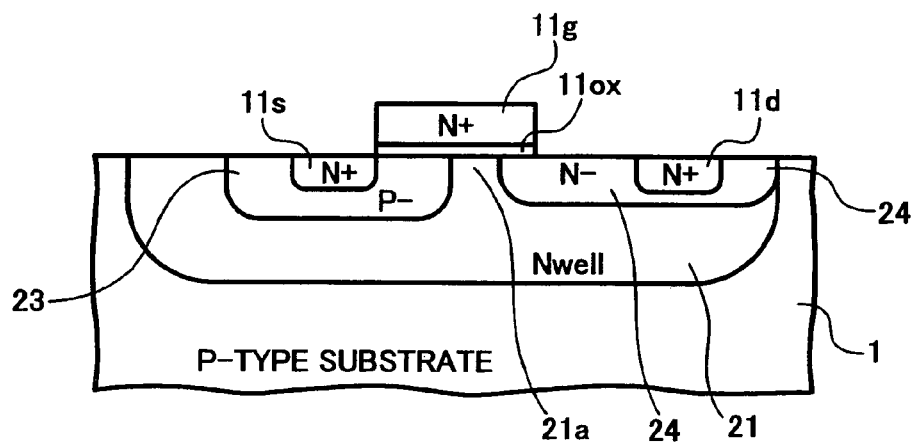
FIG. 1 is a cross-sectional view illustrating an NchLDMOS transistor according to one exemplary embodiment.

In the detailed description which follows, specific embodiments on a semiconductor device incorporating either an LDMOS transistor or a bipolar transistor, and methods for fabricating such semiconductor devices.

It is understood, however, that the present disclosure is not limited to these embodiments, and it is appreciated that the device and the method disclosed herein may also be adaptable to any form of semiconductor devices. Other embodiments will be apparent to those skilled in the art upon reading the following description.

In addition, the first half of the following description relates semiconductor devices incorporating LDMOS and MOS transistors, while the second half relates bipolar transistors primarily having the LDMOS structure.

In an LDMOS semiconductor incorporated into a semiconductor device disclosed herein, as will be detailed herein below, the LDMOS semiconductor is formed in a semiconductor substrate, including at least a medium concentration drain region formed preferably having an impurity concentration smaller than that of a channel well region. As a result, an undue decrease in the effective channel length can be obviated, which may be caused during thermal diffusion process steps for forming both medium concentration drain region and channel well region.

Also in the semiconductor device, the semiconductor substrate is of P conductivity type and the LDMOS transistor also of P-channel type. Further included are conventional P-channel type, and N-channel type MOS transistors, in which two regions for forming therein the P-channel type LDMOS transistor and the P-channel type MOS transistor, respectively, are preferably formed simultaneously in an N-type isolation well region in the semiconductor substrate, and a P-type drain well region for forming the P-channel type LDMOS transistor and a P-type well region for forming a conventional N-channel type MOS transistor are formed simultaneously in the N-type isolation well region. As a result, process steps can be simplified.

In the case of another semiconductor device, the semiconductor substrate is of P conductivity type and the LDMOS transistor is of N-channel type. Further included is a conventional P-channel type MOS transistor, in which an N-type drain well region for forming the N-channel type LDMOS transistor and an N-type well region for forming the conventional P-channel type MOS transistor are formed simultaneously in the semiconductor substrate. As a result, process steps can be simplified.

Although P conductivity type of semiconductor substrates are utilized for forming the above semiconductor devices, N conductivity type of substrates may alternatively be used to form semiconductor devices including components of the opposite conductivity type.

When both LDMOS transistor and conventional N-channel type MOS transistor are incorporated into the semiconductor device, the gate oxide layer formed contiguously under the LDMOS transistor has a thickness smaller than that of the conventional MOS transistor. This facilitates to decrease on resistance for the LDMOS transistor.

The semiconductor devices disclosed herein may suitably be incorporated into several circuits.

For example, there provided is a power source unit with a circuit capable of outputting a constant voltage by performing, comparison operations between an output voltage and a reference voltage, and feedback operations based on comparison results. By incorporating the LDMOS transistor disclosed herein, the area for output driver can be reduced because of decreased on resistance values of the transistor.

As another example, a charge pump type DC/DC converter may be provided for outputting a persistent current flow by charging and discharging a capacitor performed by repeated switching operations with a plurality of integrated switches. By utilizing the LDMOS transistor disclosed herein as at least one of the switches, the chip area required for resistors in practical products can be reduced, since decreased on resistance values facilitate to increase current supply.

In the methods for fabricating a semiconductor device disclosed herein, the step of thermally diffusing impurity ions during the formation of the medium concentration drain region is preferably carried out after ion implantation steps. This gives rise to an increase in the region of the medium concentration drain compared with the region formed without thermal diffusion, to thereby result in an increase in the number of ions possibly introduced in the region. As a result, the resistance of the medium concentration drain region can be decreased along with a decrease in drain resistance yet maintaining high threshold voltages.

Also, in the methods for fabricating the semiconductor device, the step of thermally diffusing impurity ions for forming the medium concentration drain region is preferably carried out simultaneously with the step of thermally diffusing impurity ions for forming the channel well region. As a result, the medium concentration drain region can be increased without adding any further thermal diffusion step.

Furthermore, in the method for fabricating the semiconductor device, the number of impurity ions implanted for forming the channel well region is preferably greater than that for forming the medium concentration drain region. As a result, an undue decrease in the effective channel length can be obviated, which may be caused during thermal diffusion process steps for forming both medium concentration drain region and channel well region.

When both LDMOS transistor and conventional MOS transistor are incorporated into the semiconductor device, respective polysilicon gate electrodes of these two transistors are formed simultaneously in order to reduce the process steps.

In addition, in order to fully develop the characteristics of the LDMOS transistor, the channel well region thereof has to be formed in the self-aligned manner with respect to the gate electrode. The sequence of process steps, therefore, begins with channel doping steps for determining a threshold of the conventional type MOS transistors, which are followed by thermal diffusing steps at high temperatures for forming the channel well region.

Since the impurity layer in a buried channel type transistor, which contains impurity ions of conductivity type opposite to that of the substrate, becomes deeper by the thermal diffusion steps, and the gate electric field becomes ineffective to the entire region of the channel. In order to suppress concomitant undue leakage, the threshold value has to be increased in order to decrease the above mentioned depth.

The threshold may reach 1.2 V or higher in such a case, which is larger than operation voltages for the practical products. This may thus result in a considerable difficulty. As long as utilizing previous process steps, therefore, all transistors have to be formed with those of the surface channel type to alleviate the above noted difficulty.

Also, in the above noted process steps, the introduction of P-type impurity ions into the P-type polysilicon gate electrode of the conventional P-channel type MOS transistor is required prior to thermal diffusion steps for forming the channel well region. (The conventional P-channel type MOS transistor is hereinafter referred to as PchMOS.)

However, when the thermal diffusion steps are carried out under previously known conditions of 1100° C. for 120 to 240 min, for example, boron ions previously contained in the polysilicon gate electrode diffuse out therefrom into the channel region through the underlying gate oxide layer, i.e., 'punch-through effect'.

Figure 13:
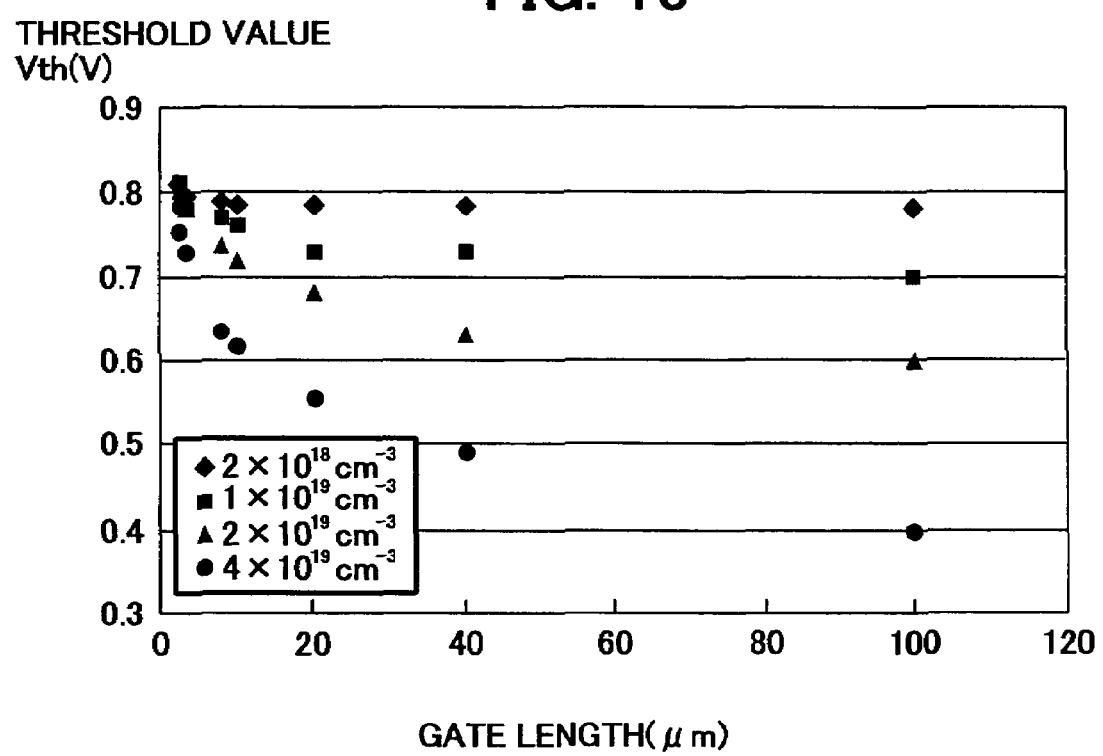
FIG. 13 (17) contains graphical plots illustrating the threshold voltage $V_{th}$ as a function of the gate length for various ion impurity concentrations.

This may also cause the difficulty, i.e., the decrease in the threshold voltage. As shown in FIG. 13, this effect is enhanced with the increase in the gate length and the concentration of boron ions in the gate electrode.

Furthermore, when threshold values are decreased in the PchMOS transistor and P-channel type LDMOS transistor provided with respective P-type polysilicon gates, a thin layer is formed in the surface area of the N-type substrate, having a reduced concentration of N-type impurities caused by the compensation with punched-through boron ions.

Since this may cause a leakage in die channel surface region with relative ease even in thus fabricated surface channel type transistors, there persists the difficulty in decreasing the threshold values in these P-channel type transistors.

Therefore, it has become requisite for the present inventors to find the optimum concentration of P-type impurities in P-type polysilicon gate electrodes in the PchMOS transistors, which will be described herein below.

In another aspect on the method for fabricating the semiconductor device disclosed herein, there provided are a PchMOS formed in the semiconductor substrate, provided with a P-type polysilicon gate electrode doped with P-type impurity ions formed contiguously above a gate oxide layer; and an LDMOS transistor provided with a channel well region formed, by thermal diffusion steps, contiguously under a gate electrode having a partial overlap with the gate electrode.

In addition, the P-type polysilicon gate electrode is made of polysilicon layer having a thickness of at least 500 nm and a concentration of the P-type impurity ions ranging from $2.0 \times 10^{18}$ to $1.0 \times 10^{19}$ cm$^{-3}$, and thermal diffusion process steps following an ion implantation for forming the channel well region are carried out at a temperature ranging from 1050 to 1100° C. for a period of time ranging from 100 to 500 min.

By bringing the P-type impurity concentration of the P-type polysilicon gate electrode to be the above-mentioned range, and by carrying out the thermal diffusion steps also under the above mentioned conditions, it has been found the resultant impurity concentration following the process steps remains within the range, in which the decrease in PchMOS threshold values and the leakage in channel surface region can effectively be obviated, since it is assured by the above P-type impurity concentration that no effect on the substrate impurity concentration is caused even taking the punch-through effect into consideration. It may be added that boron ions are used as the P-type impurities.

In still another aspect, the method for fabricating the semiconductor device may preferably include a further step for forming the P-type polysilicon gate electrode by first forming a polysilicon layer without including impurity ions on the gate oxide, second forming a silicon oxide layer on the polysilicon layer to a thickness ranging from 25 to 50 nm, and subsequently doping P-type impurity ions by implanting through the silicon oxide layer such that an impurity concentration in the polysilicon layer reach the above noted concentration ranging from $2.0 \times 10^{18}$ to $1.0 \times 10^{19}$ $cm^{-3}$.

As a result, the punch-through by P-type ions through the gate oxide layer can be prevented during ion implantation for forming P-type polysilicon gate electrode, which is caused by channeling through grain boundaries, for example.

As the conventional MOS transistors described herein above in this disclosure, there may alternatively be used are those having either the LDD (double doped drain) structure or LOCOS structure including a thick oxide layer at the gate edge portion.

The bipolar semiconductor having the LDMOS structure disclosed herein will now be detailed.

The bipolar transistor includes at least a semiconductor substrate, a collector formed in the substrate, a gate dielectric layer formed on the substrate, a gate electrode formed further thereon, a base formed in the collector having a partial overlap with the gate electrode, an emitter formed in close proximity to one side of the gate electrode in the base, a high concentration ohmic diffusion layer for connecting the base, formed in the base spatially separated from the emitter, and a high concentration ohmic diffusion layer for connecting the collector, formed in the collector on the other side of the gate electrode.

In addition, a wiring in the transistor is formed for connecting either the gate electrode with the base to be equipotential one another, or the gate electrode with the emitter again to be equipotential one another.

In the bipolar transistor, since the high concentration ohmic diffusion layer for connecting the collector and the gate electrode are preferably formed spatially separated one another in the transistor, the gate modulation effect can be suppressed and threshold voltages are increased.

For forming the high concentration ohmic diffusion layer for connecting the collector and the gate electrode spatially separated one another, as mentioned above, a medium concentration collector is preferably formed in the collector in intermediate between the gate electrode and the high concentration ohmic diffusion layer for connecting collector, which is made of a diffusion layer of the first conductivity type having an impurity concentration larger than the collector, and smaller than the high concentration ohmic diffusion layer for connecting collector.

As a result, a collector resistance between the high concentration ohmic diffusion layer for connecting the collector and gate electrode can be reduced, and the current amplification factor can be increased in the high current range.

The bipolar transistors disclosed herein may suitably be incorporated into several circuits. For example, a power source unit may be provided being capable of outputting a constant voltage by performing comparison operations between an output voltage and a reference voltage, and feedback operations based on comparison results.

By incorporating preferably the bipolar transistor disclosed herein as the output driver for the power source unit, the area for output driver can be reduced yet maintaining high threshold voltages.

As another example, a charge pump type DC/DC converter may be provided for outputting a persistent current flow by charging and discharging a capacitor performed by repeated switching operations of a plurality of internal switches. By utilizing the bipolar transistor disclosed herein as at least one of its internal switches, the chip area required for resistors in practical products can be decreased yet maintaining high threshold voltages.

In the methods for fabricating a semiconductor device disclosed herein, the step of forming the medium concentration collector is preferably carried out immediately after the step of forming the base.

In addition, the medium concentration collector, made of a diffusion layer of the first conductivity type, is herein formed in the collector on the other side of the gate electrode from the base in the self-aligned manner with respect to the gate electrode by implanting impurity ions of the first conductivity type, and the high concentration ohmic diffusion layer for connecting the collector is formed, at the step of forming the high concentration ohmic diffusion layer for connecting the collector, spatially separated from the gate electrode in close proximity to the medium concentration collector.

The position of the medium concentration collector is therefore determined by the edge of the gate electrode. As a result, the dispersion in alignment of the distance between the medium concentration collector and the base during photolithographic process steps can be made small enough to be disregarded.

Having generally described the present disclosure, the following examples are provided further to illustrate preferred embodiments. This is intended to be illustrative but not to be limiting to the materials, devices or methods described herein.

In addition, the first half of the following section relates semiconductor devices incorporating LDMOS and MOS transistors, while the second half primarily relates bipolar transistors having LDMOS structure.

EXAMPLES

FIG. 1 is a diagrammatic cross-sectional view illustrating an NchLDMOS transistor according one embodiment disclosed herein.

Referring to FIG. 1, an N-type drain well region 21 is formed in a P-type substrate 1.

In the N-type drain well region 21, a P-type well region 23 is subsequently formed, a portion of which serves as a channel region. In addition, an N-type source 11s is formed in the P-type well region 23.

Also formed in the N-type well region 21 is a medium concentration N-type drain region 24, which is spatially separated from the P-type well region 23 having a concentration of N-type impurities such as, for example, phosphorous ions higher than that of the N-type well region 21.

Furthermore, an N-type drain 11d is formed in the medium concentration N-type drain region 24 having another concentration of N-type impurities such as, for example, phosphorous ions higher than that of the medium concentration N-type drain region 24.

An N-type gate electrode 11g, made of polysilicon, is formed with an underlying gate oxide layer 11ox interposed between the gate electrode 11g and the well region 21. This gate electrode 11g is disposed in intermediate between N-type source 11s and N-type drain 11d above N-type well region 21, overlying the spatial portion between the P-type well region 23 and the medium concentration N-type drain region 24, and spatially separated from the N-type drain 11d. The distance between the N-type gate electrode 11g and the N-type drain 11d is 1.5 μm, for example, and the thickness of the gate oxide 11ox is approximately 30 nm.

As a result, the surface of the P-type channel well region 23 under the N-type gate electrode 11g is operative as a channel region.

The N-type gate electrode 11g is doped by either implanting or thermally diffusing with N-type impurities such as, for example, phosphorus ions to a concentration typically of $1.0 \times 10^{21}$ cm$^{-3}$. The N-type source 11s, the P-type well region 23, and the medium concentration N-type drain region 24 are formed in the self-aligned manner with respect to the N-type gate electrode 11g.

Into the P-type channel well region 23, P-type impurities such as, for example, boron ions are implanted to a concentration of $6.0 \times 10^{16}$ cm$^{-3}$. Also, phosphorus ions are implanted as N-type impurities into the N-type drain well region 21 to have a concentration of $6.0 \times 10^{15}$ cm$^{-3}$ in the region between N-type drain 11d and P-type channel well region 23 (drain 21a). In the NchMOS 11, therefore, the drain 21a has an impurity concentration smaller than that of the channel region.

With the device structure disclosed herein above, the impurity concentration in drain surface region at the edge portion of the N-type drain region 24 (i.e., in the medium concentration N-type drain region 24) is retained in the same order as that in the device previously disclosed in Japanese Laid-Open Patent Application No. 10-335663, even after implanting into the medium concentration N-type drain region 24 with a dose ranging two or three times of the previous level. As a result, no reduction in the gate modulated withstand voltage is assured for the device with the present structure.

In addition, since the medium concentration N-type drain region 24 can be formed having a larger diffusion depth, the resistance can be considerably reduced in this region. Furthermore, since the N-type source 11s and the medium concentration N-type drain region 24 are formed in the self-aligned manner with respect to the N-type gate electrode 11g as indicated earlier, the stability of the device characteristics can be increased over the previous device of the application '663.

Figure 11:
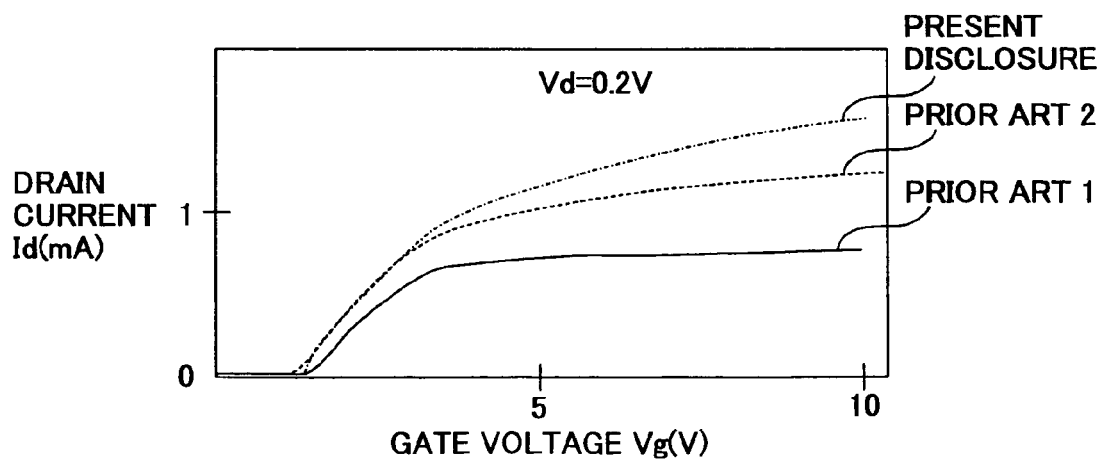
FIG. 11 contains characteristic curves for LDMOS transistors illustrating $I_d$–$V_g$ characteristics with the drain current $I_d$, vertically, versus the gate voltage $V_g$, horizontally.
Figure 12A:
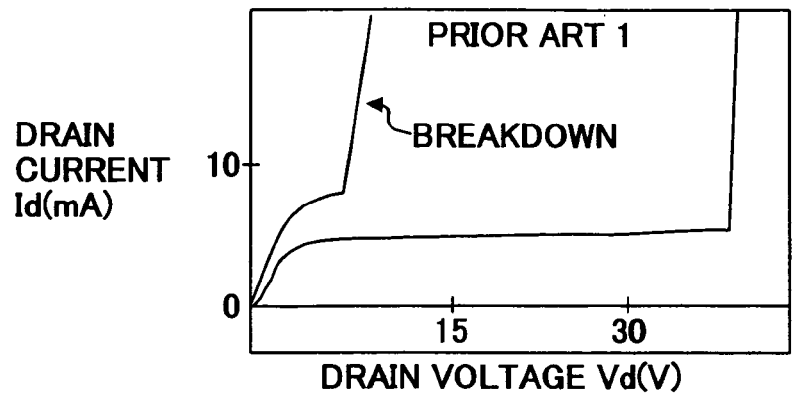
FIGS. 12A–12C contains characteristic curves for LDMOS transistors illustrating $I_d$–$V_d$ characteristics with the drain current $I_d$, vertically, versus the drain voltage $V_d$, horizontally.
Figure 12B:
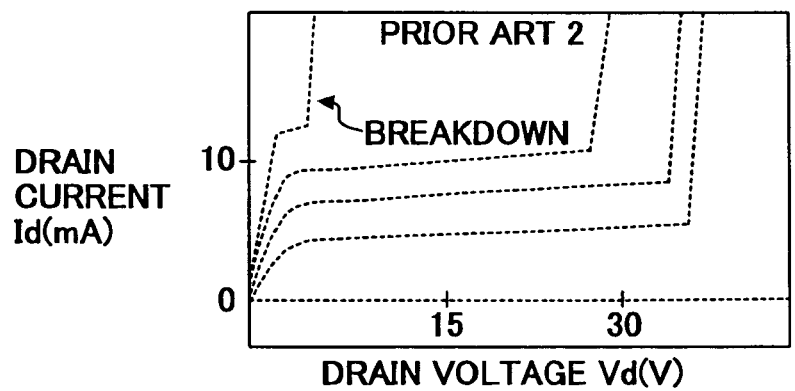
Figure 12C:
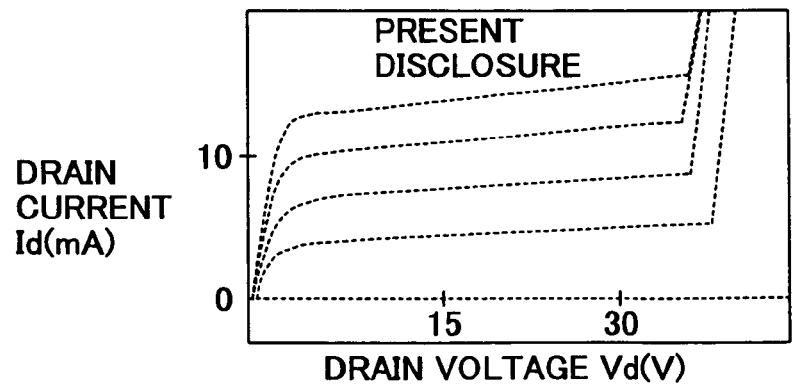

As a result, drain currents Id in relatively high range of gate voltage Vg can be larger than those obtained with the previous devices disclosed in the applications, '663 and '903, thereby leading to smaller on-resistance values with increased gate voltages, as evidenced by the results shown in FIG. 11. In addition, another improvement is achieved in thermal characteristics during parasitic bipolar operations, in which the drain withstand voltage (drain voltage Vd) of the order of 35 V is obtained even for drain current Id as much as 15 mA, as illustrated in FIG. 12C, thereby indicating an increase in the drain withstand voltage over previous devices.

In order to implement the formation of the N-type source 11s, the P-type well region 23, and the medium concentration N-type drain region 24 in the self-aligned manner with respect to the N-type gate electrode 11g, phosphorus and boron ions have to be introduced into the N-type gate electrode 11g during the process steps for forming the N-type source 11s, P-type well region 23, and medium concentration N-type drain region 24.

It is noted herein with respect to the impurity concentration that no appreciable effect on transistor characteristics is found such as, for example, threshold voltage, on resistance, and withstand voltage, since the phosphorus concentration for determining the polarity of the N-type gate electrode 11g is over ten times as large as that implanted into the N-type source 11s, the P-type well region 23, and the medium concentration N-type drain region 24.

Figure 2:
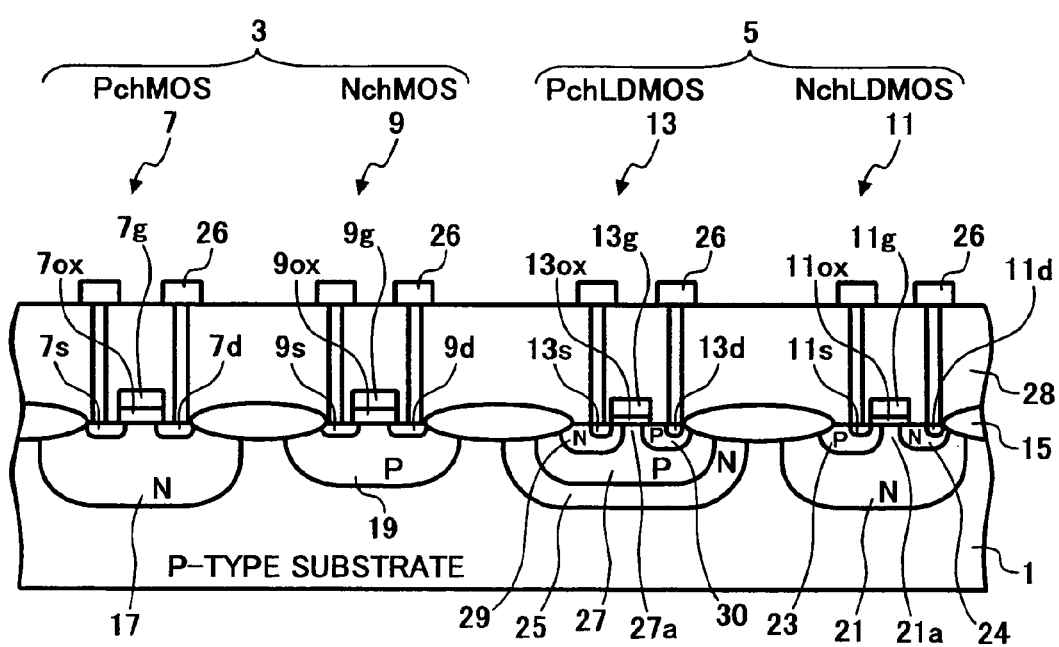
FIG. 2 is a cross-sectional view illustrating a semiconductor device according to another exemplary embodiment.

FIG. 2 is a diagrammatic cross-sectional view illustrating a semiconductor device according to another embodiment disclosed herein.

The structure includes a low voltage CMOS region consisting of a conventional N-channel MOS transistor (NchMOS) and a conventional P-channel MOS transistor (PchMOS), and a high voltage CMOS region consisting of a P-channel LDMOS transistor (PchLDMOS) and an N-channel LDMOS transistor (NchLDMOS), in which LDMOS transistors disclosed herein are utilized in the present structure.

Referring to FIG. 2, a low voltage CMOS region 3 and a high voltage CMOS region 5 are formed in a P-type semiconductor substrate (P-type substrate) 1 having a resistance of approximately 20 □cm. In the low voltage CMOS region 3, a PchMOS 7 and an NchMOS 9 are formed. The voltage applied to either PchMOS 7 or NchMOS 9 is approximately 5 V, for example.

In the high voltage CMOS region 5, the NchLDMOS 11 and the PchLDMOS 13 are formed. The voltage applied to either NchLDMOS 11 or PchLDMOS 13 is typically about 30 V. The transistors, PchMOS 7, NchMOS 9, NchLDMOS 11, and PchLDMOS 13, are electrically isolated from each other by a field oxide layer 15 which is formed on the P-type substrate 1 to a thickness of approximately 800 nm.

In the region for forming the PchMOS 7 of the low voltage CMOS 3, there formed in the P-type substrate 1 is an N-type well region 17, in which two P-type regions are formed spatially separated for a source 7s and a drain 7d, respectively.

In addition, a P-type gate electrode 7g made of polysilicon is formed, spatially disposed in intermediate between the N-type source and drain regions, 7s and 7d, above the N-type well region 17, and interposed by an underlying gate oxide layer 7ox between the gate electrode 7g and the well region 17. As a result, the surface of the N-type well region 17 under the P-type gate electrode 7g is operative as a channel region.

The thickness of gate oxide layer 7ox is typically of the order of 65 nm. The P-type gate electrode 7g is formed to have a concentration of P-type impurities such as, for example, boron ions ranging from $2.0 \times 10^{18}$ to $10 \times 10^{19}$ cm$^{-3}$, which is presently implanted with a dose of approximately $5.0 \times 10^{14}$ cm$^{-2}$. Both P-type source and drain regions, 7a and 7d, are formed in the self-aligned manner with respect to the P-type gate electrode 7g.

Into the N-type well region 17, N-type impurities such as, for example, phosphorus ions are implanted to a concentration of $1.0\times10^{16}$ cm$^{-3}$. Also, boron ions are implanted as P-type impurities into the P-type source 7a and drain 7d to a concentration of $5.0\times10^{19}$ cm$^{-3}$. In the PchMOS 7, therefore, the source and drain regions, 7a and 7d, have an impurity concentration higher than that of the channel region.

In the region of the NchMOS 9, there formed in the P-type substrate 1 is a P-type well region 19, in which two N-type regions are formed spatially separated for source 9a and drain 9d, respectively.

In addition, an N-type gate electrode 9g made of polysilicon is formed, spatially disposed intermediate the N-type source and drain regions 9a and 9d above the P-type well region 19, and interposed by an underlying gate oxide layer 9ox between the gate electrode 9g and the well region 19. As a result, the surface of the P-type well region 19 under the N-type gate electrode 9g is operative as a channel region. The thickness of gate oxide layer 9ox is typically of the order of 65 nm.

The N-type gate electrode 9g is doped by either implanting or thermally diffusing N-type impurities such as, for example, phosphorus ions to a concentration typically of $1.0\times10^{20}$ cm$^{-3}$. Both N-type source and drain regions, 9a and 9d, are formed in the self-aligned manner with respect to the N-type gate electrode 9g.

Into the P-type well region 19, P-type impurities such as, for example, boron ions are implanted to a concentration in the channel region of $1.0\times10^{16}$ cm$^{-3}$. Also, phosphorus ions are implanted as N-type impurities into the N-type source 9a and drain 9d to a concentration of $1.0\times10^{20}$ cm$^{-3}$. In the NchMOS 9, therefore, the N-type source and drain regions, 9a and 9d, have an impurity concentration higher than that of the channel region.

The high voltage CMOS region 5 is now detailed herein below, which consists of the regions for forming an NchLDMOS transistor 11 and a PchLDMOS transistor 13, as indicated earlier. In the NchLDMOS region, there formed is the NchLDMOS transistor 11. Since the NchLDMOS transistor 11 has a similar structure to that of FIG. 1, details thereof are herein abbreviated.

In the region for forming of the PchLDMOS transistor 13 of the high voltage CMOS, there formed in the P-type substrate 1 is an N-type isolation well region 25 for implementing the electrical isolation of the transistor region from the substrate 1.

In the N-type well region 25, a P-type drain well region 27 is subsequently formed. In the P-type drain well region 27, an N-type channel well region 29 is formed, a portion of which serves as a channel region. In addition, a P-type source 13s is formed in the N-type channel well region 29. Also formed in the P-type drain well region 27 is a medium concentration P-type drain region 30, which is spatially separated from the N-type channel well region 29 having a concentration of P-type impurities such as, for example, boron ions higher than that of the P-type drain well region 27.

Furthermore, another drain region 13d is formed in the medium concentration P-type drain region 30 having another concentration of P-type impurities such as, for example, boron ions higher than that of the medium concentration P-type drain region 30.

A P-type gate electrode 13g, made of polysilicon, is formed with an underlying gate oxide layer 13ox interposed between the gate electrode 13g and the well region 27. This gate electrode 13g is formed, spatially disposed in intermediate between P-type source 13s and P-type drain 13d above P-type well region 27, overlying the spatial portion between the N-type well region 29 and the medium concentration P-type drain region 30, and being separated from the P-type drain 13d.

The distance between the p type gate electrode 13g and the P-type drain 13d is 1.0 μm, for example, and the thickness of the gate oxide layer 13ox is approximately 30 nm. As a result, the surface of the N-type channel well region 29 under the P-type gate electrode 13g is operative as a channel region.

The P-type gate electrode 13g is doped to a concentration of P-type impurities such as, for example, boron ions ranging from $2.0\times10^{18}$ to $1.0\times10^{19}$ cm$^{-3}$, which is presently implanted with a dose of approximately $5.0\times10^{14}$ cm$^{-2}$. The P-type source 13s, the N-type channel well region 29, and the medium concentration P-type drain region 30 are formed in the self-aligned manner with respect to the P-type gate electrode 13g.

Into the N-type channel well region 29, N-type impurities such as, for example, phosphorus ions are implanted to a concentration of $5.0\times10^{16}$ cm$^{-3}$. Also, boron ions are implanted as P-type impurities into the P-type drain well region 30 to have a concentration of $1.0\times10^{16}$ cm$^{-3}$ in the region between P-type drain 13d and N-type channel well region 29 (drain 27a). In the PchLDMOS 13, therefore, the drain 27a has an impurity concentration smaller than that of the channel region.

Subsequently, a CVD interlayer 28 is grown by CVD (chemical vapor deposition) method over the entire area of the structure. □The next step in the present process is to make openings, using conventional masking and etching techniques, for forming the electrical contacts. Thereafter, a layer of aluminum 26 as a metal wiring is deposited and the desired metallization pattern is defined through conventional masking and metal etching techniques.

The metal wiring 26 is then electrically connected by way of the contact holes to the P-type sources 7s and 13s, N-type sources 9s and 11s, P-type drains 7d and 13d, and N-type drains 9d and 11d.

In the present device structure, the respective gate oxide layers, 7 × and 9ox, of PchMOS 7 and NchMOS 9, are formed to have a thickness of approximately 65 nm as indicated earlier, which is larger than the approximately 30 nm thickness of the gate oxide layers, 11ox and 19ox, of NchLDMOS 11 and PchLDMOS 13.

In addition, the N-type well region 17 of PchMOS 7, N-type drain well region 21 of NchLDMOS 11, and N-type well region 25 of PchLDMOS 13, are formed simultaneously. Furthermore, the P-type well region 19 of NchMOS 9 and P-type drain well region 27 of PchLDMOS 13 are formed simultaneously.

Since the gate oxide layers, 7 × and 9ox, are formed to have a thickness larger than that of the gate oxide layers, 11ox and 19ox, as indicated above, there can be suitably utilized two well regions, the one is the N-type well region 17 which is formed simultaneously with the N-type drain well region 21 and N-type well region 25, and the other is the P-type well region 19 which is formed simultaneously with the P-type drain well region 27.

In the NchLDMOS 11 and PchLDMOS 13, the medium concentration drain regions, 24 and 30, are formed, in the self-aligned manner, in close proximity with N-type gate electrode 11g and P-type gate electrode 13g, respectively. As a result, drain resistance values can be reduced considerably and the stability of the device characteristics is increased of the semiconductor device disclosed herein.

While the present semiconductor device has been described with reference to the PchMOS 7, NchMOS 9, NchLDMOS 11, and PchLDMOS 13, formed in the P-type substrate 1, the device structure is not limited to those described above, but applicable to any device incorporating the LDMOS transistors.

Referring now to FIGS. 3A through 3L, there is shown, in a series of cross-sectional views, a sequence of some process steps which may be utilized in fabricating the semiconductor device of FIG. 2.

(1) A layer of photoresist is disposed on a P-type substrate 1, the portions of which are removed through conventional masking and etching operations, whereby a resist pattern (not shown) is formed having the openings, which define the regions for forming a PchMOS 7 of low voltage CMOS 3, and an NchLDMOS 11 and a PchLDMOS 13 of high voltage CMOS region 5.

Figure 3A:
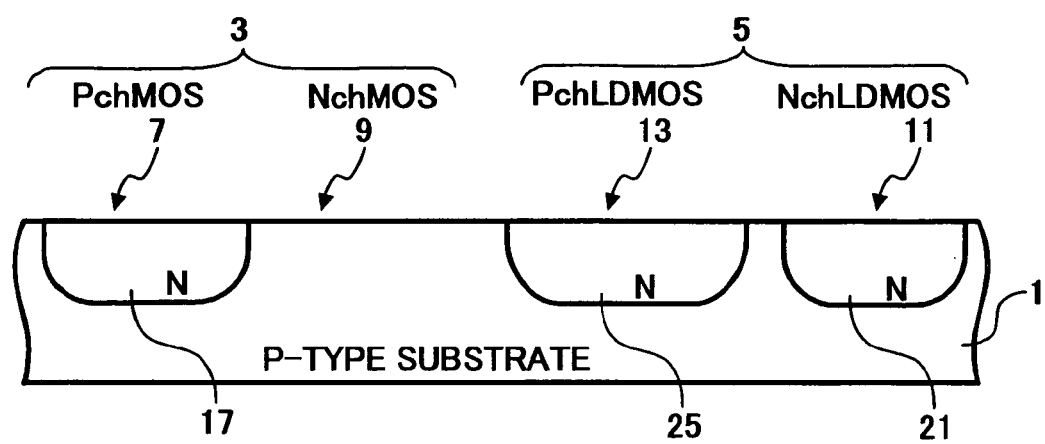
FIGS. 3A–3L are cross-sectional views of a semiconductor device of FIG. 2 during various stages in the fabrication process.

For forming the above-mentioned regions, phosphorus ions are implanted into the P-type substrate using the resist pattern as a mask under the conditions of an acceleration energy of 150 keV and a dose of approximately $4.0 \times 10^{12}$ cm$^{-2}$. After removing the resist pattern, the implanted phosphorus ions are subjected to thermal diffusion at 1180° C. for 24 hours□whereby an N-type well region 17, an N-type isolation well region 25 and an N-type drain well region 21 are formed simultaneously (FIG. 3A).

(2) Another layer of photoresist is disposed on the P-type substrate 1, the portions of which are removed through conventional masking and etching operations, whereby another resist pattern (not shown) is formed having the openings which are defined corresponding to the regions for forming an NchMOS 9, and a PchLDMOS 13 in the N-type isolation well region 25.

Figure 3B:
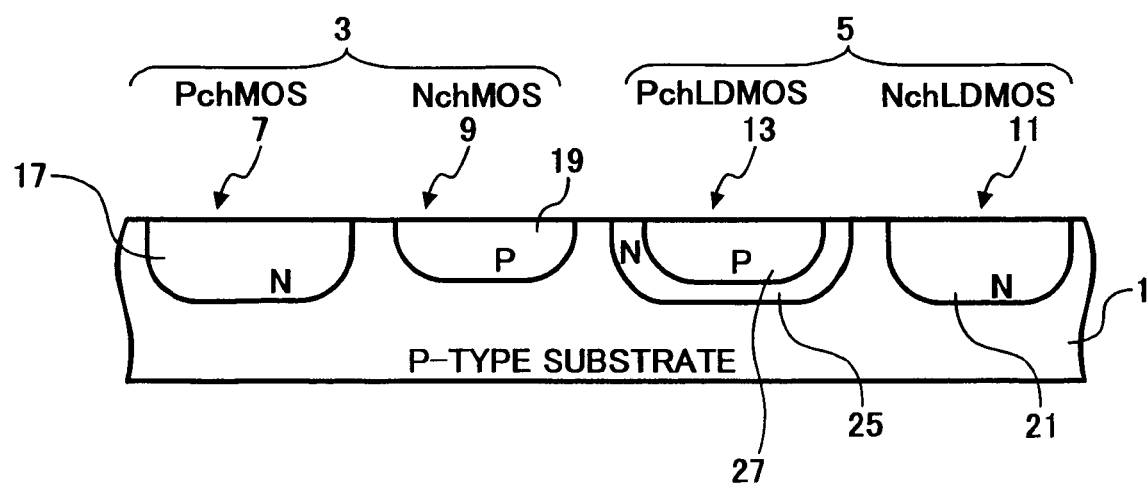

Thereafter, boron ions are implanted under the conditions of an acceleration energy of 50 keV and a dose of approximately $4.0 \times 10^{12}$ cm$^{-2}$. After removing the resist pattern, the implanted boron ions are subjected to thermal diffusion at 1150° C. for 8 hours whereby a P-type well region 19 in the region for NchMOS 9 and a P-type drain well region 27 in the N-type isolation well region 25 are formed simultaneously (FIG. 3B).

Figure 3C:
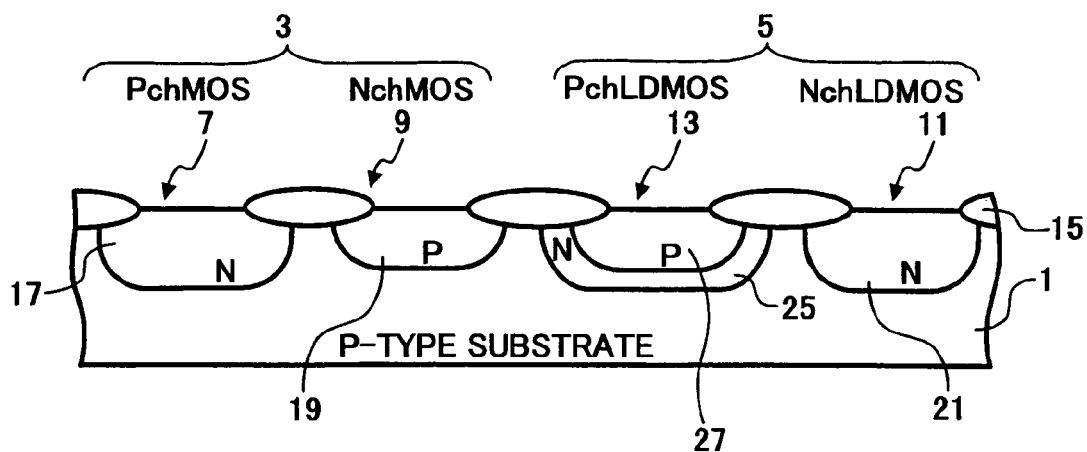

(3) A field oxide layer 15 is then formed by the LOCOS (local oxidation of silicon) method on the substrate 1 with a thickness of approximately 800 nm, to thereby implement the isolation of the regions for the MOS transistors, 7, 9, 11 and 13 (FIG. 3C). Impurity regions as channel stoppers may also be formed under respective oxide layer 15, when relevant.

(4) A plurality of pre-gate oxide layers 2 are each formed, having a thickness of 40 nm, on the top surface area of the N-type well region 17, P-type well region 19, N-type drain well region 21, and P-type drain well region 27.

Figure 3D:
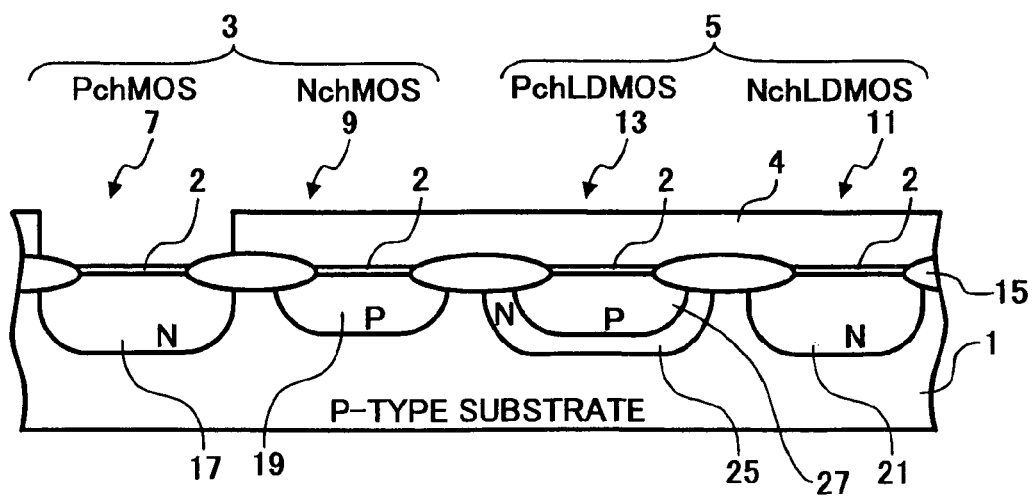

Thereafter, a resist pattern 4 is formed having an opening corresponding to the region for forming the PchMOS 7. Using the resist pattern 4 as a mask, an ion implantation for channel doping is carried out into the N-type well region 17 to control its threshold voltage (FIG. 3D).

Figure 3E:
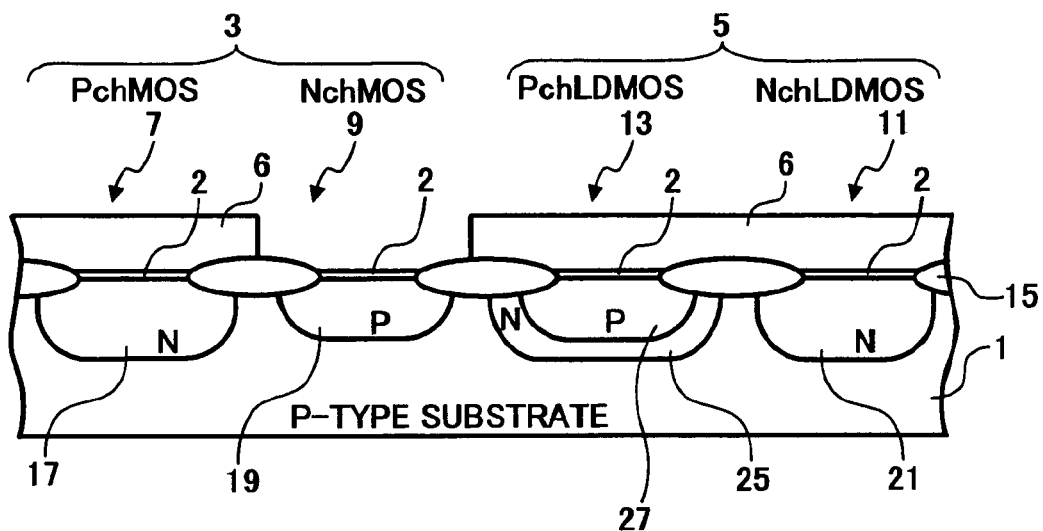

(5) After removing the resist pattern 4, another resist pattern 6 is formed having an opening corresponding to the region for forming the NchMOS 9. Using the resist pattern 6 as a mask, another ion implantation for channel doping is carried out into the P-type well region 19 to control threshold voltages (FIG. 3E).

Figure 3F:
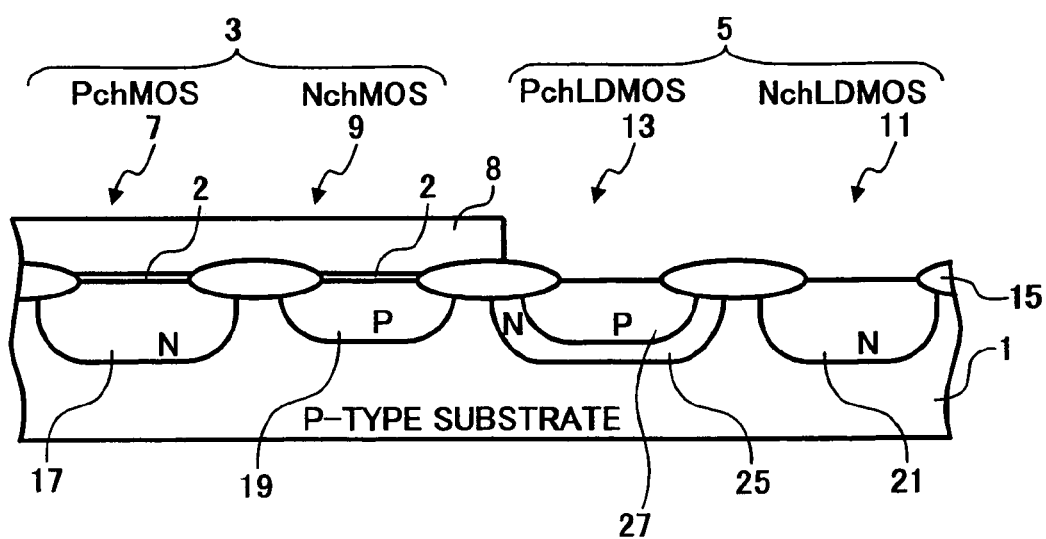

(6) Following the removal of the resist pattern 6, another resist pattern 8 is formed having an opening corresponding to the regions for forming the NchLDMOS 11 and PchLDMOS 13. Using the resist pattern 8 as a mask, the pre-gate oxide layers 2 are removed by etching with hydrofluoric acid solution from the surface regions of both N-type drain well region 21 and P-type drain well region 27 (FIG. 3F).

(7) Following the removal of the resist pattern 8, the structure is subjected to thermal oxidation to thereby form oxide layers, 11ox and 13ox, on the surface regions of N-type drain well 21 and P-type drain well region 27, respectively, to a thickness of approximately 30 nm.

Figure 3G:
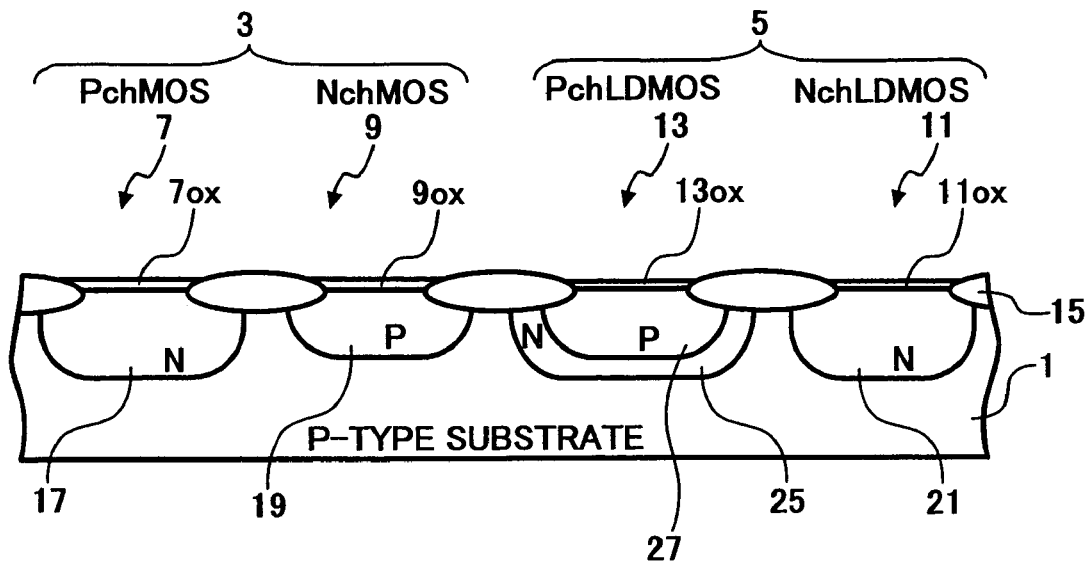

Pre-existed gate oxide layers on the surface regions of N-type well 17 and P-type well 19 are also oxidized during the oxidation step to a thickness of approximately 65 nm, whereby gate oxide layers, 7ox and 9ox, are formed (FIG. 3G).

Figure 3H:
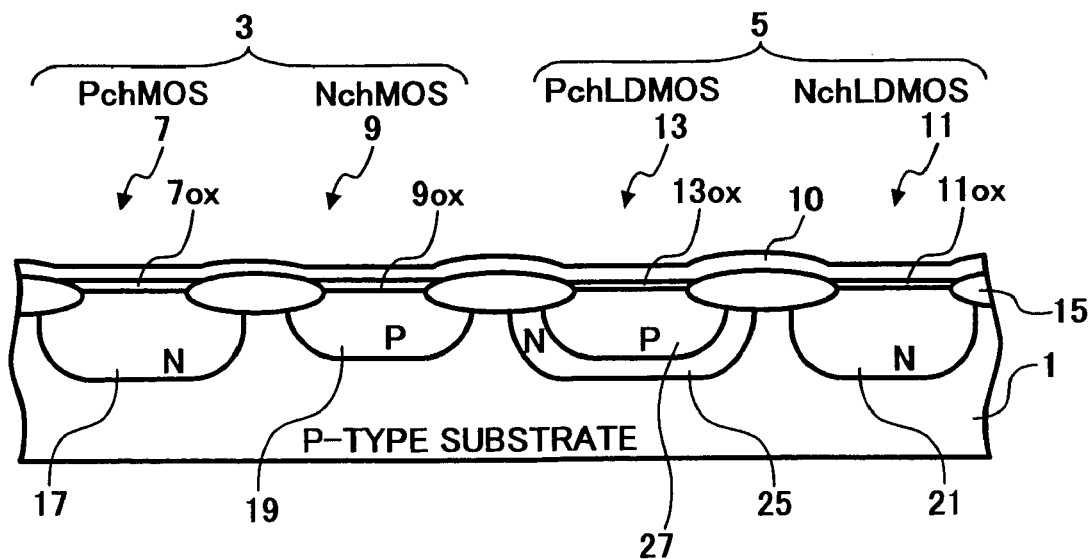

(8) A polysilicon layer 10 is grown to a thickness of 500 nm by CVD method over the entire area of the structure. The polysilicon layer 10 is then subjected to thermal oxidation, whereby the surface thereof is oxidized at 850° C. to form a silicon oxide layer (not shown) to a thickness of 25 nm (FIG. 3H).

Figure 3I:
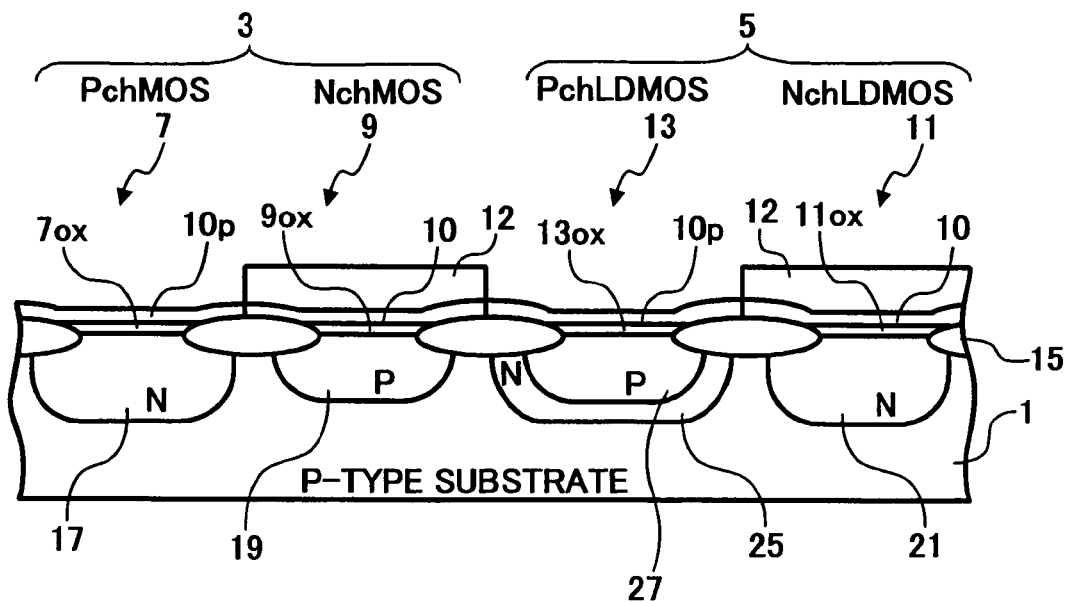

(9) Thereafter, a resist pattern 12 is formed on the polysilicon layer 10 having the openings which are defined corresponding to the regions for forming the PchMOS 7 and PchLDMOS 13. Using the resist pattern 12 as a mask, boron ions are implanted into the polysilicon layer 10 under the conditions of an acceleration energy of 20 keV and a dose ranging from $1 \times 10^{14}$ to $5 \times 10^{14}$ cm$^{-2}$, whereby a P-type polysilicon layer 10p is formed (FIG. 3I).

(10) After removing the resist pattern 12, a silicon oxide layer 14 is formed to a thickness of 200 nm over the entire area of the structure. Predetermined portions of the silicon oxide layer 14 are then removed, through etching and photolithography techniques, to form openings for the NchMOS 9 and NchLDMOS 11.

Figure 3J:
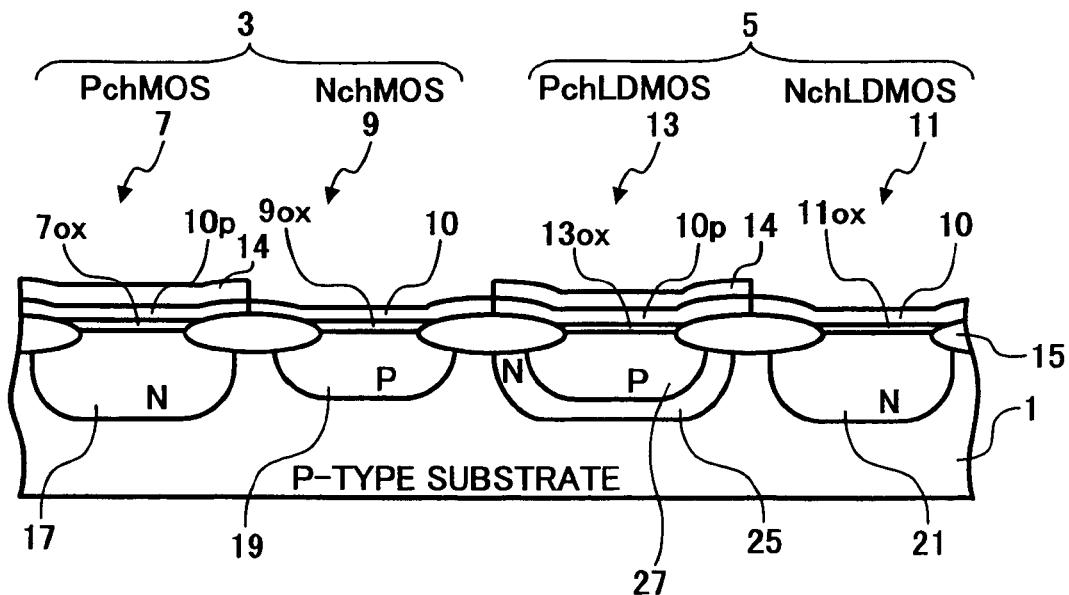

Thereafter, phosphorus is deposited over the thus formed structure and subjected to thermal treatment at 900° C. for approximately 30 min, whereby N-type polysilicon layers 10n is formed (FIG. 3J).

The N-type polysilicon layers 10n may alternatively be formed by ion implantation.

(11) After removing the silicon oxide layer 14, the polysilicon layers, 10n and 10p, are subjected to patterning steps to form simultaneously several gate electrodes such as a P-type gate electrode 7g for the PchMOS 7, which is formed of P-type polysilicon on the gate oxide layer 7ox; an N-type gate electrode 9g for the NchMOS 9, which is formed of N-type polysilicon on the gate oxide layer 9ox; an N-type gate electrode 11g for the NchLDMOS 11, which is formed of N-type polysilicon on the gate oxide layer 11ox; and a P-type gate electrode 13g for the PchLDMOS 13, which is formed of P-type polysilicon on the gate oxide layer 13x.

Thereafter, still another resist pattern (not shown) is formed having an opening for the region for forming the N-type channel well region 29 of the PchLDMOS 13 and P-type gate electrode 13g. Using both the resist pattern and the gate electrode 13g as a mask, phosphorus ions are implanted into the P-type drain well region 27 under the conditions of an acceleration energy of 100 keV and a dose of approximately $2.7 \times 10^{13}$ cm$^{-2}$, whereby an N-type channel well region 29 is formed in close proximity with the P-type gate electrode 13g.

Subsequently, another resist pattern (not shown) is formed having an opening for the region for forming the P-type channel well region 23 of the NchLDMOS 11 and P-type gate electrode 11g. Using both the resist pattern and the gate electrode 11g as a mask, boron ions are implanted into the N-type drain well region 21 under the conditions of an acceleration energy of 30 keV and a dose of approximately $3 \times 10^{13}$ cm$^{-2}$, whereby a P-type channel well region 23 is formed in close proximity with the N-type gate electrode 11g.

Thereafter, still another resist pattern (not shown) is formed having an opening for the region for forming a medium concentration P-type drain region 30 of the PchLDMOS 13 and P-type gate electrode 13g. Using the resist pattern and the gate electrode 13g as a mask, boron ions are implanted into the P-type drain well region 27 under the conditions of an acceleration energy of 30 keV and a dose of approximately $5.0 \times 10^{12}$ cm$^{-2}$, whereby the medium concentration P-type drain region 30 is formed in close proximity with the P-type gate electrode 13g.

Another resist pattern (not shown) is then formed having openings for a medium concentration N-type drain region 24 of NchMOS 11 and N-type gate electrode 11g. Using the resist pattern and the gate electrode 11g as a mask, phosphorus ions are implanted into the N-type drain well region 21 under the conditions of an acceleration energy of 100 keV and a dose of approximately $5.0 \times 10^{12}$ cm$^{-2}$, whereby the medium concentration N-type drain region 24 is formed in close proximity with the N-type gate electrode 11g.

Figure 3K:
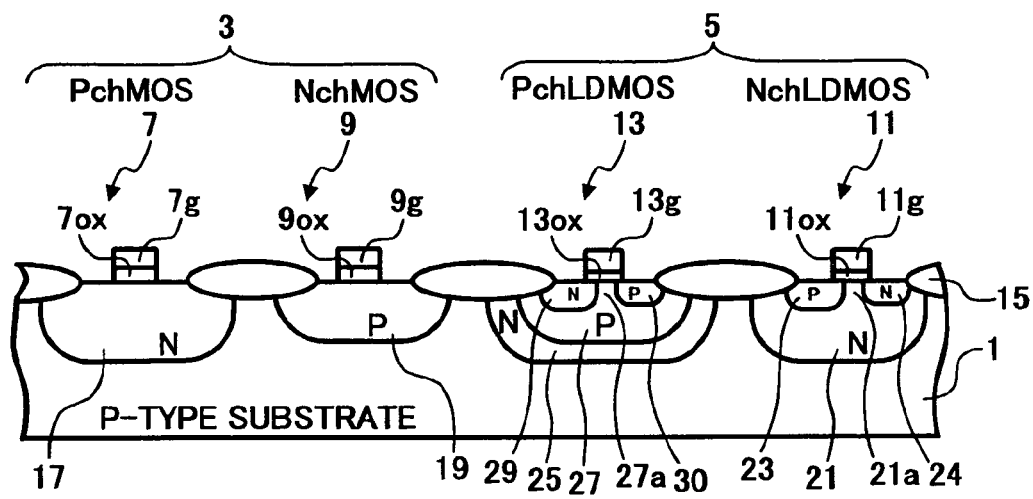

Thereafter, the thus formed structure is subjected to the steps of thermal diffusion at 1100° C. for 200 min, whereby the thermal diffusion of implanted ions is carried out in the regions of the P-type channel well region 23, medium concentration N-type drain region 24, N-type channel well region 29, and medium concentration P-type drain region 30 (FIG. 3K).

Subsequently, another resist pattern (not shown) is formed having openings for several regions such as an N-type well region 17 of the PchMOS 7, a region which situated on the N-type channel well region 29 in the PchLDMOS 13 and in close proximity with the p type gate electrode 13g, and the medium concentration P-type drain region 30.

During the formation of this resist pattern, in addition, the opening for the above mentioned region in close proximity with the p type gate electrode 13g is made having an overlap with the P-type drain region 30 with a 1.0 μm width from the gate electrode 13g.

Using the resist pattern as a mask, boron ions are implanted simultaneously into the N-type well region 17, N-type channel well region 29, and medium concentration P-type drain region 30, under the conditions of an acceleration energy of 30 keV and a dose of approximately $2.0 \times 10^{15}$ cm$^{-2}$.

After removing the resist pattern, another resist pattern (not shown) is formed having openings for several regions such as a P-type well region 19 of the NchMOS 9, a region which situated on the P-type channel well region 23 in the NchLDMOS 11 and in close proximity with the N-type gate electrode 11g, and the medium concentration N-type drain region 24.

During the formation of this resist pattern, in addition, the opening for the above mentioned region in close proximity with the N-type gate electrode 11g is formed having an overlap with the N-type drain region 24 with a 1.5 μm width from the gate electrode 11g, such that this distance can be achieved between the gate electrode 11g and N-type drain 11d.

Using the resist pattern as a mask, ions of either phosphorus or arsenic are implanted simultaneously into the P-type well region 19, P-type channel well region 23, and medium concentration N-type drain region 24, under the conditions of an acceleration energy of 50 keV and a dose of approximately $6.0 \times 10^{15}$ cm$^{-2}$.

After removing the resist pattern, the thus formed structure is subjected to the steps of thermal diffusion of implanted ions, whereby there formed are the P-type source 7s and drain 7d in N-type well region 17 of the PchMOS 7, and the N-type source 9s and drain 9d in P-type well region 19 of the NchMOS 9; the N-type source 11s in P-type channel well region 23, and the N-type drain 11d in medium concentration N-type drain region 24, of the NchLDMOS 11; and the P-type source 13s in N-type channel well region 29, and the P-type drain 13d in medium concentration P-type drain region 30, of the PchLDMOS 13.

Figure 3L:
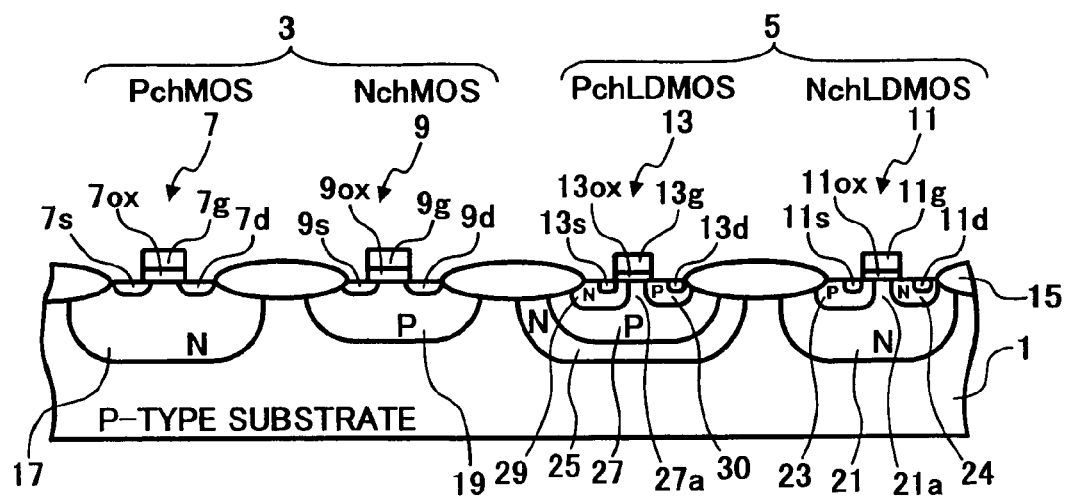

In order to reduce the electric field strength in the vicinity of the gates, the N-type drain 11d is formed with a distance of 1.5 μm from the gate electrode 11g in the NchLDMOS 11, as indicated earlier. Similarly, the P-type drain 13d is formed with a distance of 1.0 μm from the gate electrode 13g in the PchLDMOS 13 (FIG. 3L).

An interlayer CVD layer 28 is subsequently grown. The next step is to make contact holes in the interlayer CVD layer 28 for the regions of P-type sources 7s and 13s, N-type sources 9s and 11s, P-type drains 7d and 13d, and N-type drains 9d and 11d. Thereafter, metal wirings 26 are defined through the contact holes and on the interlayer CVD layer 28 (FIG. 2).

While the present semiconductor device has been described with reference to FIG. 2 with the low voltage CMOS region 3 and high voltage CMOS region 5, formed in the P-type substrate 1, these regions may alternatively be formed in a single P-type well region.

In addition, the structures and the methods disclosed herein above with reference to FIG. 1 with the P-type semiconductor substrate may also be applicable to low voltage and high voltage CMOS regions formed either in an N-type semiconductor substrate or in a single N-type well region.

Figure 4:
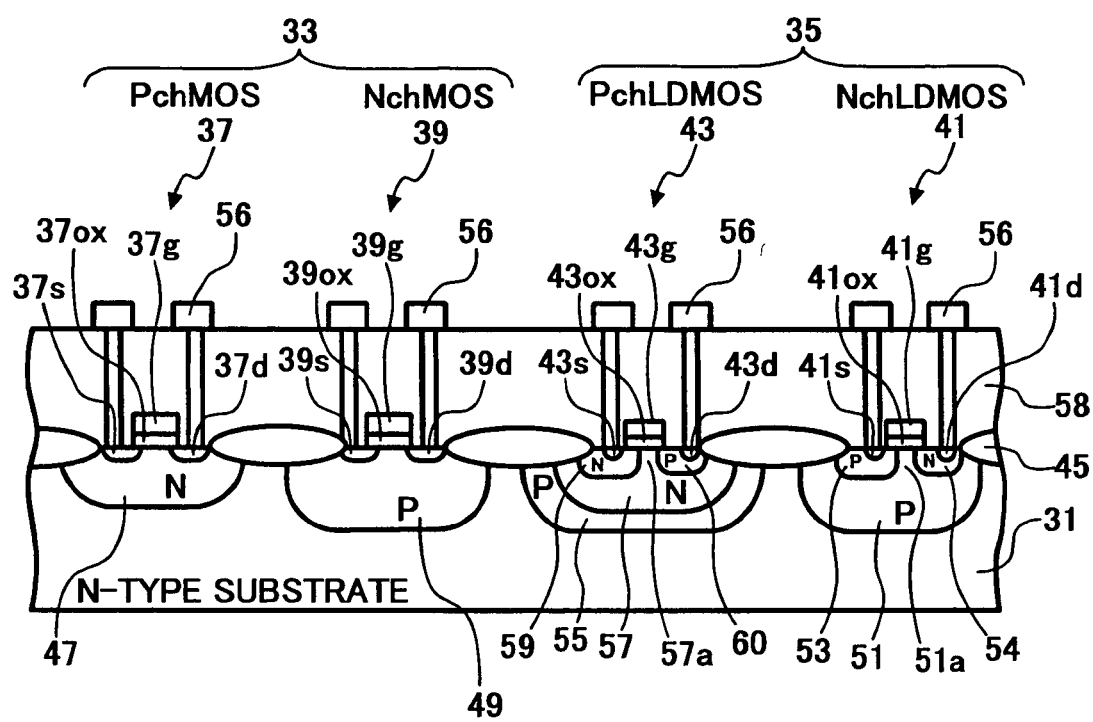
FIG. 4 is a cross-sectional view illustrating a semiconductor device according to still another exemplary embodiment.

FIG. 4 is a diagrammatic cross-sectional view illustrating a semiconductor device according to still another embodiment disclosed herein.

The structure includes a low voltage CMOS region consisting of a P-channel MOS transistor (PchMOS) and an N-channel MOS transistor (NchMOS), and a high voltage CMOS region consisting of a P-channel LDMOS transistor (PchLDMOS) and an N-channel LDMOS transistor (NchLDMOS), in which LDMOS transistors disclosed herein are utilized in the present structure.

Referring to FIG. 4, a low voltage CMOS region 33 and a high voltage CMOS region 35 are formed in an N-type semiconductor substrate (N-type substrate) 31 having a resistance of approximately 20 cm. In the low voltage CMOS region 33, a PchMOS 37 and an NchMOS 39 are formed. The voltage applied to either PchMOS 37 or NchMOS 39 is typically approximately 5 V, for example.

In the high voltage CMOS region 35, the PchLDMOS 41 and the NchLDMOS 43 are formed. The voltage applied to either PchLDMOS 41 or NchLDMOS 43 is typically about 30 V. The transistors, PchMOS 37, NchMOS 39, PchLDMOS 41 and NchLDMOS 43, are electrically isolated from each other by a field oxide layer 45 which is formed on the N-type substrate 31 to a thickness of approximately 800 nm.

In the region for forming the PchMOS 37 of the low voltage CMOS, there formed in the N-type substrate 31 is an N-type well region 47, in which two P-type regions are formed spatially separated for a source 37s and a drain 37d, respectively.

In addition, a P-type gate electrode 37g made of polysilicon is formed, spatially disposed in intermediate between the N-type source and drain regions, 37s and 37d, above the N-type well region 47, and interposed by an underlying gate oxide layer 37ox between the gate electrode 37g and the well region 47. As a result, the surface of the N-type well region 47 under the P-type gate electrode 37g is operative as a channel region.

The thickness of gate oxide layer 37ox is typically of the order of 65 nm. The P-type gate electrode 37g is formed to have a concentration of P-type impurities such as, for example, boron ions ranging from $2.0 \times 10^{18}$ to $1.0 \times 10^{19}$ cm$^{-3}$, which is presently implanted with a dose of approximately $5.0 \times 10^{14}$ cm$^{-2}$. Both P-type source and drain regions, 37s and 37d, are formed in the self-aligned manner with respect to the P-type gate electrode 37g.

Into the N-type well region 47, N-type impurities such as, for example, phosphorus ions are implanted to a concentration of $5.0 \times 10^{16}$ cm$^{-3}$. Also, boron ions are implanted as P-type impurities into the P-type source 37s and drain 37d to a concentration of $5.0 \times 10^{19}$ cm$^{-3}$. In the PchMOS 37, therefore, the source and drain regions, 37s and 37d, have an impurity concentration higher than that of the channel region.

In the region of the NchMOS 39, there formed in the P-type substrate 31 is a P-type well region 49, in which two N-type regions are formed spatially separated for source 39a and drain 39d, respectively.

In addition, an N-type gate electrode 39g made of polysilicon is formed, spatially disposed in intermediate between the N-type source and drain regions, 39s and 39d, above the P-type well region 49, and interposed by an underlying gate oxide layer 39ox between the gate electrode 39g and the well region 49. As a result, the surface of the P-type well region 49 under the N-type gate electrode 39g is operative as a channel region.

The thickness of gate oxide layer 39ox is typically of the order of 65 nm. The N-type gate electrode 39g is doped by either implanting or thermally diffusing N-type impurities such as, for example, phosphorus ions to a concentration typically of $1.0 \times 10^{20}$ cm$^{-3}$. Both N-type source and drain regions, 39s and 39d, are formed in the self-aligned manner with respect to the N-type gate electrode 39g.

Into the P-type well region 49, P-type impurities such as, for example, boron ions are implanted to a concentration in the channel region of $1.0 \times 10^{16}$ cm$^{-3}$. Also, phosphorus ions are implanted as N-type impurities into the N-type source 39s and drain 39d to a concentration of $5.0 \times 10^{19}$ cm$^{-3}$. In the NchMOS 39, therefore, the N-type source and drain regions, 39s and 39d, have an impurity concentration higher than that of the channel region.

In the region for forming the PchLDMOS 41 of the high voltage CMOS 35, a P-type drain well region 51 is formed in an N-type substrate 31. In the P-type drain well region 51, an N-type channel well region 53 is subsequently formed, a portion of which serves as a channel region. In addition, a P-type source 41s is formed in the N-type well region 53.

Also formed in the P-type well region 51 is a medium concentration P-type drain region 54, which is spatially separated from the N-type channel well region 53 having a concentration of P-type impurities such as, for example, boron ions higher than that of the P-type well region 51.

Furthermore, a P-type drain 41d is formed in the medium concentration P-type drain region 54 having another concentration of P-type impurities such as, for example, boron ions higher than that of the medium concentration P-type drain region 54.

A P-type gate electrode 41g made of polysilicon is formed with an underlying gate oxide layer 41ox interposed between the gate electrode 41g and the well region 51. This gate electrode 41g is formed, spatially disposed in intermediate between P-type source 41s and P-type drain 41d above P-type well region 51, overlying the spatial portion between the N-type channel well region 53 and the medium concentration P-type drain region 54, and being separated from the P-type drain 41d.

The distance between the P-type gate electrode 41g and the P-type drain 41d is 1.0 μm, for example, and the thickness of the gate oxide 41ox is approximately 30 nm. As a result, the surface of the N-type channel well region 53 under the P-type gate electrode 41g is operative as a channel region.

The P-type gate electrode 41g is implanted with P-type impurities such as, for example, boron ions to a concentration ranging from $2.0 \times 10^{18}$ to $1.0 \times 10^{19}$ cm$^{-3}$, which is presently implanted with a dose of approximately $5.0 \times 10^{14}$ cm$^{-2}$.

The P-type source 41s, N-type well region 53, and medium concentration P-type drain region 54 are formed in the self-aligned manner with respect to the P-type gate electrode 41g.

Into the N-type channel well region 53, N-type impurities such as, for example, phosphorus ions are implanted to a concentration of $5.0 \times 10^{16}$ cm$^{-3}$. Also, boron ions are implanted as P-type impurities into the P-type drain well region 51 to have a concentration of $1.0 \times 10^{16}$ cm$^{-3}$ in the region between P-type drain 41d and N-type channel well region 53 (drain 51a).

In the PchLDMOS 41, therefore, the drain 51a has an impurity concentration smaller than that of the channel region.

In the region for forming of the NchLDMOS 43, there formed in the N-type substrate 31 is a P-type isolation well region 55 for implementing the electrical isolation of the transistor region from the substrate 31.

In the P-type well region 55, an N-type drain well region 57 is subsequently formed. In the N-type drain well region 57, a P-type channel well region 59 is formed, a portion of which serves as a channel region. In addition, an N-type source 43s is formed in the P-type channel well region 59.

Also formed in the N-type drain well region 57 is a medium concentration N-type drain region 60, which is spatially separated from the P-type channel well region 59 having a concentration of N-type impurities such as, for example, phosphorus ions higher than that of the N-type drain well region 57.

Furthermore, an N-type drain 43d is formed in the medium concentration N-type drain region 60 having a concentration of N-type impurities such as, for example, phosphorus ions higher than that of the medium concentration N-type drain region 60.

An N-type gate electrode 43g, made of polysilicon, is formed with an underlying gate oxide layer 43ox interposed between the gate electrode 43g and the well region 57. This gate electrode 43g is formed, spatially disposed in intermediate between N-type source 43s and N-type drain 43d above N-type well region 57, overlying the spatial portion between the P-type well region 59 and the medium concentration N-type drain region 60, and being separated from the N-type drain 43d. The distance between the N-type gate electrode 43g and the N-type drain 43d is 1.5 μm, for example, and the thickness of the gate oxide layer 43ox is approximately 30 nm.

As a result, the surface of the P-type channel well region 59 under the N-type gate electrode 43g is operative as a channel region.

The N-type gate electrode 43g is doped by either implanting or solid phase diffusing the N-type impurities such as, for example, phosphorus ions to a concentration typically of $1.0\times10^{20}$ cm$^{-3}$. The N-type source 43s, the P-type channel well region 59, and the medium concentration N-type drain region 60 are formed in the self-aligned manner with respect to the N-type gate electrode 43g.

Into the P-type channel well region 59, P-type impurities such as, for example, boron ions are implanted to a concentration of $5.0\times10^{16}$ cm$^{-3}$. Also, phosphorus ions are implanted as N-type impurities into the N-type drain well region 60 to have a concentration of $1.0\times10^{16}$ cm$^{-3}$ in the region between N-type drain 43d and P-type channel well region 59 (drain 57a).

In the NchLDMOS 43, therefore, the drain 57a has an impurity concentration smaller than that of the channel region.

Subsequently, a CVD interlayer 58 is grown by CVD method over the entire area of the structure. The next step in the present process is to make openings, using conventional masking and etching techniques, for forming the electrical contacts. Thereafter, a layer of aluminum 56 as a metal wiring is deposited and the desired metallization pattern is defined through conventional masking and metal etching techniques.

The metal wiring 56 is then electrically connected by way of the contact holes to the P-type sources 37s and 41s, N-type sources 39s and 43s, P-type drains 37d and 41d, and N-type drains 39d and 43d.

In the present device structure, the gate oxide layers 37ox and 39ox, of PchMOS 37 and NchMOS 39, respectively, are formed to have a thickness of approximately 65 nm as indicated earlier, which is larger than the approximately 30 nm thickness of the gate oxide layers 41ox and 49ox, of PchLDMOS 41 and NchLDMOS 43.

In addition, the P-type well region 49 of PchMOS 39, P-type drain well region 51 of PchLDMOS 41, and P-type isolation well region 55 of NchLDMOS 43, are formed simultaneously. Furthermore, the P-type well region 47 of NchMOS 37, and N-type drain well region 57 of NchLDMOS 43 are formed simultaneously.

In the PchLDMOS 41 and NchLDMOS 43, the medium concentration drain regions, 54 and 60, are formed, in the self-aligned manner, in close proximity with P-type gate electrode 41g and N-type gate electrode 43g, respectively. As a result, drain resistance values can be reduced considerably and the stability of the device characteristics is increased of the semiconductor device disclosed herein.

In addition, since the and P-type source 41s and N-type source 43s are formed in the self-aligned manner with respect to the P-type gate electrode 41g and N-type gate electrode 43g, respectively, source resistance values can be reduced considerably and the stability of the device characteristics is increased for the present semiconductor device.

While the present semiconductor device has been described with reference to the PchMOS 37, NchMOS 39, PchLDMOS 41, and NchLDMOS 43, formed in the N-type substrate 31, the device structure is not limited to those described above, but also applicable to any device incorporating the LDMOS transistors.

The semiconductor device disclosed herein above in reference to FIG. 4 may be fabricated in a similar manner to the process steps of FIGS. 3A through 3L, with the exception that the conductivity type is reversed to respective portions of the semiconductor device.

Therefore, there is shown referring to FIGS. 5A through 5L in a series of cross-sectional views, a sequence of some process steps which may be utilized in fabricating the semiconductor device of FIG. 4.

(1) A layer of photoresist is disposed on an N-type substrate 31, the portions of which are removed through conventional masking and etching operations, whereby a resist pattern (not shown) is formed having the openings which define the regions for forming an NchMOS 39 of low voltage CMOS 33, and a PchLDMOS 41 and an NchLDMOS 43 of high voltage CMOS region 35.

Using the resist pattern as a mask, boron ions are implanted into the N-type substrate 31 for forming the above-mentioned regions, under the conditions of an acceleration energy of 50 keV and a dose of approximately $4.0\times10^{12}$ cm$^{-2}$.

Figure 5A:
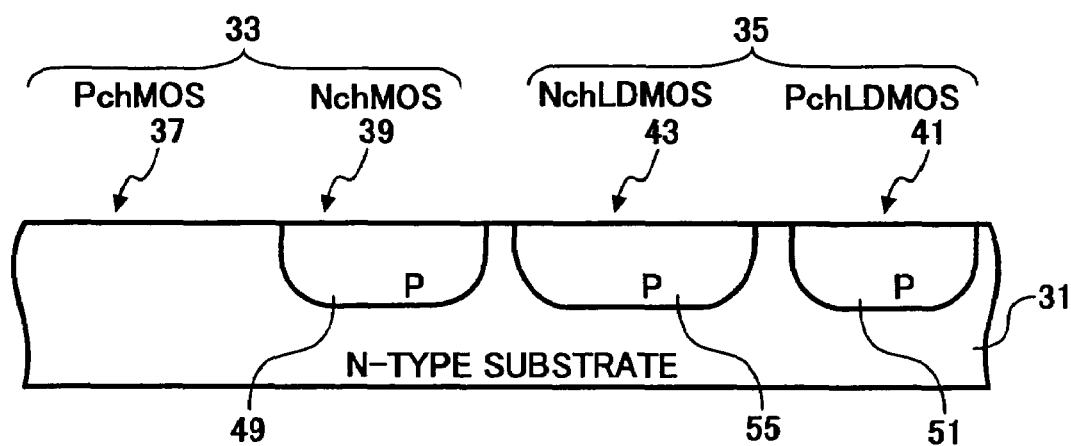
FIGS. 5A–5L are cross-sectional views of a semiconductor device of FIG. 4 during various stages in the fabrication process.

After removing the resist pattern, the implanted boron ions are subjected to thermal diffusion at 1180° C. for 24 hours☐whereby a P-type well regions 49 and 55, a P-type drain well region 51 are formed simultaneously (FIG. 5A).

(2) Another layer of photoresist is disposed on the N-type substrate 31, the portions of which are removed through conventional masking and etching operations, whereby another resist pattern (not shown) is formed having the openings which are defined corresponding to the regions for forming a PchMOS 37, and an NchLDMOS 43 in the P-type isolation well region 55.

Figure 5B:
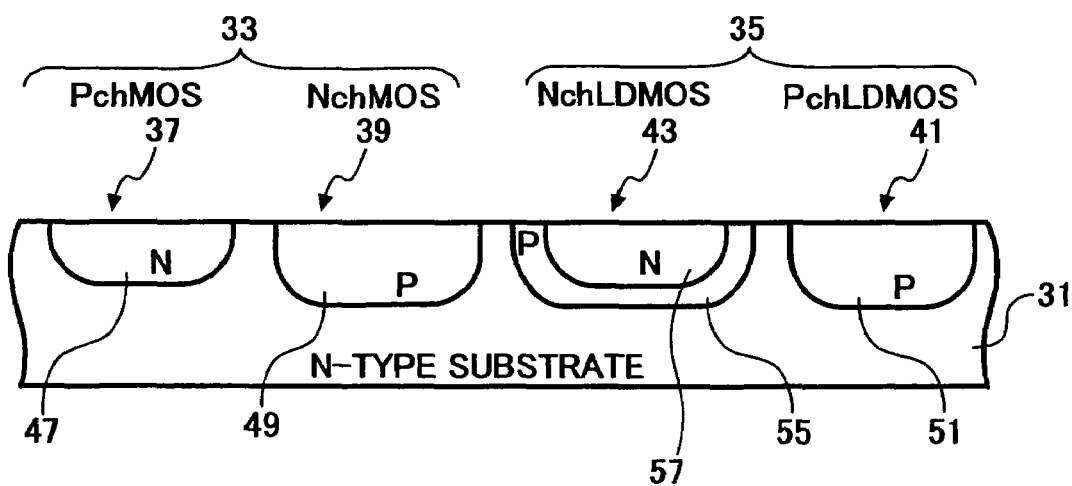

Thereafter, phosphorus ions are implanted under the conditions of an acceleration energy of 150 keV and a dose of approximately $4.0\times10^{12}$ cm$^{-2}$. After removing the resist pattern, the implanted phosphorus ions are subjected to thermal diffusion at 1150° C. for 8 hours☐whereby an N-type well region 47 in the region for PchMOS 37 and an N-type drain well region 57 in the P-type isolation well region 55 are formed simultaneously (FIG. 5B).

Figure 5C:
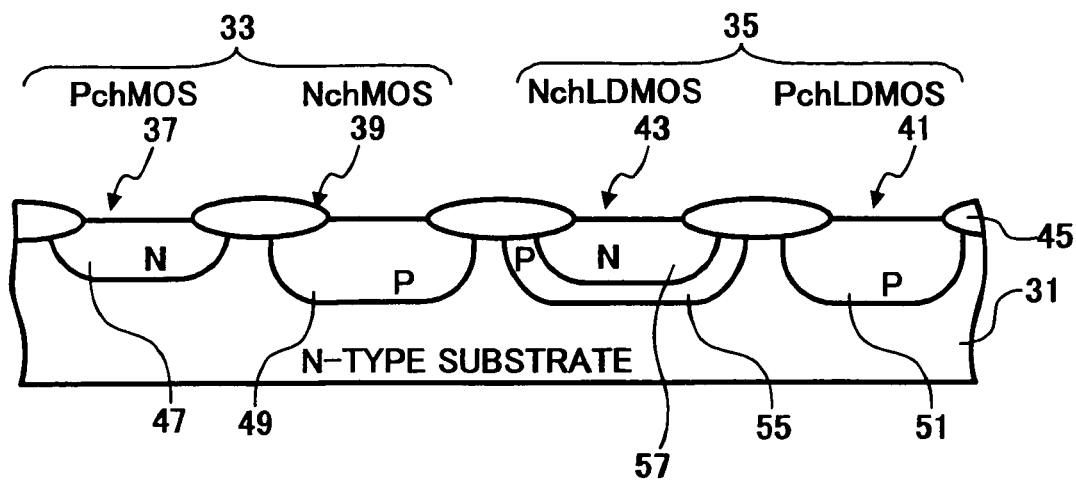

(3) A field oxide layer 45 is then formed by the LOCOS method on the substrate 31 to a thickness of approximately 800 nm, to thereby implement the isolation of the regions for the MOS transistors, 37, 39, 41 and 43 (FIG. 5C). Impurity regions as channel stoppers may also be formed under respective oxide layer 45, when relevant.

(4) A plurality of pre-gate oxide layers 32 are each formed, having a thickness of 40 nm, on the top surface area of the N-type well region 47, P-type well region 49, P-type drain well region 51, and N-type drain well region 57.

Figure 5D:
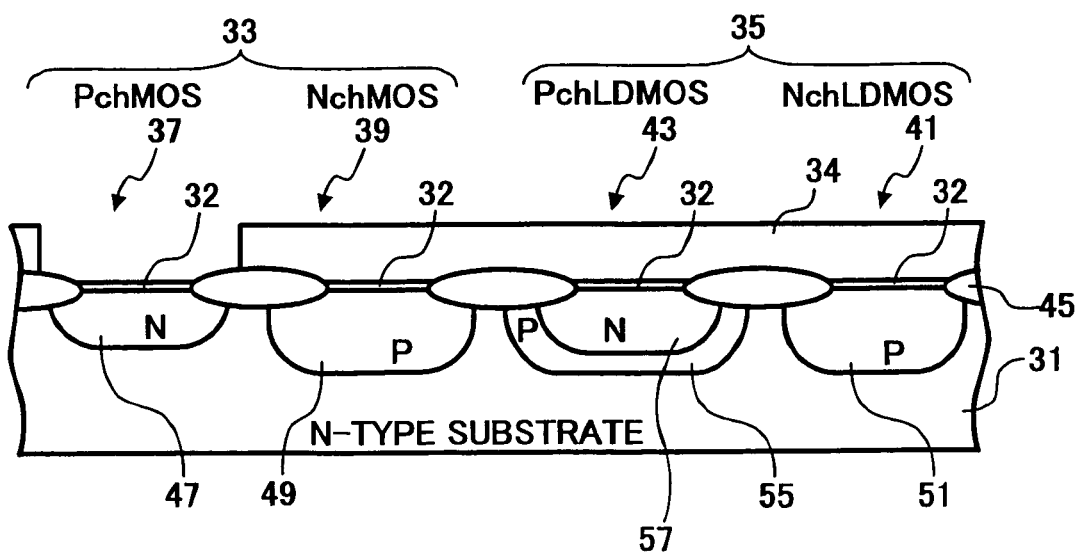

Thereafter, a resist pattern 34 is formed having an opening corresponding to the region for forming the PchMOS 37. Using the resist pattern 34 as a mask, an ion implantation for channel doping is carried out into the N-type well region 47 to control its threshold voltage (FIG. 5D).

Figure 5E:
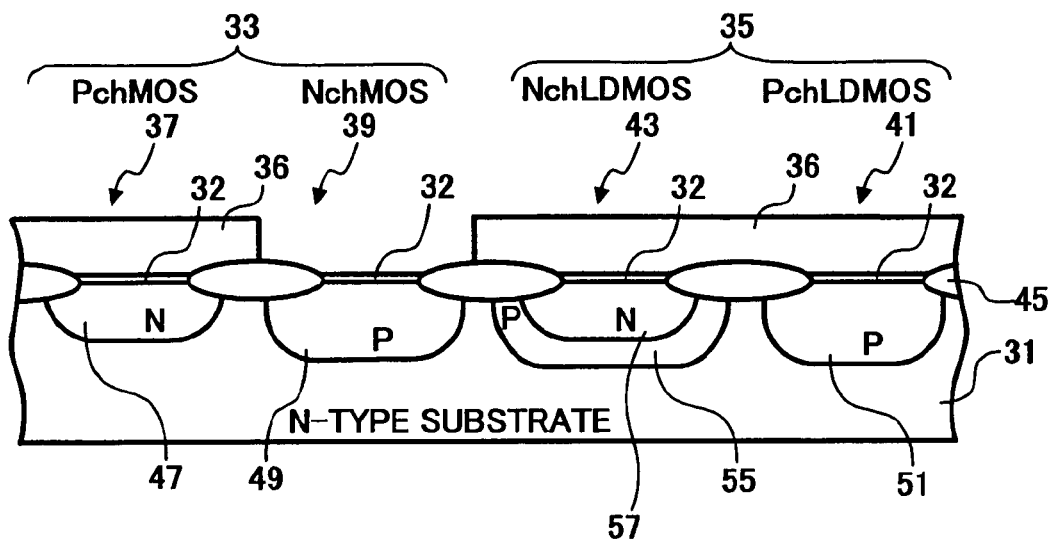

(5) After removing the resist pattern 34, another resist pattern 36 is formed having an opening corresponding to the region for forming the NchMOS 39. Using the resist pattern 6 as a mask, another ion implantation for channel doping is carried out into the P-type well region 49 to control threshold voltages (FIG. 5E).

Figure 5F:
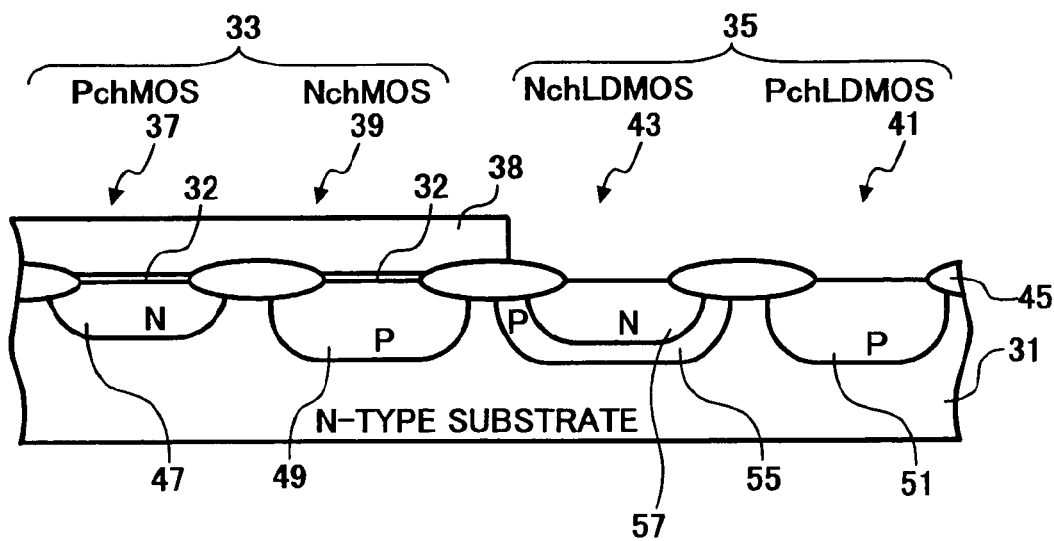

(6) Following the removal of the resist pattern 36, another resist pattern 38 is formed having an opening corresponding to the regions for forming the PchLDMOS 41 and NchLDMOS 43. Using the resist pattern 38 as a mask, the pre-gate oxide layers 32 are removed by etching with hydrofluoric acid solution from the surface regions of both P-type drain well region 51 and N-type drain well region 57 (FIG. 5F).

(7) Following the removal of the resist pattern 38, the structure is subjected to thermal oxidation to thereby form oxide layers, 41ox and 43ox, on the surface regions of P-type drain well 51 and N-type drain well region 57, respectively, to a thickness of approximately 30 nm.

Figure 5G:
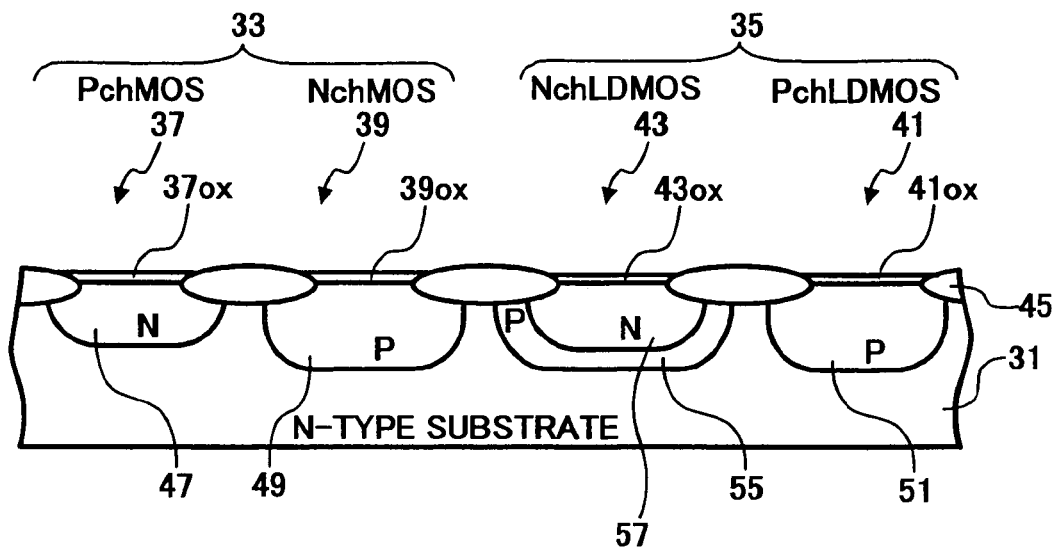

Pre-existed gate oxide layers on the surface regions of N-type well 47 and P-type well 49 are also oxidized during the oxidation step to a thickness of approximately 65 nm, whereby gate oxide layers, 37ox and 39ox, are formed (FIG. 5G).

Figure 5H:
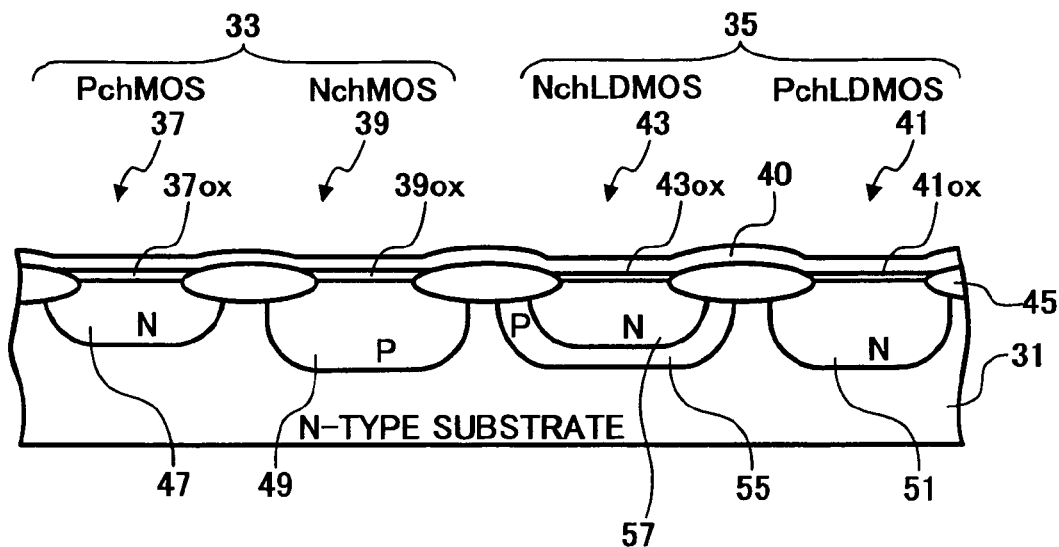

(8) A polysilicon layer 40 is grown to a thickness of 500 nm by CVD method over the entire area of the structure. The polysilicon layer 40 is then subjected to thermal oxidation, whereby the surface thereof is oxidized at 850° C. to form a silicon oxide layer (not shown) to a thickness of 25 nm (FIG. 5H).

Figure 5I:
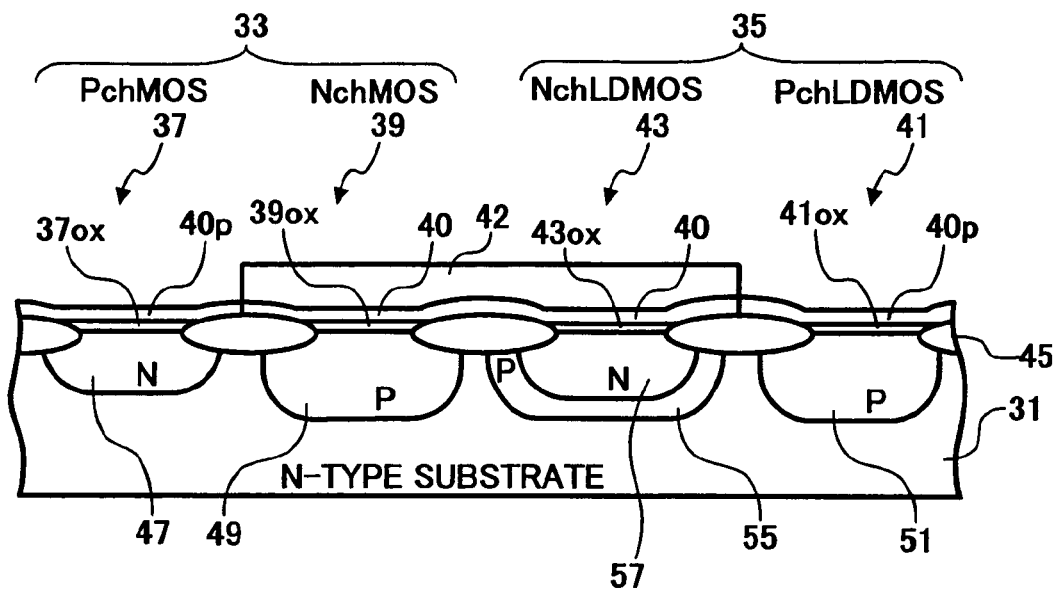

(9) Thereafter, a resist pattern 42 is formed on the polysilicon layer 40 having the openings which are defined corresponding to the regions for forming the PchMOS 37 and PchLDMOS 41. Using the resist pattern 42 as a mask, boron ions are implanted into the polysilicon layer 40 under the conditions of an acceleration energy of 20 keV and a dose ranging from $1\times10^{14}$ to $5\times10^{14}$ cm$^{-2}$, whereby a P-type polysilicon layer 40P is formed (FIG. 5I).

(10) After removing the resist pattern 42, a silicon oxide layer 44 is formed to a thickness of 200 nm over the entire area of the structure. Predetermined portions of the silicon oxide layer 44 are then removed, through etching and photolithography techniques, to form openings for the NchMOS 39 and NchLDMOS 43.

Figure 5J:
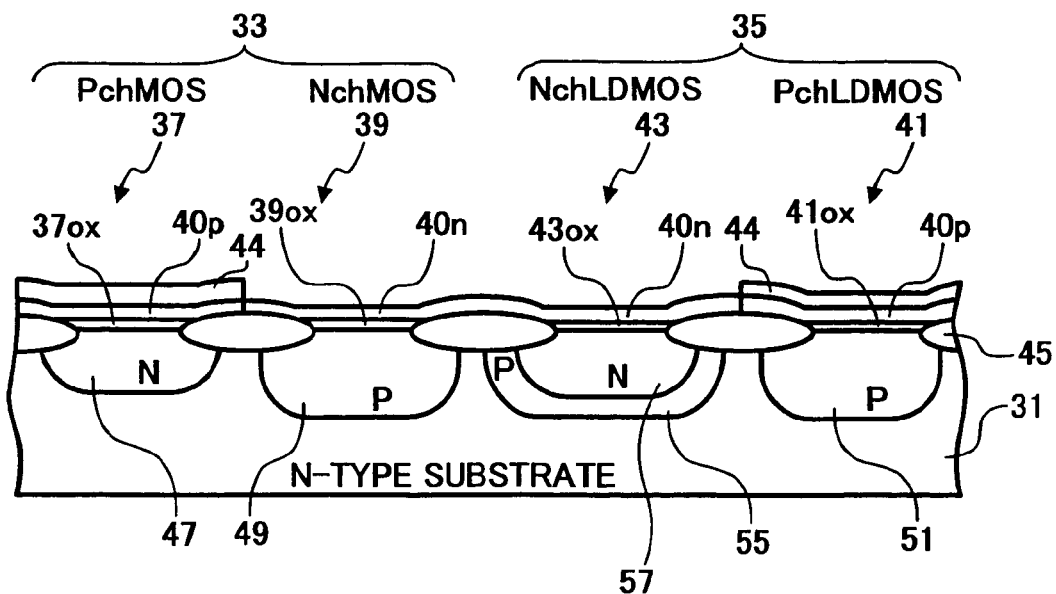

Thereafter, phosphorus is deposited over the thus formed structure and subjected to thermal treatment at 900° C. for approximately 30 min, whereby N-type polysilicon layers 40n is formed (FIG. 5J).

The N-type polysilicon layers 40n may alternatively be formed by ion implantation.

(11) After removing the silicon oxide layer 44, the polysilicon layers, 40n and 40p, are subjected to patterning steps to form simultaneously several gate electrodes such as a P-type gate electrode 37g for the PchMOS 37, which is formed of P-type polysilicon on the gate oxide layer 37ox; an N-type gate electrode 39g for the NchMOS 39, which is formed of N-type polysilicon on the gate oxide layer 39ox; a P-type gate electrode 41g for the PchLDMOS 41, which is formed of P-type polysilicon on the gate oxide layer 41ox; and an N-type gate electrode 43g for the NchLDMOS 43, which is formed of N-type polysilicon on the gate oxide layer 43x.

Thereafter, still another resist pattern (not shown) is formed having an opening for the region for forming the P-type channel well region 59 of the NchLDMOS 43 and N-type gate electrode 43g. Using the resist pattern and the gate electrode 43g as a mask, boron ions are implanted into the N-type drain well region 57 under the conditions of an acceleration energy of 30 keV and a dose of approximately $3.0\times10^{13}$ cm$^{-2}$, whereby an P-type channel well region 59 is formed in close proximity with the N-type gate electrode 43g.

Subsequently, another resist pattern (not shown) is formed having an opening for the region for forming the N-type channel well region 53 of the PchLDMOS 41 and P-type gate electrode 41g. Using the resist pattern and the gate electrode 41g as a mask, phosphorus ions are implanted into the P-type drain well region 51 under the conditions of an acceleration energy of 100 keV and a dose of approximately $2.7\times10^{13}$ cm$^{-2}$, whereby an N-type channel well region 53 is formed in close proximity with the P-type gate electrode 41g.

Thereafter, still another resist pattern (not shown) is formed having an opening for the region for forming a medium concentration N-type drain region 60 of the NchLDMOS 43 and N-type gate electrode 43g. Using the resist pattern and the gate electrode 43g as a mask, phosphorus ions are implanted into the N-type drain well region 57 under the conditions of an acceleration energy of 100 keV and a dose of approximately $5.0\times10^{12}$ cm$^{-2}$, whereby the medium concentration N-type drain region 60 is formed in close proximity with the N-type gate electrode 43g.

Another resist pattern (not shown) is then formed having openings for a medium concentration P-type drain region 54 of PchMOS 41 and P-type gate electrode 41g. Using the resist pattern and the gate electrode 41g as a mask, boron ions are implanted into the P-type drain well region 51 under the conditions of an acceleration energy of 30 keV and a dose of approximately $5.0\times10^{12}$ cm$^{-2}$, whereby the medium concentration P-type drain region 54 is formed in close proximity with the P-type gate electrode 41g.

Figure 5K:
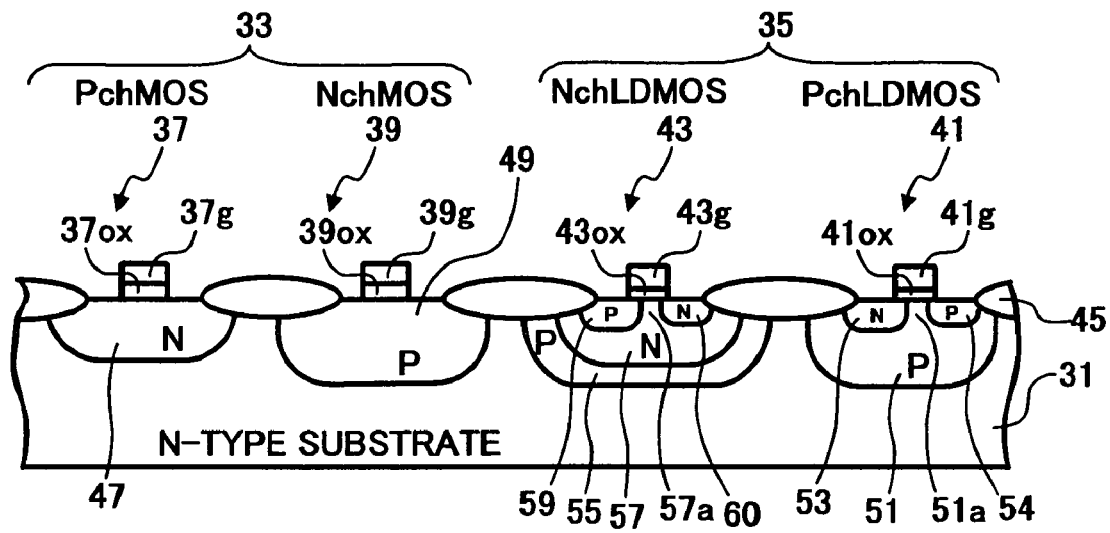

Subsequently, the thus formed structure is subjected to the steps of thermal diffusion at 1100° C. for 200 min, whereby the thermal diffusion of implanted ions is carried out in the regions of the N-type channel well region 53, medium concentration P-type drain region 54, P-type channel well region 59, and medium concentration N-type drain region 60 (FIG. 5K).

(12) Thereafter, another resist pattern (not shown) is formed having openings for several regions such as the P-type well region 49 of the NchMOS 39, a region which situated on the P-type channel well region 59 in the NchLDMOS 43 and in close proximity with the N-type gate electrode 43g, and the medium concentration N-type drain region 60.

During the formation of this resist pattern, in addition, the opening for the above mentioned region in close proximity with the N-type gate electrode 43g is formed having an overlap with the N-type drain region 60 with a 1.5 µm width from the gate electrode 43g.

Using the resist pattern as a mask, either phosphorus or arsenic ions are implanted simultaneously into the P-type well region 49, P-type channel well region 59, and medium concentration N-type drain region 60, under the conditions of an acceleration energy of 50 keV and a dose of approximately $6.0\times10^{15}$ cm$^{-2}$.

After removing the resist pattern, another resist pattern (not shown) is formed having openings for several regions such as the N-type well region 47 of the PchMOS 37, a region which situated on the N-type channel well region 53 in the PchLDMOS 41 and in close proximity with the P-type gate electrode 41g, and the medium concentration P-type drain region 54.

During the formation of this resist pattern, in addition, the opening for the above mentioned region in close proximity with the P-type gate electrode 41g is formed having an overlap with the P-type drain region 54 with a 1.0 µm width from the gate electrode 41g, such that this distance can be achieved between the gate electrode 41g and P-type drain 41d.

Using the resist pattern as a mask, boron ions are implanted simultaneously into the P-type well region 49, N-type channel well region 53, and medium concentration P-type drain region 54, under the conditions of an acceleration energy of 30 keV and a dose of approximately $2.0\times10^{15}$ cm$^{-2}$.

After removing the resist pattern, the thus formed structure is subjected to the steps of thermal diffusion of implanted ions, whereby there formed are the N-type source 37s and drain 37d in N-type well region 47 of the PchMOS 37, and the N-type source 39s and drain 39d in P-type well region 49 of the NchMOS 39; the P-type source 41s in N-type channel well region 53, and the P-type drain 41d in medium concentration P-type drain region 54, of the PchLDMOS 41; and the N-type source 43s in P-type channel well region 59, and the N-type drain 43d in medium concentration N-type drain region 60, of the NchLDMOS 43.

Figure 5L:
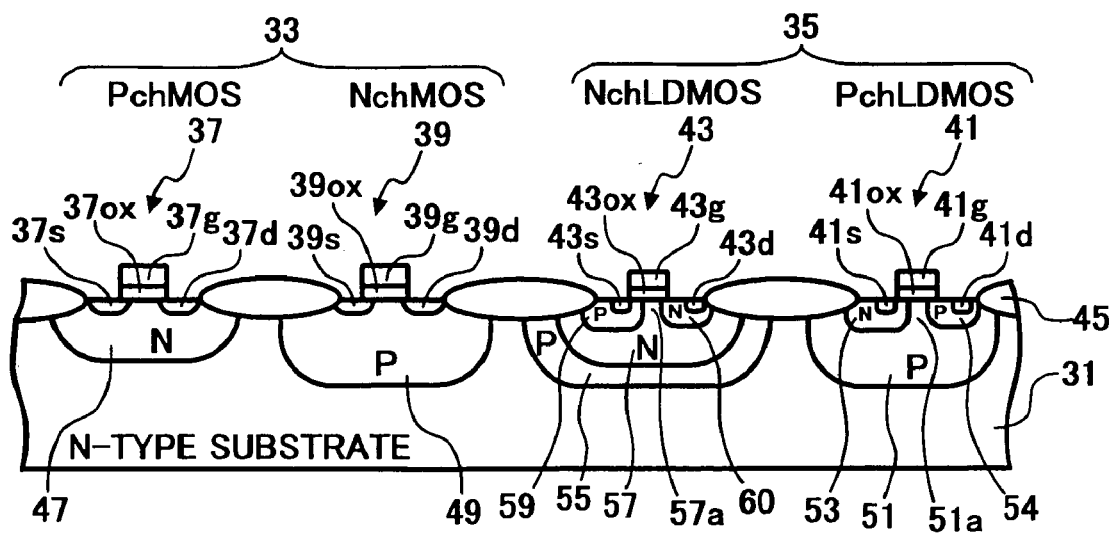

In order to reduce the electric field strength in the vicinity of the gates, the P-type drain 41d is formed with a distance of 1.0 μm from the P-type gate electrode 41g in the PchLDMOS 41, as indicated earlier. Similarly, the N-type drain 43d is formed with a distance of 1.5 μm from the gate electrode 43g in the NchLDMOS 43 (FIG. 5L).

An interlayer CVD layer 58 is subsequently grown. The next step is to make contact holes in the interlayer CVD layer 58 for the regions of P-type sources 37s and 41s, N-type sources 39s and 43s, P-type drains 37d and 41d, and N-type drains 39d and 43d. Thereafter, metal wirings 56 are defined through the contact holes and on the interlayer CVD layer 58 (FIG. 4).

While the present semiconductor device has been described with reference to FIG. 4 with the low voltage CMOS region 33 and high voltage CMOS region 55, formed in the P-type substrate 31, these regions may be formed alternatively in a single P-type well region.

The semiconductor devices disclosed herein may suitably be incorporated into several circuits such as, for example, a voltage stabilizer and a DC/DC converter, which will be detailed herein below.

Figure 6:
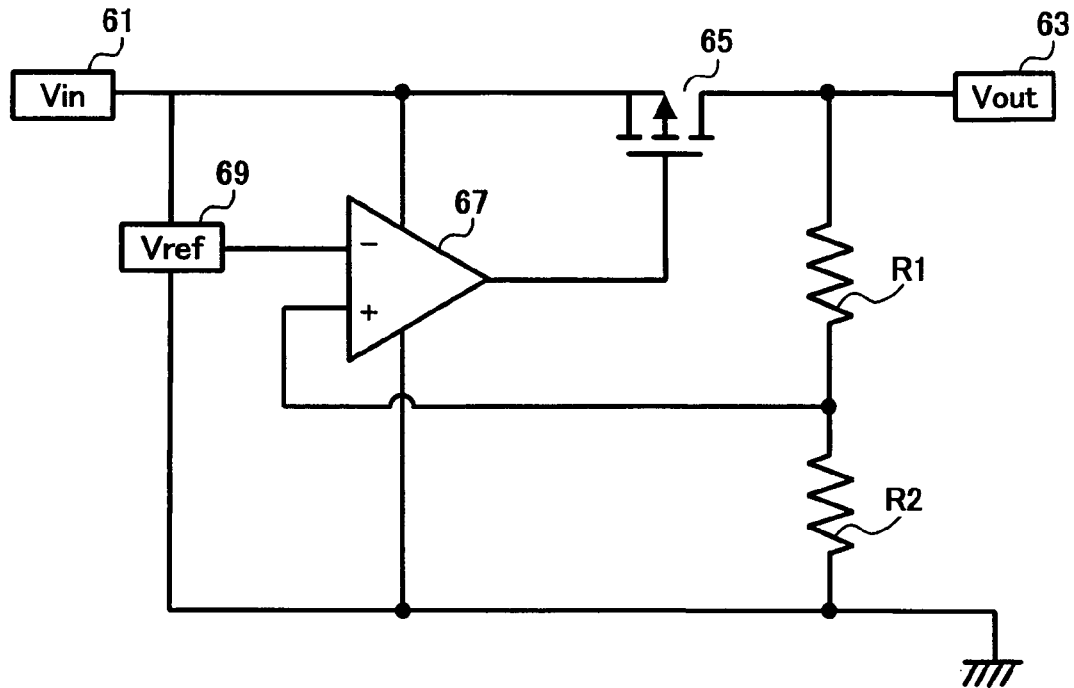
FIG. 6 is an electrical schematic diagram illustrating a voltage stabilizer incorporating an LDMOS transistor according to one exemplary embodiment.

FIG. 6 is an electrical schematic diagram illustrating a voltage stabilizer incorporating the LDMOS transistor disclosed herein.

Referring to FIG. 6, the voltage stabilizer includes at least a PchLDMOS 65 as an output transistor, provided between an input terminal V in 61 to be connected to a power source, and an output terminal V out 63 to be connected to a load.

A differential amplifier circuit 67 is additionally included. The output terminal of the differential amplifier circuit 67 is connected to a gate electrode of the PchLDMOS 65, while the inverting input terminal thereof is connected to a voltage reference circuit V ref 69.

Therefore, to the inverting input terminal of the differential amplifier circuit 67, a reference voltage is input from the voltage reference circuit V ref 69, and the voltage, which is output from the PchLDMOS 65 and then divided by dividing resistors R 1 and R 2, is input to the non-inverting input terminal.

The source power for the differential amplifier circuit 67 and voltage reference circuit V ref 69 is supplied from the input terminal V in 61. The differential amplifier circuit 67, voltage reference circuit V ref 69 and dividing resistor R 2 are grounded. There used as the PchLDMOS 65 in the present embodiment is the LDMOS disclosed herein. The withstand voltage of the gate oxide layer included in the PchLDMOS 65 is typically 30 V.

When an input voltage from the terminal 61 is decreased in the present circuit, the resultant voltage is output in proportion with the division by the divider. In such a case, a constant voltage output is obtained by changing the on resistance of the PchLDMOS 65 depending on the current supplied to the external load.

This can be achieved by comparing the reference voltage from the voltage reference circuit V ref with a feedback voltage from the dividing resistors, R 1 and R 2, by means of the differential amplifier circuit 67.

Figure 7:
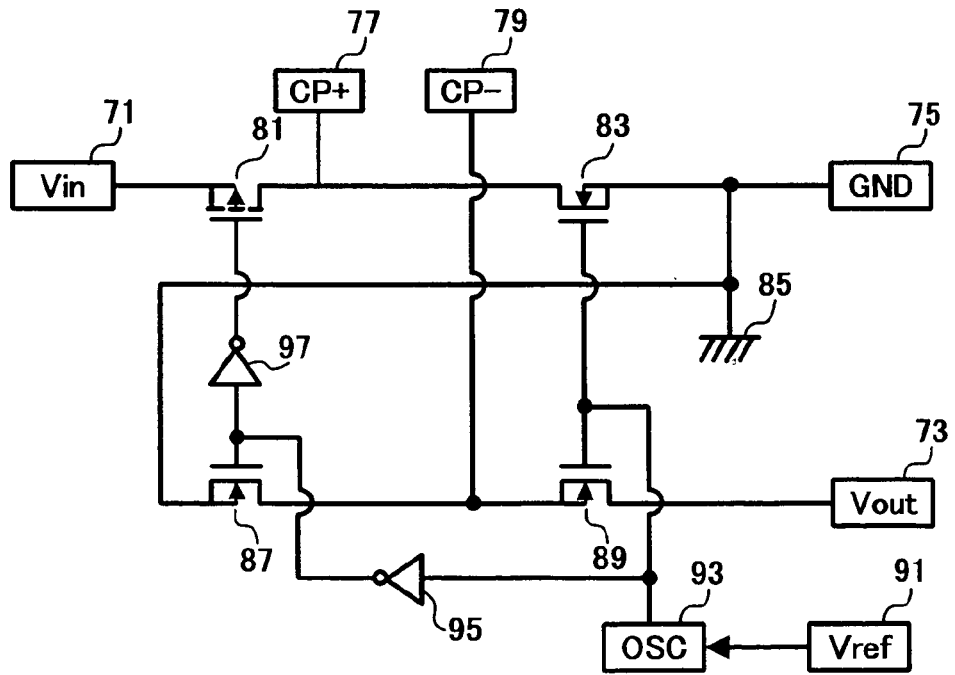
FIG. 7 is an electrical schematic diagram illustrating an inverting type charge pump DC/DC converter incorporating LDMOS transistors according to another exemplary embodiment.
Figure 8A:
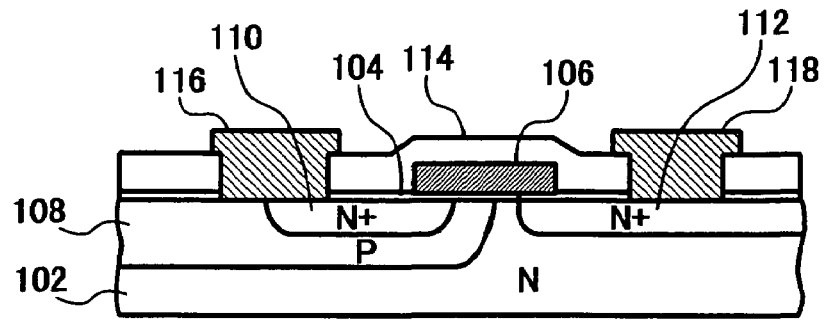
FIGS. 8A–8C are cross-sectional views illustrating conventional LDMOS transistors.
Figure 8B:
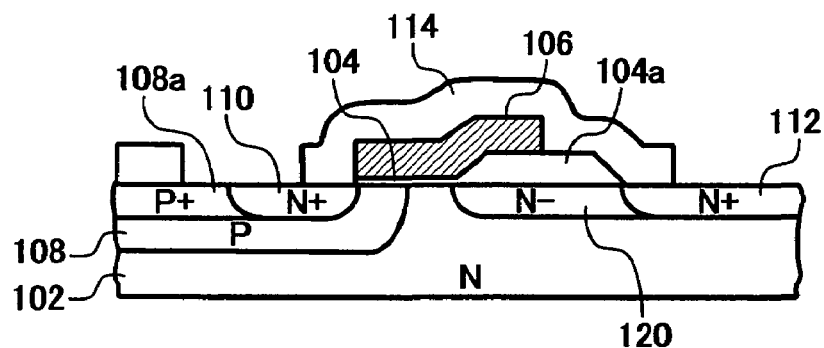
Figure 8C:
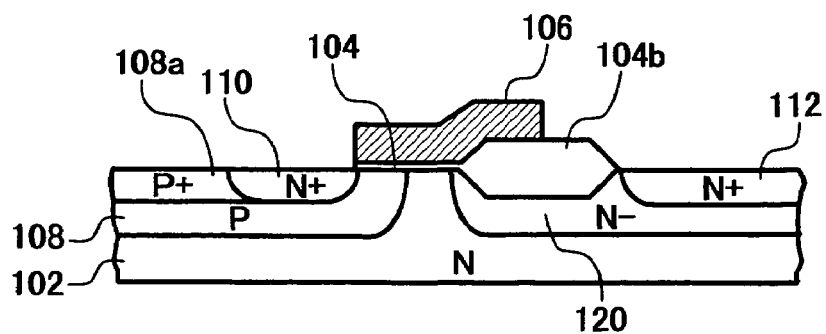
Figure 9:
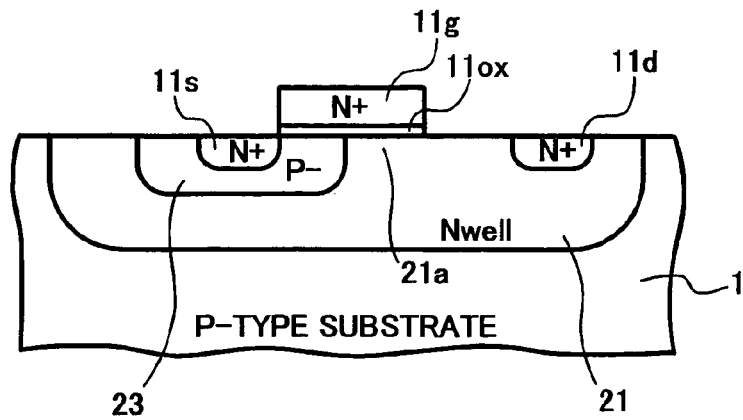
FIG. 9 is a cross-sectional view illustrating another conventional LDMOS transistor.
Figure 10:
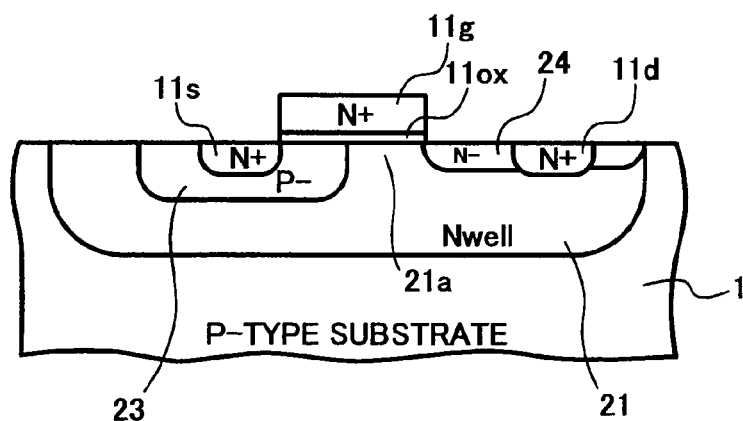
FIG. 10 is a cross-sectional view illustrating still another conventional LDMOS transistor.

FIG. 7 is an electrical schematic diagram illustrating an inverting type charge pump DC/DC converter incorporating LDMOS transistors disclosed herein.

Referring to FIG. 7, the DC/DC inverter includes at least an input terminal V in 71, an inverting output terminal V out 73, a ground terminal GND 75, a charge capacity positive terminal CP+ 77, and a charge capacity negative terminal CP− 79. A capacitor (not shown) as an external component is further included between the charge capacity positive terminal CP+ 77 and the charge capacity negative terminal CP− 79.

Additionally provided between input terminal V in 71 and ground terminal GND 75 in order are a PchLDMOS 81 and an NchMOS 83. The charge capacity positive terminal CP+ 77 is connected between PchLDMOS 81 and NchMOS 83. The junction between NchMOS 83 and ground terminal GND 75 is connected to the ground potential 85.

In addition, NchMOS transistors 87 and 89 are provided in order between ground potential 85 and output terminal V out 73. The charge capacity negative terminal CP− 79 is connected between NchMOS transistors 87 and 89.

An oscillator OSC 93 is also provided to transmit a voltage of either positive or negative after comparing with the reference voltage output from a voltage reference circuit V ref 91. An output terminal of the oscillator OSC 93 is connected to respective gate electrodes of NchMOS transistors 83 and 89 directly, to the gate electrode of NchMOS 87 by way of an inverter 95, and to the gate electrode of PchLDMOS 81 by way of inverters 95 and 97.

This inverting type charge pump DC/DC converter operates so as to exert the switching operations of the four transistors 81, 83, 87 and 89, by applying voltages from the oscillator 323 to respective gate electrodes of these transistors, to generate the current by charging and discharging the capacitor connected between the charge capacity positive terminal CP+ 77 and the charge capacity negative terminal CP− 79, and to output to the output terminal 73 the voltage generated by inverting the voltage input from the input terminal 71.

Upon transmitting a positive voltage from the oscillator OSC 93, the transistors PchLDMOS 81 and NchMOS 87 are turned on, while two other NchMOS transistors 83 and 89 are turned off. During this period, the charge is accumulated in the capacitor connected between the charge capacity positive terminal CP+ 77 and the charge capacity negative terminal CP− 79.

In contrast, on transmitting a negative voltage from the oscillator OSC 93, the transistors PchLDMOS 81 and NchMOS 87 are turned off, while other NchMOS transistors 83 and 89 are turned on. The capacitor then dissipates the charge previously accumulated. Since the potential of the output terminal V out 73 is kept lower than the ground terminal 75, the voltage is now obtained, which is inverted from that induced by the previous charge, and then output to the output terminal 73. By repeating the above steps, therefore, the current flow can be maintained with the voltage inverted from the voltage input.

Figure 14:
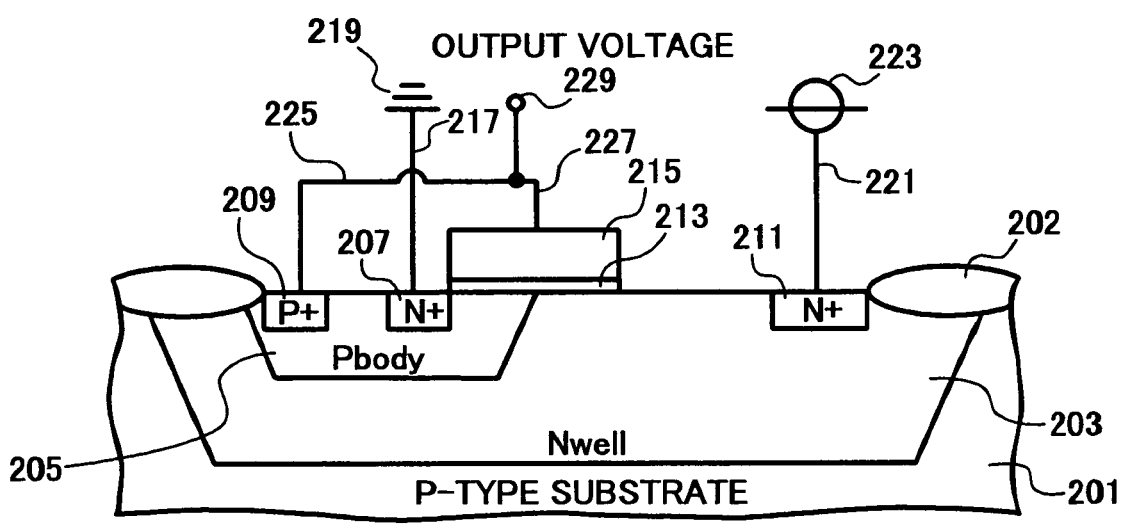
FIG. 14 is a cross-sectional view illustrating an NPN bipolar transistor according to one exemplary embodiment.

FIG. 14 is a diagrammatic cross-sectional view illustrating an NPN bipolar transistor according to one embodiment disclosed herein.

Referring to FIG. 14, the NPN bipolar transistor includes at least a field oxide layer 202 formed on a P-type semiconductor substrate (P-type substrate) for implementing electrical isolation; a collector (Nwell) 203, made of an N-type diffusion layer formed in the region for forming the bipolar transistor in the P-type substrate; and a base (P body) 205, made of a P-type diffusion layer, formed in the collector 203.

In addition, there formed spatially separated each other in the base 205 are an emitter (N+) 207, made of an N-type diffusion layer, and a high concentration ohmic diffusion layer (P+) for connecting the base 209 made of a P-type diffusion layer. The distance between the emitter (N+) 207 and high concentration ohmic diffusion layer (P+) 209 for the base is typically 1.5 μm or greater.

In the collector (Nwell) 203, a high concentration N-type ohmic diffusion layer (N+) 211 for connecting the collector is formed spatially separated from the base 205, doped with N-type impurities having a concentration higher than the collector 203.

A gate electrode 215, made of conductive silicon layer, is formed with an underlying gate oxide layer 213 interposed between the gate electrode 215 and the well region 203.

This gate electrode 215 is formed, spatially disposed intermediate between emitter 207 and high concentration N-type ohmic diffusion layer (N+) for collector 211, overlying the spatial portion between the collector 203 and base 205, in close proximity to the emitter 207 and spatially separated from the high concentration N-type ohmic diffusion layer (N+) 211.

The distance between gate electrode 215 and high concentration N-type ohmic diffusion layer (N+) 211 is typically 1.5 μm or greater. The base 205 and emitter 207 are both formed in the self-aligned manner with respect to the gate electrode 215.

The emitter 207 is electrically connected to the ground potential 219 by way of an emitter wiring 217. The high concentration N-type ohmic diffusion layer 211 for collector is connected to a source potential 223 by way of a collector wiring 221.

There connected to the high concentration ohmic diffusion layer for the base 209 and to the gate electrode 215 are a base wiring 225 and a gate wiring 227, respectively. In addition, the base wiring 225 and a gate wiring 227 are connected each other, to further be connected together to an input terminal 229.

Referring to FIGS. 15A through 15F, there is shown, in a series of cross-sectional views, a sequence of some process steps which may be utilized in fabricating the NPN bipolar transistor of FIG. 14.

(1) A layer of photoresist is disposed on a P-type substrate 201, the portion of which is removed through conventional photolithographic operations, whereby a resist pattern is formed having an opening which defines the region for forming the collector 203.

Figure 15A:
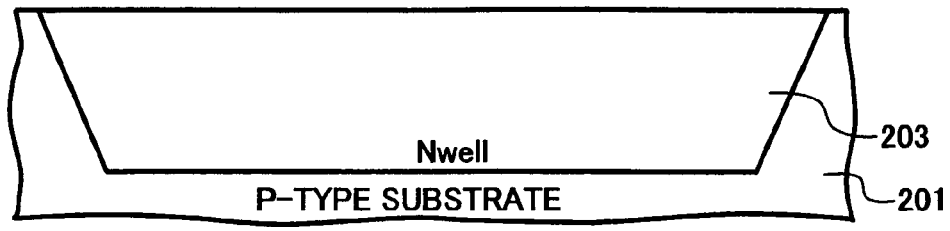
FIGS. 15A–15F are cross-sectional views of a bipolar transistor of FIG. 14 during various stages in the fabrication process.
Figure 15B:
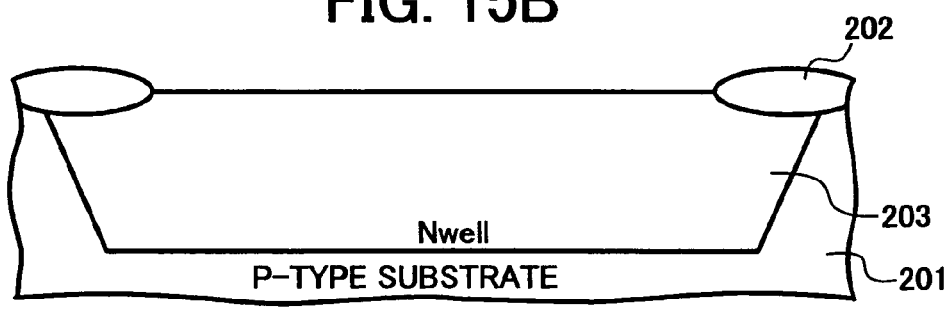

Using the resist pattern as a mask, phosphorus ions are implanted into the P-type substrate 201 under the conditions of an acceleration energy of 150 keV and a dose of approximately $4.0 \times 10^{12}$ cm$^{-2}$. After removing the resist pattern, the implanted phosphorus ions are subjected to thermal diffusion at 1180° C. for 8 hours whereby the collector (Nwell) 203 is formed (FIG. 15A).

(2) A field oxide layer 202 is then formed by the LOCOS method on the P-type substrate 201 to a thickness of approximately 800 nm (FIG. 15B), to thereby implement the isolation of the region for forming the bipolar transistor from other regions (not shown).

(3) A gate oxide layer 213 is formed on the entire surface of the structure to a thickness of 30 nm. A polysilicon layer is subsequently grown thereon by the method such as, for example, CVD to a thickness of 350 nm.

Figure 15C:
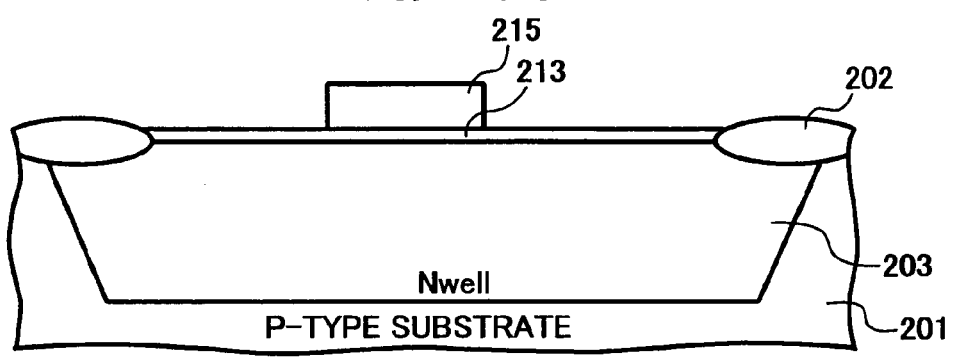

Thereafter, an oversaturated amount of phosphorus ions are diffused into the polysilicon layer by the vapor diffusion method, for example. The thus prepared polysilicon layer is then subjected to conventional masking and etching operations, whereby a gate electrode 215 is formed (FIG. 15C).

(4) A resist pattern is formed on the P-type substrate 201, having an opening over the gate electrode 215 and extending to the surface portion of the collector region in proximity to one of the sides thereof. Using this resist pattern and the gate electrode 215 as a mask, boron ions are implanted into the P-type substrate 201 under the conditions of an acceleration energy of 30 keV and a dose of approximately $2.5 \times 10^{13}$ cm$^{-2}$.

Figure 15D:
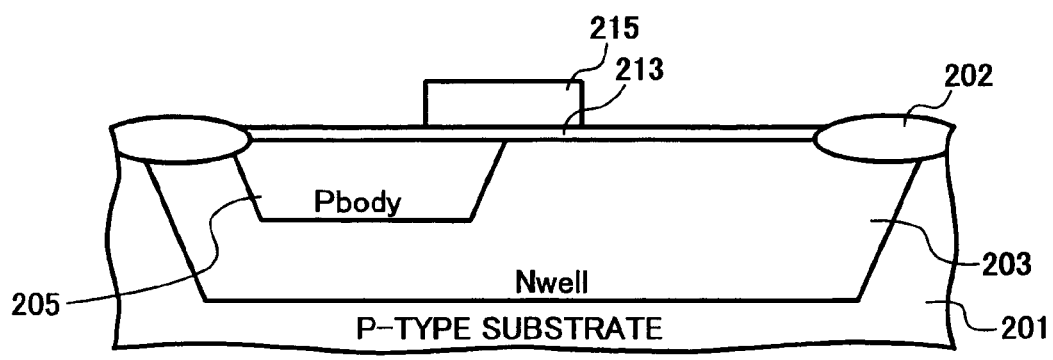

After removing the resist pattern the implanted boron ions are subjected to thermal diffusion at 1100° C. for approximately 3 hours whereby the base (P body) 205 is formed in the self-aligned manner with respect to the gate electrode 215 (FIG. 15D).

(5) Thereafter, another resist pattern is formed having an opening overlying several portions such as the gate electrode 215, its vicinity on one side thereof, and the collector region on the other side thereof. For forming this resist pattern, the opening for the above mentioned portion on the other side of the gate electrode 215 is made having an opening width of 1.5 μm or greater, for example, from the gate electrode.

Using this resist pattern as a mask, ions of either phosphorus or arsenic are implanted simultaneously into the regions for forming a collector and a base under the conditions of an acceleration energy of 50 keV and a dose of approximately $6.0 \times 10^{15}$ cm$^{-2}$.

Figure 15E:
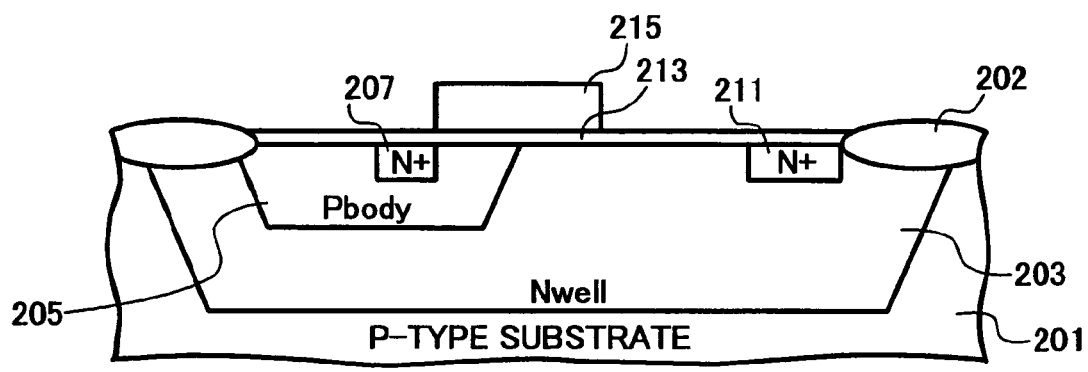

After removing the resist pattern, the implanted ions are subjected to thermal diffusion at 920° C. for approximately one hour whereby the emitter (N+) 207 is formed in close proximity to the gate electrode 215, and the high concentration N-type ohmic diffusion layer (N+) for collector 211 is formed spatially separated from the gate electrode 215 with a distance of 1.5 μm or greater, for example (FIG. 15E).

(6) Another resist pattern is formed having an opening overlying the portion on the base 205 spatially separated from emitter 207 with a distance of 1.5 μm or greater, for example. Using the resist pattern as a mask, boron ions are implanted into the region for forming a high concentration ohmic diffusion layer for base under the conditions of an acceleration energy of 30 keV and a dose of approximately $2.0 \times 10^{15}$ cm$^{-2}$.

Figure 15F:
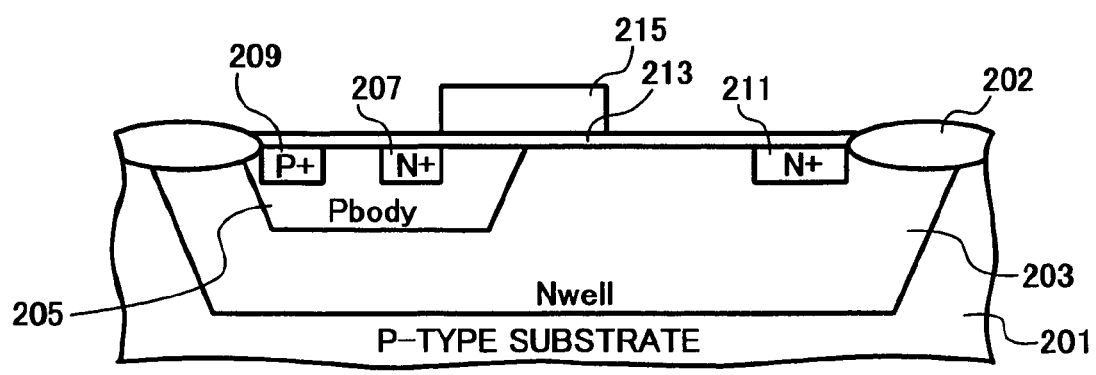

After removing the resist pattern, the implanted ions are subjected to thermal diffusion at 920° C. for approximately one hour whereby the high concentration ohmic diffusion layer (P+) for base 209 is formed in the base 205 (FIG. 15F).

Referring again to FIG. 14, succeeding process steps begin with forming a dielectric interlayer (not shown) on the thus formed structure.

The next step is to make contact holes (not shown) in the interlayer corresponding to respective regions of the emitter 207, high concentration ohmic diffusion layer for base 209, and high concentration N-type ohmic diffusion layer for collector 211. These contact holes are replenished with conducting materials. Appropriate wirings, 217, 221, 225 and 227, are then formed on the interlayer.

Subsequently electrically connected are the emitter 207 to the ground potential 219 by way of an emitter wiring 217, the high concentration N-type ohmic diffusion layer for collector 211 to source potential 223 by way of a collector wiring 221, and the high concentration ohmic diffusion layer for base 209 and the gate electrode 215 to the input terminal 229 by way of a base wiring 225 and a gate wiring 227, respectively.

By the method described herein above, the NPN bipolar transistor of FIG. 14 can suitably be fabricated. In addition, the base 205 and emitter 207 are formed in the self-aligned manner with respect to the gate electrode 215, this facilitates to determine appropriately the current amplification factor of the present transistor with the lateral bipolar transistor structure, and also to determine the width of the base as small as predetermined, through which most of the current flow exists.

Furthermore, by forming the base 205 and emitter 207 again in the self-aligned manner with respect to the gate electrode 215, as mentioned above, the dispersion in alignment of the base width during photolithographic process steps can be made small enough to be disregarded. As a result, the NPN bipolar transistor with high-efficiency can be formed with a reduced ship area.

When the NPN bipolar transistor according to the present embodiment of FIG. 14 is turned off, a gate voltage at the gate 215, a base voltage at the base 205, and an emitter voltage at the emitter 207 becomes equal with each other, i.e., the ground potential.

In the off-state of the transistor in a similar manner to that of DMOS (double-diffused metal-oxide transistor), a positive collector voltage (source voltage) is applied to the collector 203 (corresponding to the drain of the DMOS) by way of collector wiring 221 and high concentration N-type ohmic diffusion layer for collector 211.

As a result, a depleted region is created at an interface between the collector 203 and base 205 (corresponding to the channel of DMOS), or in the interface region on the both sides of the collector 203 and the base 205, whereby high withstand voltages can be maintained.

Figure 16:
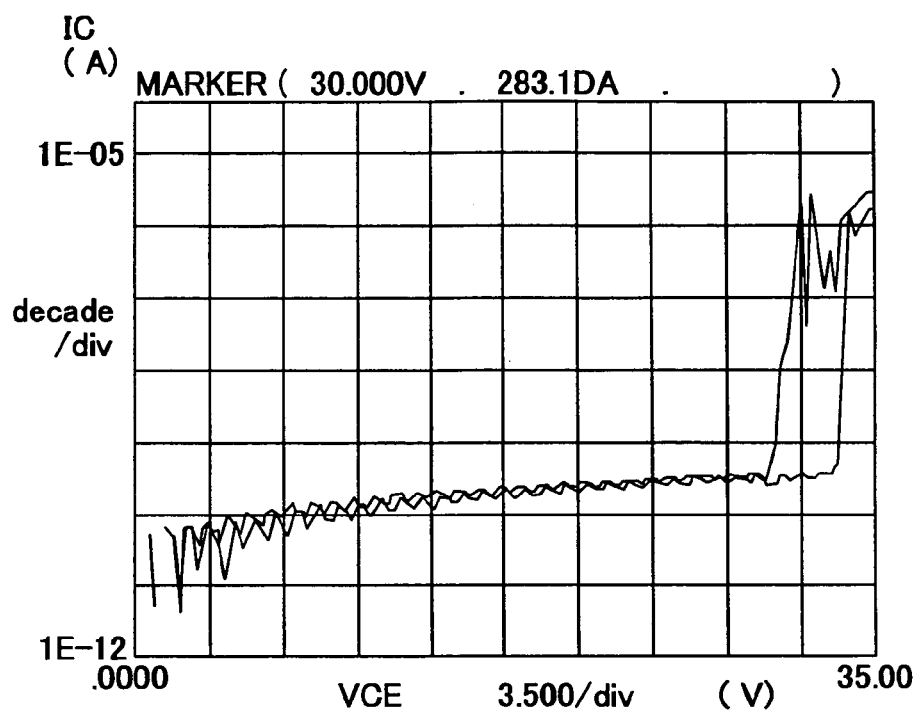
FIG. 16 contains a graphical plot illustrating the collector current $I_c$ as a function of the voltage $V_{CE}$ between collector and emitter for an NPN bipolar transistor at an on-state.

FIG. 16 is prepared to illustrate withstand voltage characteristics of the NPN bipolar transistor at off-state, which plots the collector current (A), vertically, versus the voltage between collector and emitter (V), horizontally, for the transistor.

As shown in FIG. 16, the collector current is as small as several hundreds of pA in the range between 0 to 30 V, which is indicative of being similar in the withstand voltage characteristics to those of the LDMOS transistor in off-state.

In contrast, when the NPN bipolar transistor is turned on, a source voltage is applied to the base 205 by way of the base wiring 225 and high concentration ohmic diffusion layer for base 209, and the source voltage is applied also to the gate 215 by way of the gate wiring 227.

Although both source and channel are at the same potential in the DMOS, the potential difference between the base 205 and the emitter 207 in the NPN bipolar transistor becomes forward-biased, since the base and the emitter thereof correspond to the channel and the source of the DMOS, respectively.

This results in the application of a positive potential to the base 205. As a result, a high voltage does not appear at the gate electrode 215 of the NPN transistor, which will be detailed herein below with reference to FIG. 22.

Figure 17:
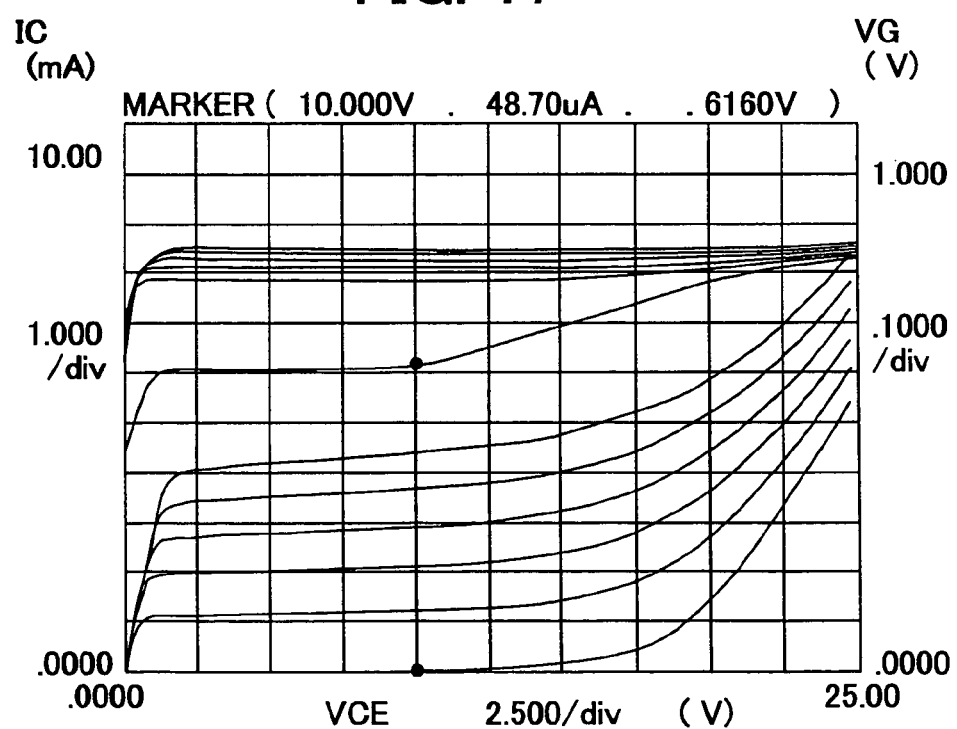
FIG. 17 contains transistor characteristic curves for an NPN bipolar transistor at an on-state disclosed herein, including the bottom-half group of the curves illustrating the $I_C$–$V_{CE}$ characteristics, and the top-half group of the curves illustrating the $V_G$–$V_{CE}$ characteristics.

FIG. 17 is prepared to illustrate transistor characteristic curves for the NPN bipolar transistor at on-state, including (1) the bottom-half group of the curves which show the $I_c$–$V_{CE}$ characteristics with the collector current $I_C$, vertically, referring to the left-hand scale in mA, versus the voltage $V_{CE}$ between collector and emitter, horizontally, referring to the bottom scale in V, and (2) the top-half group of the curves which show the $V_G$–$V_{CE}$ characteristics with the gate voltage $V_G$, vertically, referring to the right-hand scale in V, versus the voltage $V_{CE}$ between collector and emitter, horizontally.

Figure 22:
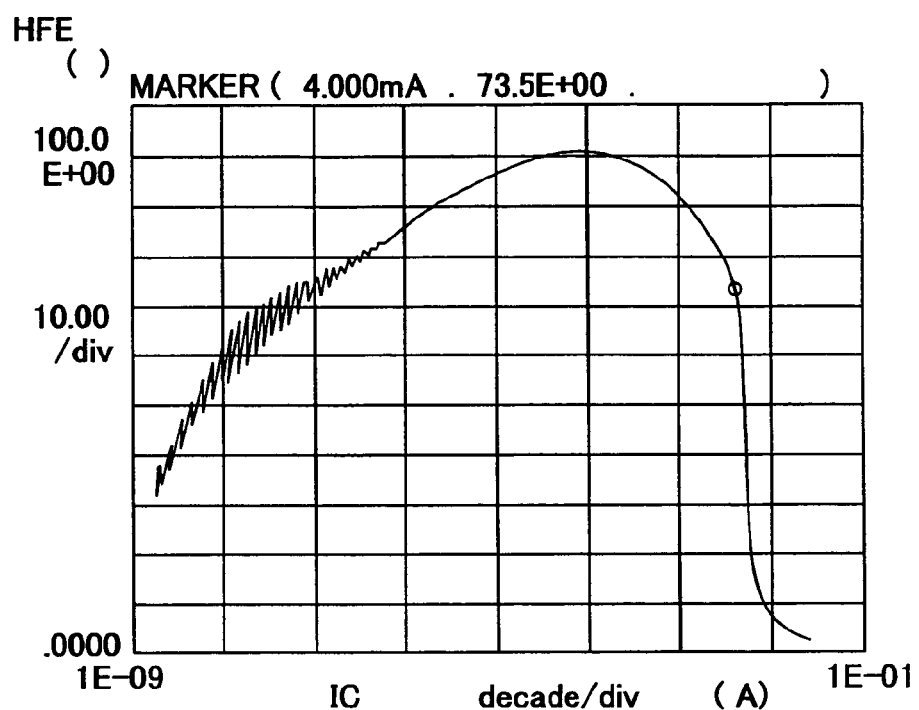
FIG. 22 contains a graphical plot illustrating the current amplification factor $h_{fe}$ as a function of collector current $I_C$ for an NPN bipolar transistor.

As shown in FIG. 22, the gate voltage $V_G$, which is at the same potential as the base 205, is maintained at a voltage ranging approximately from 0.8 to 0.9 V, without applying a high voltage at the gate 215. As a result, the breakdown of the gate oxide layer 213 can be prevented, whereby the operation characteristics of the bipolar transistor are stabilized.

By enabling the current limiting feature with the power source for supplying to the base 205 and gate electrode 215 in the bipolar transistor disclosed herein, the source and ground potentials are effectively utilized.

As a result, it becomes unnecessary to incorporate an additional device for lowering the source voltage such as, for example, an integrated stepdown circuit, which has been necessary for previous devices. This feature of the present transistor, therefore, can be suitably utilized to be included in a DC/DC converter without causing undue decrease in efficiency.

In the bipolar transistor disclosed herein, the gate electrode 215 is provided unlike previous bipolar transistors. By applying a positive potential to this gate electrode, the channel can be generated with more ease. Furthermore, by forming the emitter 207 and the high concentration ohmic diffusion layer for base 209 spatially separated one another in the transistor, a junction leak between emitter and base can be decreased.

With the above features of the present bipolar transistor, another effect can be noted over previous bipolar transistors, in that the current amplification factor is improved especially in the low current range.

Figure 18:
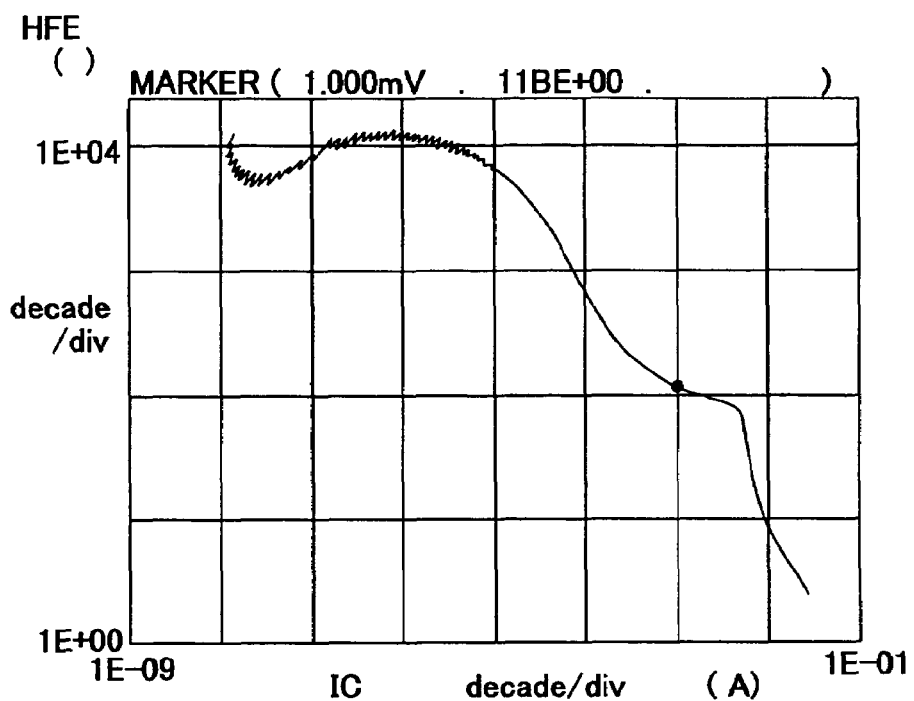
FIG. 18 contains a graphical plot illustrating the current amplification factor $h_{fe}$ as a function of collector current $I_C$ for an NPN bipolar transistor.

FIG. 18 illustrates the current amplification factor linearity characteristics of the bipolar transistor disclosed herein, which plots the current amplification factor $h_{fe}$, vertically, versus the collector current $I_C$ (A), horizontally, for the transistor, wherein the factor $h_{fe}$ is obtained by the relation, (collector current $I_C$ (A))/(base current $I_B$ (A)).

Figure 23:
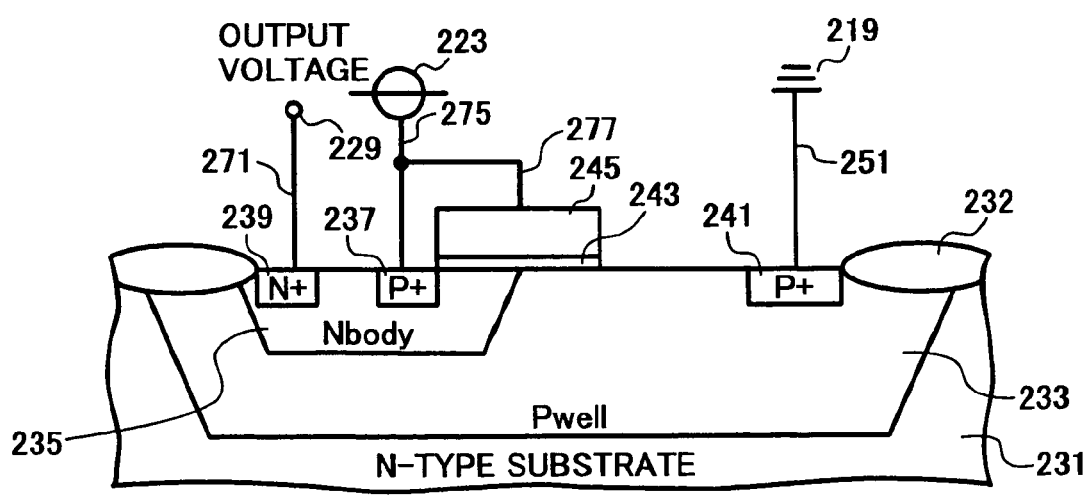
FIG. 23 is a cross-sectional view illustrating a PNP bipolar transistor according to an exemplary embodiment.

As shown in FIG. 23, the factor $h_{fe}$ has been found larger than previously known bipolar transistors in the range of small collector current values. As a result, by using the bipolar transistors disclosed herein as an output driver of a voltage stabilizer, the power consumption in the low output power range can be reduced compared with that of similar circuits using previous bipolar transistors.

It may be added in this context, in the range of large collector currents $I_C$, the current amplification factor linearity characteristics for the NPN bipolar transistor have been obtained comparable with those of previously bipolar transistors.

Figure 19:
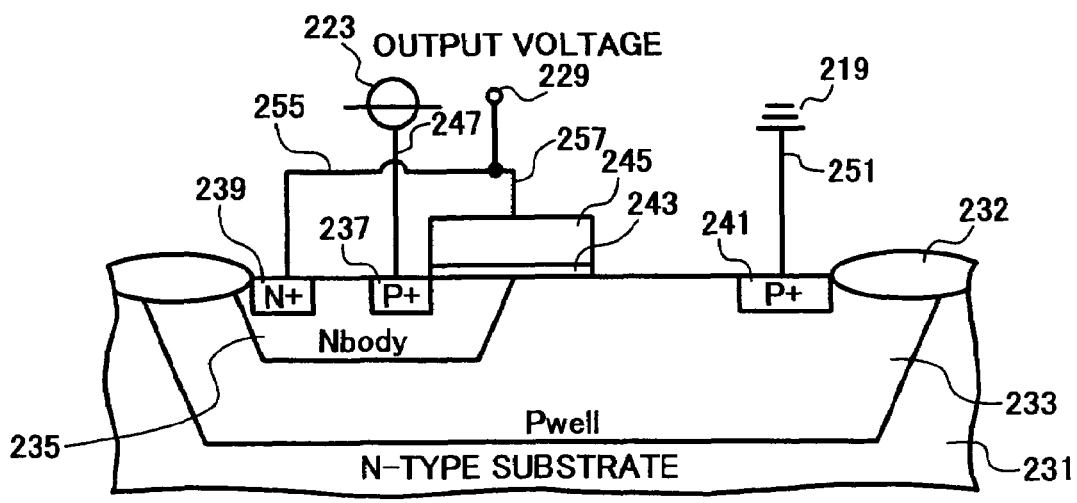
FIG. 19 is a cross-sectional view illustrating a PNP bipolar transistor according to an exemplary embodiment.

FIG. 19 is a diagrammatic cross-sectional view illustrating a PNP bipolar transistor according to another embodiment disclosed herein.

Referring to FIG. 19, the PNP bipolar transistor includes at least a field oxide layer 232 formed on an N-type semiconductor substrate (N-type substrate) for implementing electrical isolation; a collector (P well) 233, made of an P-type diffusion layer, formed in the region for forming the bipolar transistor in the N-type substrate; and a base (N body) 235, made of an N-type diffusion layer, formed in the collector 233.

In addition, there formed spatially separated each other in the base 235 are an emitter ($P^+$) 237, made of a P-type diffusion layer, and a high concentration ohmic diffusion layer ($N^+$) for connecting the base 239 made of an N-type diffusion layer. The distance between the emitter ($P^+$) 237 and high concentration ohmic diffusion layer ($N^+$) 239 for the base is typically 1.5 μm or greater.

In the collector (Pwell) 233, a high concentration P-type ohmic diffusion layer ($P^+$) 241 for connecting the collector is formed spatially separated from the base 235, doped with P-type impurities having a concentration higher than the collector 233.

A gate electrode 245, made of conductive silicon layer, is formed with an underlying gate oxide layer 243 interposed between the gate electrode 245 and the well region 233.

The gate electrode 245 is formed, spatially disposed intermediate between emitter 237 and high concentration P-type ohmic diffusion layer (P$^+$) for collector 241, overlying the spatial portion between the collector 233 and base 235, in close proximity to the emitter 237 and spatially separated from the high concentration P-type ohmic diffusion layer (P$^+$) 241.

The distance between gate electrode 245 and high concentration P-type ohmic diffusion layer (P$^+$) 241 is typically 1.5 μm or greater. The base 235 and emitter 237 are both formed in the self-aligned manner with respect to the gate electrode 245.

The emitter 237 is electrically connected to the source potential 223 by way of an emitter wiring 247. The high concentration P-type ohmic diffusion layer 241 for collector is connected to the ground potential 219 by way of a collector wiring 251.

There connected to the high concentration ohmic diffusion layer for the base 239 and to the gate electrode 245 are a base wiring 255 and a gate wiring 257, respectively. In addition, the base wiring 255 and a gate wiring 257 are connected each other, to further be connected together to an input terminal 229.

The PNP bipolar transistor disclosed herein may be fabricated in a similar manner to the process steps described earlier referring to FIGS. 15A through 15F, with the exception that the conductivity type is reversed to respective portions of the bipolar transistor.

Thus, the present method in which the conductivity type is reversed to respective portions of the bipolar transistor with respect to the process steps, the PNP bipolar transistor of FIG. 19 can also be fabricated suitably. In addition, the base 235 and emitter 237 are formed in the self-aligned manner with respect to the gate electrode 245, this facilitates to effectively determine the width of the base as small as predetermined.

Furthermore, by forming the base 235 and emitter 237 again in the self-aligned manner with respect to the gate electrode 245, as mentioned above, the dispersion in alignment of the base width during photolithographic process steps can be made small enough to be disregarded. As a result, the PNP bipolar transistor can be formed with high-efficiency and a reduced chip area.

When the PNP bipolar transistor according to the present embodiment of FIG. 19 is turned off, a gate voltage at the gate 245, a base voltage at the base 235, and an emitter voltage at the emitter 237 becomes equal with each other, i.e., the source potential. In the off-state of the transistor, a positive base voltage (source voltage) is applied to the base 235 by way of base wiring 255 and high concentration ohmic diffusion layer for base 239.

As a result, a depleted region is created at an interface between the collector 233 and base 235, or in the interface region on the both sides of the collector 233 and the base 235, whereby high withstand voltages can be maintained.

In contrast, when the PNP bipolar transistor is turned on, the potential of the base 235 becomes lower than the source potential by way of the base wiring 255 and high concentration ohmic diffusion layer for base 239, and the potential of the gate electrode 245 becomes equal to that of the base 235 by way of the gate wiring 257.

Since the potential of the base 235 is lower than the source potential applied to the emitter 237, the potential difference between the emitter 237 and the base 235 becomes forward-biased. As a result, a high voltage does not appear at the gate electrode 245 of the transistor and the breakdown of the gate oxide layer 243 can be prevented, whereby the operation characteristics of the bipolar transistor are stabilized.

By enabling the current limiting feature with the power source for supplying to the base 239 and gate electrode 245 in the bipolar transistor disclosed herein, the source and ground potentials are effectively utilized. As a result, it becomes unnecessary to incorporate an additional device for lowering the source voltage such as, for example, an integrated stepdown circuit, which has been necessary for previous devices. This feature of the present transistor, therefore, can be suitably utilized to be included in a DC/DC converter without causing undue decrease in efficiency.

In addition, the gate electrode 245 is provided in the bipolar transistor disclosed herein, unlike previous bipolar transistors. By bringing the gate electrode 245 to the ground potential, which is lower than emitter 237, the channel can be generated with more ease. Furthermore, by forming the emitter 237 and the high concentration ohmic diffusion layer for base 239 spatially separated one another in the transistor, a junction leak between emitter and base can be decreased.

With the above features of the present bipolar transistor, another effect may be noted over previous bipolar transistors, in that the current amplification factor is improved especially in its low current range.

Figure 20:
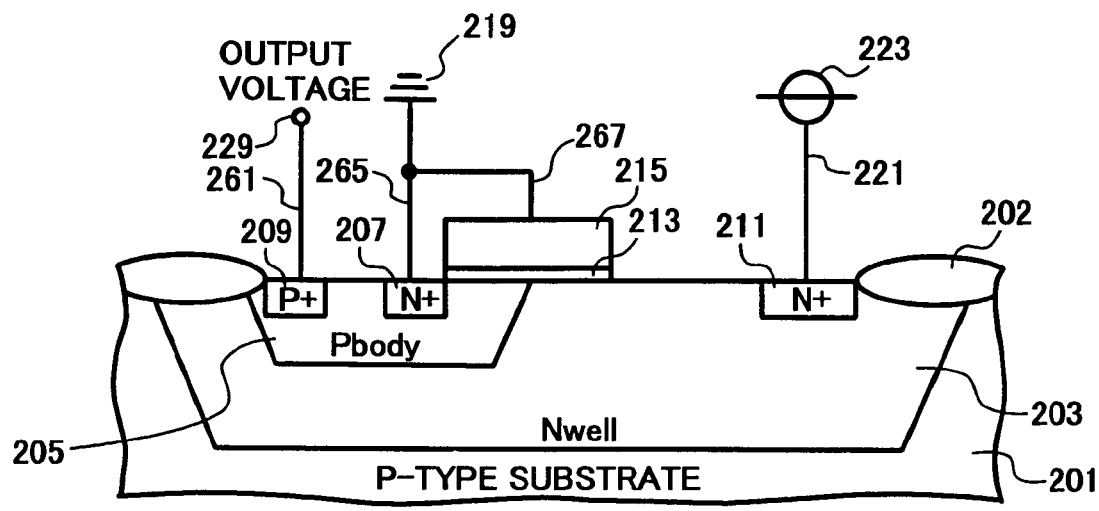
FIG. 20 is a cross-sectional view illustrating an NPN bipolar transistor according to another exemplary embodiment.

FIG. 20 is a diagrammatic cross-sectional view illustrating an NPN bipolar transistor according to still another embodiment disclosed herein. In the description which follows, the components operating in a similar manner to those in FIG. 14 are shown with identical numerical representation and descriptions thereof are herein abbreviated.

Referring to FIG. 20, the NPN bipolar transistor includes at least a field oxide layer 202 formed on a P-type substrate 201; a collector (Nwell) 203, made of an N-type diffusion layer, formed in the region for forming therein the bipolar transistor in the P-type substrate; a base (P body) 205, made of a P-type diffusion layer, formed in the collector 203; an emitter (N$^+$) 207 made of an N-type diffusion layer; a high concentration ohmic diffusion layer (P$^+$) for base 209 made of a P-type diffusion layer; a high concentration N-type ohmic diffusion layer (N$^+$) for the collector 211 made of an N-type diffusion layer; a gate oxide layer 213; and a gate electrode 215.

The above structure for the PNP bipolar transistor is therefore similar to that of the transistor of FIG. 14.

The high concentration ohmic diffusion layer for collector 211 is electrically connected to a source potential 223 by way of a collector wiring 221. The high concentration ohmic diffusion layer for base 209 is connected to an input terminal 229 by way of a base wiring 261.

There connected are an emitter wiring 265 to the emitter 207, and a gate wiring 267 to the gate electrode 215. In addition, the emitter wiring 265 and the gate wiring 267 are connected one another, to further be connected together to the ground potential 219.

The NPN bipolar transistor disclosed herein may be fabricated in a similar manner to the process steps described earlier referring to FIGS. 15A through 15F, with succeeding steps which follows herein below.

Referring again to FIG. 20, the succeeding process steps begin with forming a dielectric interlayer (not shown) on the thus formed structure. The next step is to make contact holes (not shown) in the interlayer corresponding to respective regions of the emitter 207, high concentration ohmic diffusion layer for base 209, and high concentration ohmic diffusion layer for collector 211. These contact holes are replenished with conducting materials. Appropriate wirings, 221, 261, 265 and 267, are then formed on the interlayer.

Subsequently connected are the high concentration ohmic diffusion layer for collector 211 to source potential 223 by way of a collector wiring 221, the high concentration ohmic diffusion layer for base 209 to the input terminal 229 by way of a base wiring 261, the emitter 207 and the gate electrode 215 by way of an emitter wiring 265 and a gate electrode wiring 267, respectively, to the ground potential 219.

By the method described herein above, the NPN bipolar transistor of FIG. 20 can be suitably fabricated.

When the NPN bipolar transistor according to the present embodiment of FIG. 20 is turned off, a gate voltage at the gate 215, a base voltage at the base 205, and an emitter voltage at the emitter 207 becomes equal with each other, i.e., the ground potential.

The withstand voltage characteristics of the transistor in off-state are therefore similar to those described earlier with reference to FIG. 16. That is, a source voltage is applied to the collector 203 by way of collector wiring 221 and high concentration ohmic diffusion layer for collector 211.

As a result, a depleted region is created at an interface between the collector 203 and base 205, or in the interface region on the both sides of the collector 203 and the base 205, whereby high withstand voltages can be maintained.

In contrast, when the NPN bipolar transistor is turned on, a source voltage is applied as an input voltage to the base 205 by way of the base wiring 261 and high concentration ohmic diffusion layer for base 209. With the positive voltage thus applied to the base 205, the potential difference between the emitter 207 and the base 205 becomes forward-biased.

As a result, a high voltage does not appear at the gate electrode 215 of the NPN transistor, which will be detailed herein below with reference to FIG. 21.

Figure 21:
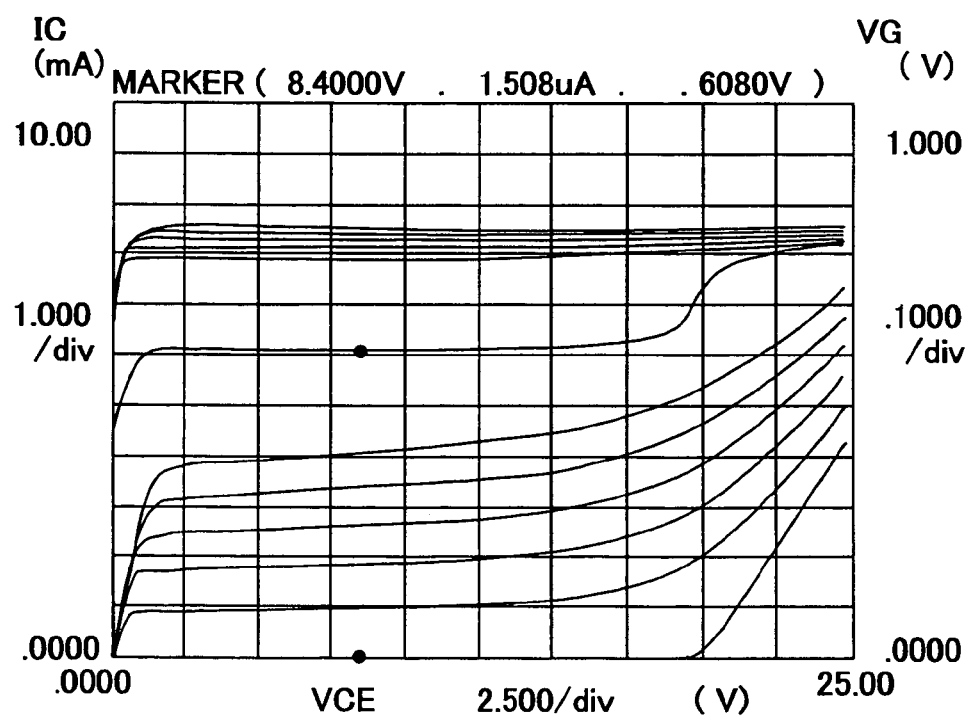
FIG. 21 contains transistor characteristic curves for an NPN bipolar transistor at an on-state, including the bottom-half group of the curves illustrating the $I_C$–$V_{CE}$ characteristics, and the top-half group of the curves illustrating the $V_G$–$V_{CE}$ characteristics.

FIG. 21 is prepared to illustrate transistor characteristic curves for the NPN bipolar transistor at on-state in a similar manner to FIG. 17, including (1) the bottom-half group of the curves which show the $I_C$–$V_{CE}$ characteristics, with the collector current $I_C$, vertically, versus the voltage $V_{CE}$ between collector and emitter, horizontally, and (2) the top-half group of the curves which show the $V_G$–$V_{CE}$ characteristics, with the gate voltage $V_G$, vertically, versus the voltage $V_{CE}$ between collector and emitter, horizontally.

As shown in FIG. 21, the gate voltage $V_G$, which is at the same potential as the emitter 207, is maintained at a voltage ranging approximately from 0.8 to 0.9 V, without applying a high voltage at the gate 215. As a result, the breakdown of the gate oxide layer 213 can be prevented, whereby the operation characteristics of the bipolar transistor are stabilized.

By enabling the current limiting feature with the power source for supplying to the base 205 in the bipolar transistor disclosed herein, the source and ground potentials are effectively utilized. As a result, it becomes unnecessary to incorporate an additional device for lowering the source voltage such as, for example, an integrated stepdown circuit, which has been necessary for previous devices. This feature of the present transistor, therefore, can be suitably utilized to be included in a DC/DC converter without causing undue decrease in efficiency.

FIG. 22 illustrates the current amplification factor linearity characteristics of the bipolar transistor disclosed herein, which plots the current amplification factor $h_{fe}$, vertically, versus the collector current $I_C$ (A), horizontally, for the transistor.

By forming the emitter 207 and the high concentration ohmic diffusion layer for base 209 spatially separated one another in the transistor, a junction leak between emitter and base can be decreased.

As shown in FIG. 22, in spite of the base width thereof smaller than previous lateral bipolar transistors, the current amplification factor linearity characteristics are found comparable to those of the previous bipolar transistors, and the factor $h_{fe}$ is obtained to reach approximately 100 for the transistors according to the embodiment disclosed herein.

FIG. 23 is a diagrammatic cross-sectional view illustrating a PNP bipolar transistor according to another embodiment disclosed herein. In the description which follows, the components operating in a similar manner to those in FIG. 19 are shown with identical numerical representation and descriptions thereof are herein abbreviated.

Referring to FIG. 23, the PNP bipolar transistor includes at least a field oxide layer 232 formed on an N-type substrate 231; a collector (Pwell) 233, made of a P-type diffusion layer, formed in the region for forming the bipolar transistor in the N-type substrate 231; a base (Nbody) 235 made of an N-type diffusion layer; an emitter ($P^+$) 237 made of a P-type diffusion layer; a high concentration ohmic diffusion layer ($N^+$) for base 239 made of an N-type diffusion layer; a high concentration ohmic diffusion layer ($P^+$) for the collector 241 made of a P-type diffusion layer; a gate oxide layer 243; and a gate electrode 245.

This structure of the PNP bipolar transistor is therefore similar to that of the transistor of FIG. 19.

The high concentration ohmic diffusion layer for collector 241 is electrically connected to the ground potential 219 by way of a collector wiring 251. The high concentration ohmic diffusion layer for base 239 is connected to an input terminal 229 by way of a base wiring 271.

There connected are an emitter wiring 275 to the emitter 207, and a gate wiring 277 to the gate electrode 245. In addition, the emitter wiring 275 and the gate wiring 277 are connected one another, to further be connected together to a source potential 223.

The PNP bipolar transistor disclosed herein may be fabricated in a similar manner to the process steps described earlier referring to FIGS. 15A through 15F, with the exception that the conductivity type is reversed to respective portions of the bipolar transistor, and that additional steps are further included.

Referring again to FIG. 23, the succeeding process steps begin with forming a dielectric interlayer (not shown) on the thus formed structure. The next step is to provide contact holes (not shown) in the interlayer corresponding to respective regions of the emitter 237, high concentration ohmic diffusion layer for base 239, and high concentration ohmic diffusion layer for collector 241. These contact holes are replenished with conducting materials. Appropriate wirings, 251, 271, 275 and 277, are then formed on the interlayer.

Subsequently connected are the high concentration ohmic diffusion layer for collector 241 to the ground potential 219 by way of a collector wiring 251, the high concentration ohmic diffusion layer for base 239 to the input terminal 229 by way of a base wiring 271, the emitter 237 and the gate electrode 245 by way of the emitter wiring 275 and the gate electrode wiring 277, respectively, to the source potential 223.

By the method described herein above, the PNP bipolar transistor of FIG. 23 can be suitably fabricated.

When the PNP bipolar transistor according to the present embodiment of FIG. 23 is turned off, a gate voltage at the gate 245, a base voltage at the base 235, and an emitter voltage at the emitter 237 becomes equal with each other, i.e., the source potential. That is, a positive base voltage (source potential) is applied to the base 235 by way of base wiring 271 and high concentration ohmic diffusion layer for base 239.

As a result, a depleted region is created at an interface between the collector 233 and base 235, or in the interface region on the both sides of the collector 233 and the base 235, whereby high withstand voltages can be maintained.

In contrast, when the PNP bipolar transistor is turned on, the potential of the base 235 becomes lower than the source potential by way of the base wiring 275 and high concentration ohmic diffusion layer for base 235.

Since the potential of the base 235 is lower than the source potential applied to the emitter 237, the potential difference between the emitter 237 and the base 235 becomes forward-biased.

As a result, a high voltage does not appear at the gate electrode 245 of the PNP transistor, and the breakdown of the gate oxide layer 243 can be prevented, whereby the operation characteristics of the bipolar transistor are stabilized.

By enabling the current limiting feature with the power source for supplying to the base 239 and gate electrode 245 in the bipolar transistor disclosed herein, the source and ground potentials are effectively utilized. As a result, it becomes unnecessary to incorporate an additional device for lowering the source voltage such as, for example, an integrated stepdown circuit, which has been necessary for previous devices. This feature of the present transistor, therefore, can be suitably utilized to be included in a DC/DC converter, without causing undue decrease in efficiency.

In addition, by forming the emitter 237 and the high concentration ohmic diffusion layer for base 239 spatially separated from one another in the transistor disclosed herein, a junction leak between emitter and base can be decreased.

With the above features of the present bipolar transistor in spite of the base width thereof smaller than previous lateral bipolar transistors, the current amplification factor linearity characteristics are found comparable to those of the previous bipolar transistors.

Figure 24A:
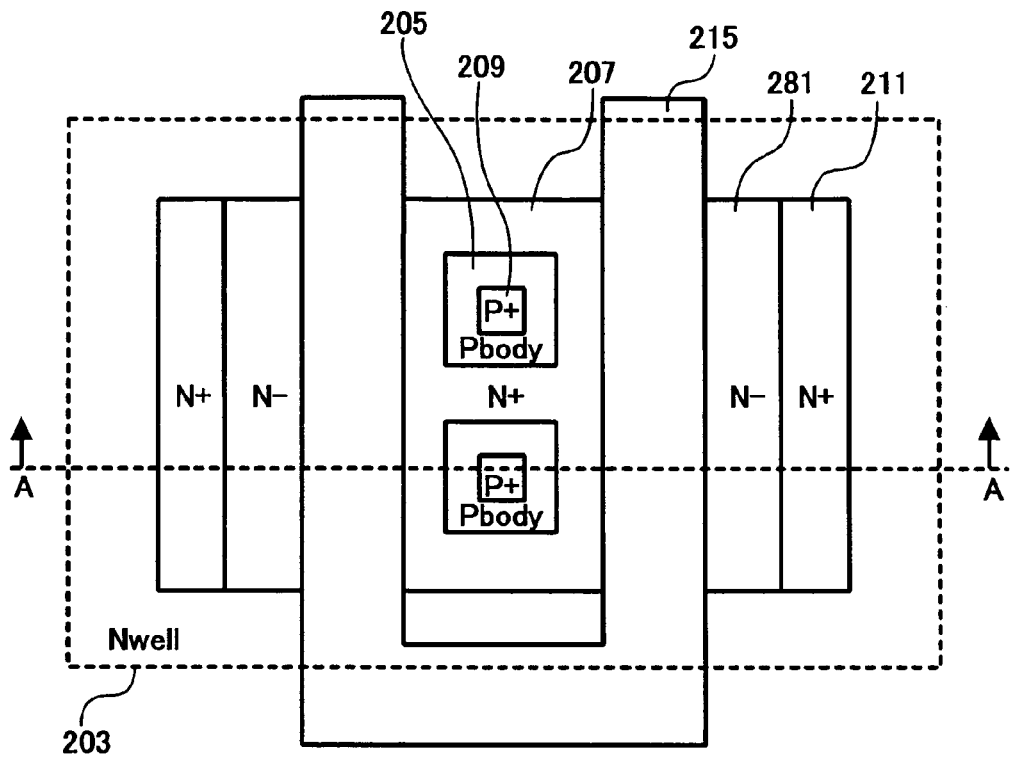
FIG. 24A is a plan view illustrating an NPN bipolar transistor according to another exemplary embodiment.
Figure 24B:
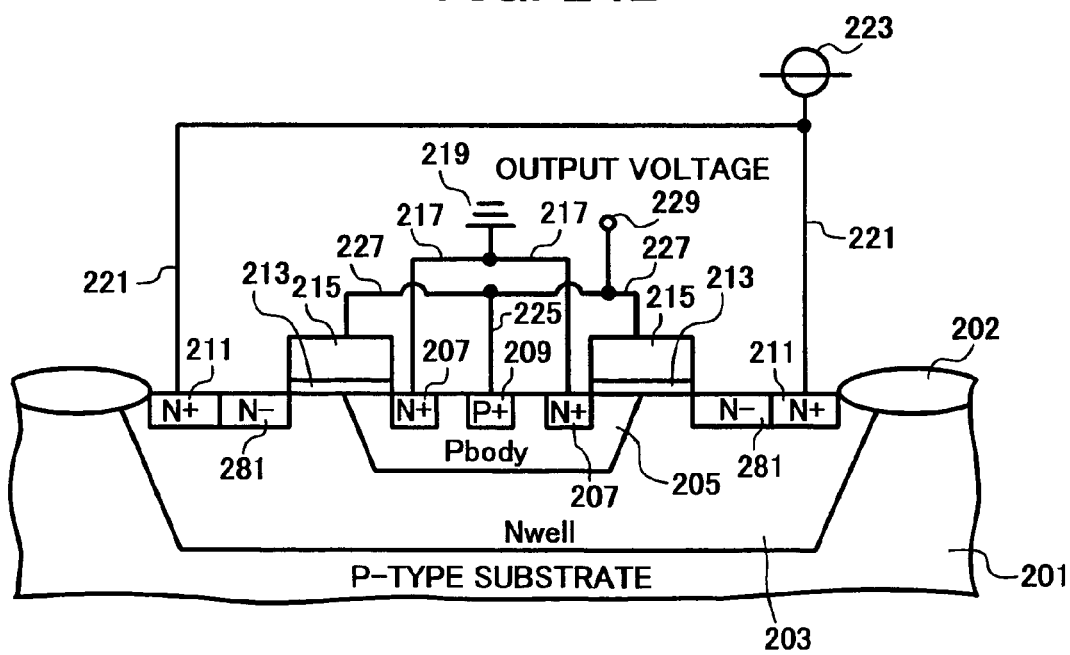
FIG. 24B is a cross-sectional view taken generally along the line A—A of a structure of an NPN bipolar transistor of FIG. 24A.

FIG. 24A is a plan view illustrating an NPN bipolar transistor according to another embodiment disclosed herein, and FIG. 24B is a diagrammatic cross-sectional view of the transistor of FIG. 24A taken generally along the line A—A of the structure of FIG. 24A. In the description which follows, the components operating in a similar manner to those in FIG. 14 are shown with identical numerical representation and descriptions thereof are herein abbreviated.

Referring to FIG. 24B, the NPN bipolar transistor includes at least a field oxide layer 202 formed on a P-type substrate 201; a collector (Nwell) 203, made of an N-type diffusion layer, formed in the region for forming therein the bipolar transistor in the P-type substrate; a base (P body) 205, made of a P-type diffusion layer, formed in the collector 203; an emitter (N$^+$) 207 made of an N-type diffusion layer; a high concentration diffusion layer (P$^+$) for base 209 made of a P-type diffusion layer; a high concentration ohmic diffusion layer (N$^+$) for collector 211 made of an N-type diffusion layer; a gate oxide layer 213; and a gate electrode 215.

In addition, a medium concentration collector (N$^+$) 281, made of a diffusion layer, is formed in the collector 203 in intermediate between the high concentration ohmic diffusion layer for collector 211 and the gate electrode 215, having an N-type impurity concentration larger than the collector 203, and smaller than the high concentration ohmic diffusion layer for collector 211.

The high concentration ohmic diffusion layer for collector 211 is electrically connected to a source potential 223 by way of a collector wiring 221. The emitter 207 is connected to the ground potential 219 by way of an emitter wiring 217.

There connected to the high concentration ohmic diffusion layer for base 209 and to the gate electrode 215 are a base wiring 225 and a gate electrode wiring 227, respectively. In addition, the base wiring 225 and the gate electrode wiring 227 are connected each other, to further be connected together to an input terminal 229.

In the NPN bipolar transistor according to the embodiment disclosed herein as illustrated in FIG. 24B, the portions of the base 205 and high concentration diffusion layer for base 209 are each formed to be shared in common by two neighboring bipolar transistor structures which are provided symmetrically with respect to the plane bisecting the transistor structure perpendicular to the line A—A.

In addition, the high concentration ohmic diffusion layer for collector 211 and medium concentration collector 281 are each formed in a similar symmetrical manner to that abovementioned. The collectors 203 and emitters 207 over the four bipolar transistor structures are each formed by fabricating a single, continuous diffusion layer. Similarly, gate electrodes 215 are formed by fabricating a single, continuous polysilicon layer.

By forming the medium concentration collector 281 in the collector 203 in intermediate between the high concentration ohmic diffusion layer for collector 211 and the gate electrode 215, a collector resistance between collector 211 and gate electrode 215 can be reduced, and the current amplification factor can be increased in the range of high current.

Figure 25D:
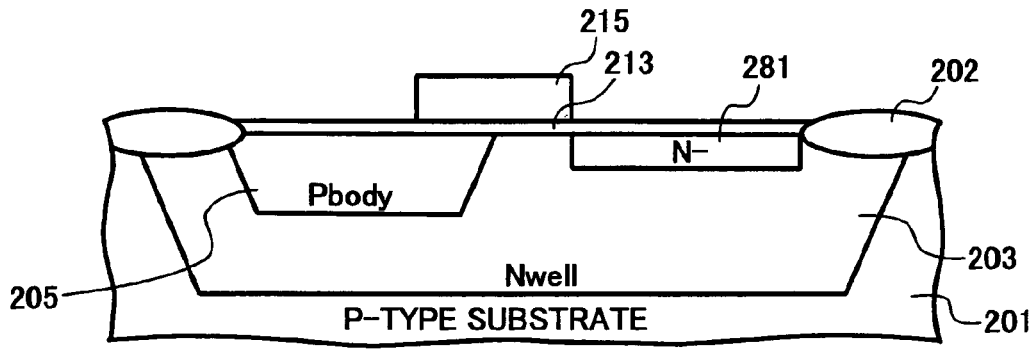
FIGS. 25D–25F are cross-sectional views of a semiconductor device of FIG. 24B during various stages in the fabrication process.
Figure 25E:
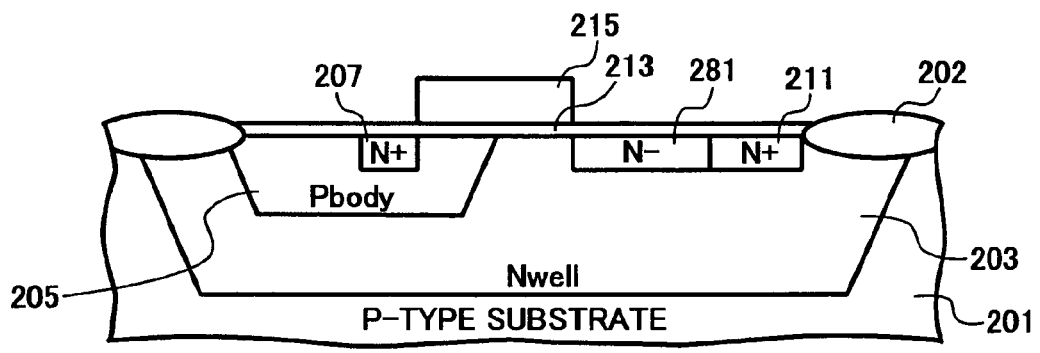
Figure 25F:
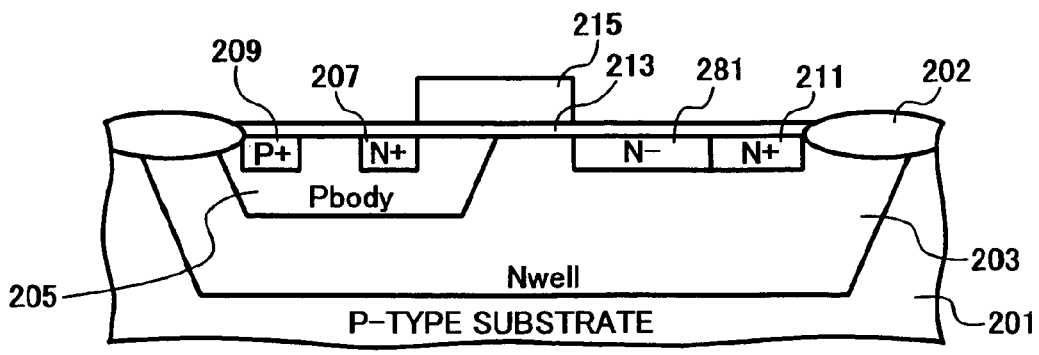

Referring to FIGS. 25D through 25F together with FIGS. 25D through 25F, there is shown, in a series of cross-sectional views, a sequence of some process steps which may be utilized in fabricating the NPN bipolar transistor of FIGS. 24A and 24B.

These drawings, FIGS. 25D through 25F, illustrate additional steps following those described earlier in reference to FIGS. 15A through 15D. In addition, there shown in these drawings are process steps to form only one of the above-mentioned two neighboring bipolar transistor structures.

Thus, the NPN bipolar transistor disclosed herein may be fabricated as follows. First, according to the aforementioned process steps (1) through (4) in reference to FIGS. 15A through 15D, a field oxide layer 202, gate oxide layer 213 and gate electrode 215 are formed on a P-type substrate 201, and a collector 203 and base 205 are formed in the substrate 201 (FIG. 15D).

Subsequently, succeeding process steps (5) through (7) are further carried out as follows.

(5) Another resist pattern is formed having an opening overlying the collector 203 on the other side from the base 205 with respect to the gate electrode 215. Using this resist pattern as a mask, phosphorus ions are implanted under the conditions of an acceleration energy of 100 keV and a dose of approximately $5.0 \times 10^{12}$ cm$^{-2}$, whereby a medium concentration collector (N$^+$) 281 is formed. The resist pattern is then removed (FIG. 25D).

(6) Thereafter, still another resist pattern is formed having an opening overlying several portions such as the gate electrode 215, the vicinity thereof on the side of base 205, and medium concentration collector 281. For forming this resist pattern, the opening for the above mentioned portion on the medium concentration collector 281 is formed with the portion retaining the resist having a width of 1.5 μm or greater from the gate electrode 215.

Using this resist pattern as a mask, ions of either phosphorus or arsenic are implanted simultaneously into the regions for forming a base 205, and a medium concentration collector 281 under the conditions of an acceleration energy of 50 keV and a dose of approximately $6 \times 10^{15}$ cm$^{-2}$.

After removing the resist pattern, the implanted ions are subjected to thermal diffusion at 920° C. for approximately one hour☐whereby the emitter (N$^+$) 207 is formed in close proximity to the gate electrode 215, and the high concentration N-type ohmic diffusion layer (N$^+$) for collector 211 is also formed in close proximity with the medium concentration collector 281 spatially separated from the gate electrode 215 with a distance of 1.5 μm or greater (FIG. 25E).

(7) Another resist pattern is formed having an opening overlying the portion on the base 205 spatially separated from emitter 207 with a distance of 1.5 μm or greater, for example. Using the resist pattern as a mask, boron ions are implanted into the region for forming a high concentration ohmic diffusion layer for base under the conditions of an acceleration energy of 30 keV and a dose of approximately $2.0 \times 10^{15}$ cm$^{-2}$.

After removing the resist pattern, the implanted ions are subjected to thermal diffusion at 920° C. for approximately one hour☐whereby the high concentration ohmic diffusion layer (P$^+$) for base 209 is formed in the base 205 (FIG. 25F).

Referring again to FIG. 24B, the succeeding process steps begin with forming a dielectric interlayer (not shown) on the thus formed structure. The next step is to provide contact holes (not shown) in the interlayer corresponding to respective regions of the emitter 207, high concentration ohmic diffusion layer for base 209, and high concentration ohmic diffusion layer for collector 211. These contact holes are replenished with conducting materials. Appropriate wirings, 217, 221, 225 and 227, are then formed on the interlayer.

There subsequently electrically connected are the emitter 207 to the ground potential 219 by way of an emitter wiring 217, the high concentration ohmic diffusion layer for collector 211 to source potential 223 by way of a collector wiring 221, and the high concentration ohmic diffusion layer for base 209 and the gate electrode 215 to the input terminal 229 by way of a base wiring 225 and a gate wiring 227, respectively.

By the method described herein above, the NPN bipolar transistor of FIGS. 24A and 24B can be suitably fabricated. In addition, the medium concentration collector 281 is formed in the self-aligned manner with respect to the gate electrode 215, and the position of the medium concentration collector 281 is therefore determined by the edge of the gate electrode 215.

As a result, the dispersion in alignment of the distance between the medium concentration collector 281 and the base 205 during photolithographic process steps can be made small enough to be disregarded.

Figure 26:
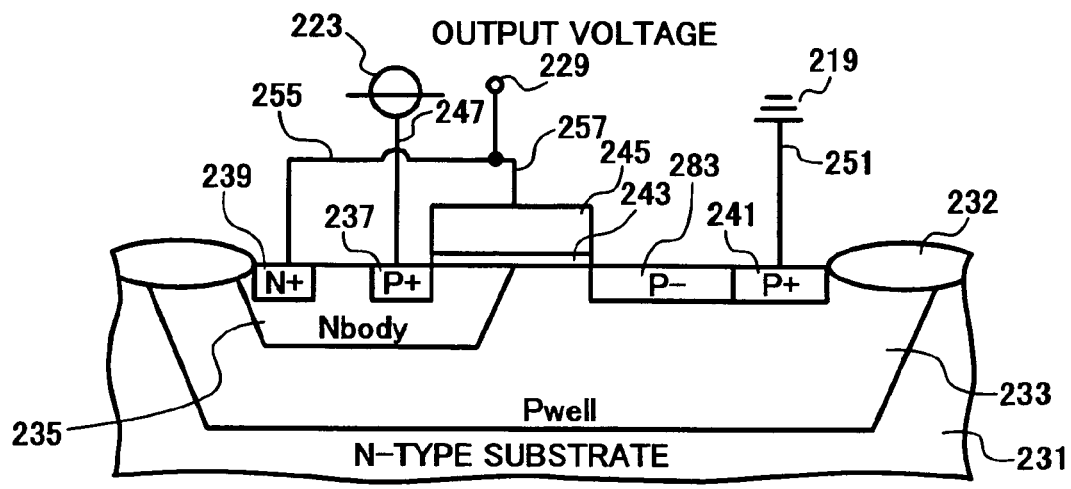
FIG. 26 is a cross-sectional view illustrating a PNP bipolar transistor according to an exemplary embodiment.

FIG. 26 is a diagrammatic cross-sectional view illustrating a PNP bipolar transistor according to another embodiment disclosed herein. In the description which follows, the components operating in a similar manner to those in FIG. 19 are shown with identical numerical representation and descriptions thereof are herein abbreviated.

Referring to FIG. 26, the PNP bipolar transistor includes at least a field oxide layer 232 formed on an N-type substrate 231; a collector (Pwell) 233, made of a P-type diffusion layer, formed in the region for forming therein the bipolar transistor in the N-type substrate; a base (N body) 235 made of an N-type diffusion layer; an emitter (P$^+$) 237 made of a P-type diffusion layer; a high concentration diffusion layer (N$^+$) for base 239 made of an N-type diffusion layer; a high concentration ohmic diffusion layer (P$^+$) for collector 241 made of a P-type diffusion layer; a gate oxide layer 243; and a gate electrode 245.

In addition, a medium concentration collector (P$^-$) 283, made of a diffusion layer, is formed in the collector 233 in intermediate between the high concentration ohmic diffusion layer for collector 241 and the gate electrode 245, having a P-type impurity concentration larger than the collector 233, and smaller than the high concentration ohmic diffusion layer for collector 241.

The emitter 237 is connected to the ground potential 219 by way of an emitter wiring 247. The high concentration ohmic diffusion layer for collector 241 is electrically connected to the ground potential 219 by way of a collector wiring 251.

There connected to the high concentration ohmic diffusion layer for base 239 and to the gate electrode 245 are a base wiring 255 and a gate wiring 257, respectively. In addition, the base wiring 255 and a gate electrode wiring 257 are connected to each other, to further be connected together to an input terminal 259.

By forming the medium concentration collector 283 in the collector 233 in intermediate between the high concentration ohmic diffusion layer for collector 241 and the gate electrode 245, a collector resistance between the high concentration ohmic diffusion layer for collector 241 and gate electrode 245 can be reduced, and the current amplification factor can be increased in the range of high current.

The PNP bipolar transistor disclosed herein may be fabricated in a similar manner to the process steps described earlier referring to FIGS. 15A through 15D, and 25D through 25F, with the exception that the conductivity type is reversed to respective portions of the bipolar transistor.

In addition, the medium concentration collector 283 is formed in the self-aligned manner with respect to the gate electrode 245 in a similar manner to the aforementioned embodiments fabricated by the process steps with reference to FIGS. 15A through 15D, and 25D through 25F. As a result, the dispersion in alignment of the medium concentration collector 283 during photolithographic process steps can be made small enough to be disregarded.

Figure 27:
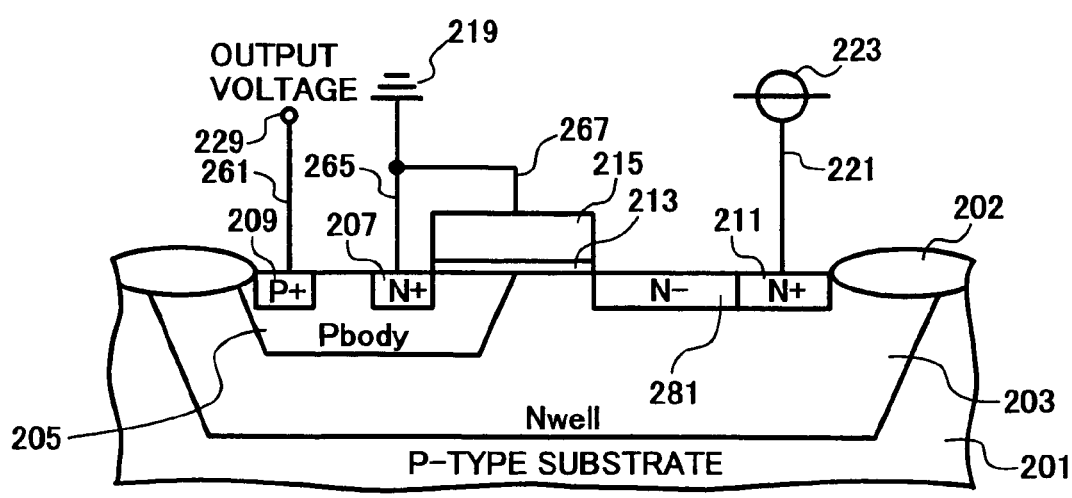
FIG. 27 is a cross-sectional view illustrating an NPN bipolar transistor according to another exemplary embodiment.

FIG. 27 is a diagrammatic cross-sectional view illustrating an NPN bipolar transistor according to another embodiment disclosed herein. In the description which follows, the components operating in a similar manner to those in FIG. 24B are shown with identical numerical representation and descriptions thereof are herein abbreviated.

Referring to FIG. 27, the NPN bipolar transistor includes at least a field oxide layer 202 formed on a P-type substrate 201; a collector (Nwell) 203, made of an N-type diffusion layer formed in the region for forming therein the bipolar transistor in the P-type substrate; a base (P body) 205, made of a P-type diffusion layer, formed in the collector 203; an emitter (N$^+$) 207 made of an N-type diffusion layer; a high concentration diffusion layer (P$^+$) for base 209 made of a P-type diffusion layer; a high concentration ohmic diffusion layer (N$^+$) for collector 211 made of an N-type diffusion layer; a gate oxide layer 213; a gate electrode 215; and a medium concentration collector 281.

This structure for the NPN bipolar transistor is therefore essentially similar to that of the transistor of FIG. 24B.

The high concentration ohmic diffusion layer for collector 211 is electrically connected to a source potential 223 by way of a collector wiring 221. The high concentration ohmic diffusion layer for base 209 is connected to an input terminal 229 applied with an input voltage by way of a base wiring 261.

There connected to the emitter 207 and to the gate electrode 215 are an emitter wiring 265 and a gate electrode wiring 267, respectively. In addition, the emitter wiring 265 and the gate electrode wiring 267 are connected each other, to further be connected together to the ground potential 219.

By forming the medium concentration collector 281 in the collector 203 in intermediate between the high concentration ohmic diffusion layer for collector 211 and the gate electrode 215 in a similar manner to the transistor of FIG. 24B, a collector resistance between the high concentration ohmic diffusion layer for collector 211 and gate electrode 215 can be reduced, and the current amplification factor can be increased in the range of high current.

The NPN bipolar transistor disclosed herein may be fabricated in a similar manner to the process steps (1) through (7) described earlier in reference to FIGS. 15A through 15D, and 25D through 25F, accompanied by succeeding steps which follows herein below.

The succeeding process steps begin with forming a dielectric interlayer (not shown) on the thus formed structure. Thereafter, contact holes (not shown) are formed in the interlayer corresponding to respective regions of the emitter 207, high concentration ohmic diffusion layer for base 209, and high concentration ohmic diffusion layer for collector 211. These contact holes are replenished with conducting materials. Appropriate wirings, 221, 261, 265 and 267, are then formed on the interlayer.

Subsequently connected are the high concentration ohmic diffusion layer for collector 211 to source potential 223 by way of a collector wiring 221, the high concentration ohmic diffusion layer 209 to the input terminal 229 by way of a base wiring 261, the emitter 207 and the gate electrode 215 by way of an emitter wiring 265 and a gate electrode wiring 267, respectively, to the ground potential 219.

The bipolar transistor of FIG. 27 may therefore be fabricated in a manner similar to the process steps described earlier referring to FIGS. 15A through 15D, and 25D through 25F.

Figure 28:
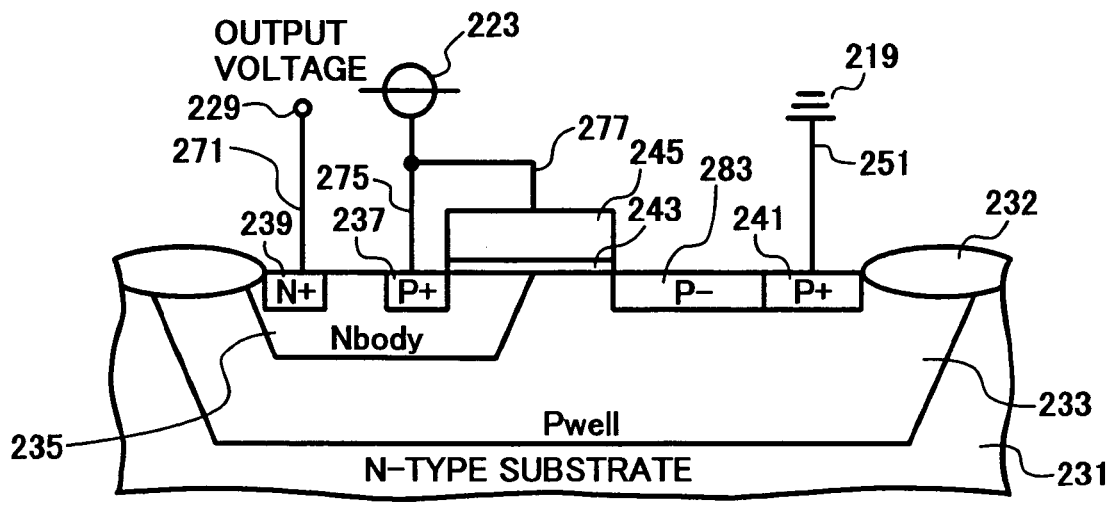
FIG. 28 is a cross-sectional view illustrating a PNP bipolar transistor according to another exemplary embodiment.

FIG. 28 is a diagrammatic cross-sectional view illustrating a PNP bipolar transistor according to one embodiment disclosed herein. In the description which follows, the components operating in a similar manner to those in FIG. 26 are shown with identical numerical representation and descriptions thereof are herein abbreviated.

Referring to FIG. 28, the PNP bipolar transistor includes at least a field oxide layer 232 formed on an N-type substrate 231; a collector (P well) 233, made of a P-type diffusion layer, formed in the region for forming therein the bipolar transistor in the N-type substrate; a base (N body) 235 made of an N-type diffusion layer; an emitter (P$^+$) 237 made of a P-type diffusion layer; a high concentration diffusion layer (N$^+$) for base 239 made of an N-type diffusion layer; a high concentration ohmic diffusion layer (P$^+$) for collector 241 made of a P-type diffusion layer; a gate oxide layer 243; a gate electrode 245; and a medium concentration collector 283.

This structure for the PNP bipolar transistor is therefore similar to that of the transistor of FIG. 26.

The high concentration ohmic diffusion layer for collector 241 is electrically connected to the ground potential 219 by way of a collector wiring 251.

The high concentration ohmic diffusion layer for base 239 is connected to an input terminal 229 by way of a base wiring 271. The emitter 237 is connected to an emitter wiring 275, and the gate electrode 245 is connected to a gate electrode wiring 277. The emitter wiring 275 and gate electrode wiring 277 are connected to each other, to further be connected together to a source potential 223.

By forming the medium concentration collector 283 in the collector 233 in intermediate between the high concentration ohmic diffusion layer for collector 241 and the gate electrode 245 in a similar manner to the transistor of FIG. 26, a collector resistance between the high concentration ohmic diffusion layer for collector 241 and gate electrode 245 can be reduced, and the current amplification factor can be increased in the range of high current.

The PNP bipolar transistor disclosed herein may be fabricated in a similar manner to the process steps (1) through (7) described earlier in reference to FIGS. 15A through 15D, and 25D through 25F with the exception that the conductivity type is reversed to respective portions of the bipolar transistor, accompanied by succeeding steps which follows herein below.

The succeeding process steps begin with forming a dielectric interlayer (not shown) on the thus formed structure. Thereafter, contact holes (not shown) are formed in the interlayer corresponding to respective regions of the emitter 237, high concentration ohmic diffusion layer for base 239, and high concentration ohmic diffusion layer for collector 241. These contact holes are replenished with conducting materials. Appropriate wirings, 251, 271, 275 and 277, are then formed on the interlayer.

Subsequently connected are the high concentration ohmic diffusion layer for collector 241 to the ground potential 219 by way of a collector wiring 251, the high concentration ohmic diffusion layer for base 239 to the input terminal 229 by way of a base wiring 271, the emitter 237 and the gate electrode 245 by way of the emitter wiring 275 and the gate electrode wiring 277, respectively, to the source potential 223.

The bipolar transistor of FIG. 28 may therefore be fabricated in a manner similar to the process steps described earlier referring to FIGS. 15A through 15D, and 25D through 25F.

While the transistors and the methods for forming such transistors are described herein above primarily on the bipolar transistor formed on either P-type or N-type semiconductor substrate according to the several embodiments in reference to FIGS. 14, 15A through 15F, 19, 20, and 23 through 28, the device structure is not limited to those described above, but may also be adapted to the transistors formed in either P-type or N-type well in the semiconductor substrate.

The bipolar transistors disclosed herein above may suitably be incorporated into several circuits such as, for example, a voltage stabilizer and a DC/DC converter, which will be detailed herein below.

Figure 29:
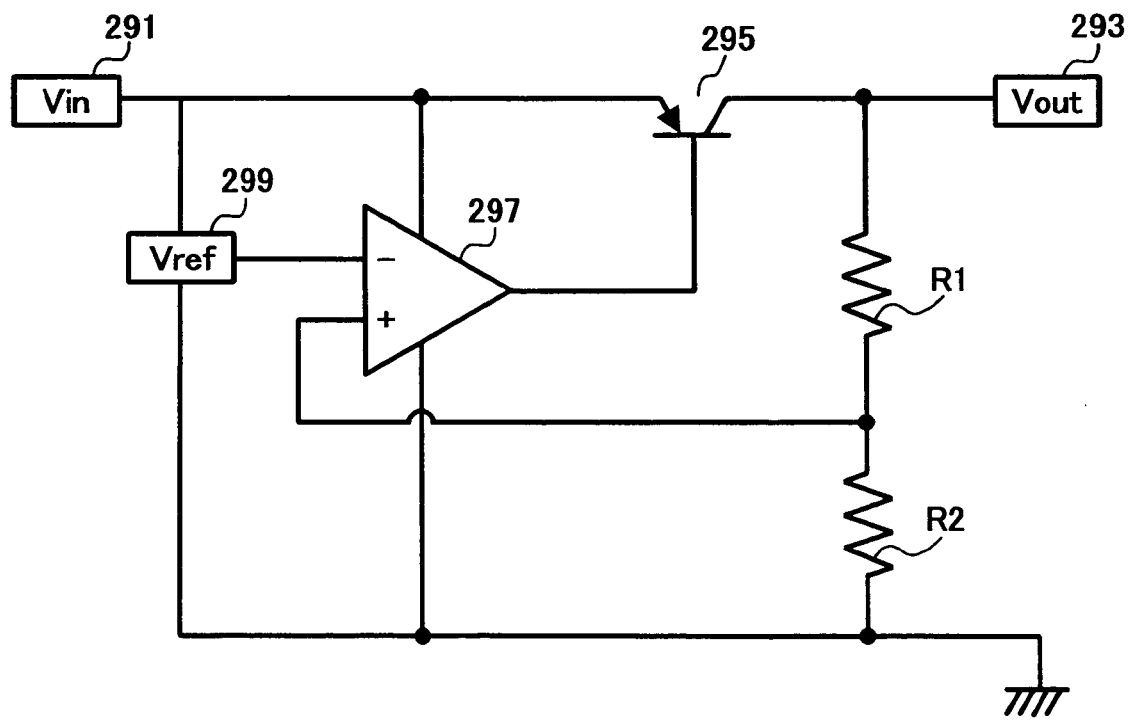
FIG. 29 is an electrical schematic diagram illustrating a voltage stabilizer incorporating a bipolar transistor according to one exemplary embodiment.

FIG. 29 is an electrical schematic diagram illustrating a voltage stabilizer incorporating the bipolar transistor disclosed herein.

Referring to FIG. 29, the voltage stabilizer includes at least a PNP bipolar transistor 95 as an output transistor, provided between an input terminal V in 91 to be connected to a power source and an output terminal V out 93 to be connected to a load. A differential amplifier circuit 97 is additionally included. The output terminal of the differential amplifier circuit 97 is connected to a gate electrode of the PNP bipolar transistor 95, while the inverting input terminal thereof is connected to a voltage reference circuit V ref 99.

Therefore, to the inverting input terminal of the differential amplifier circuit 97, a reference voltage is input from the voltage reference circuit V ref 99, and the voltage, which is output from the PNP bipolar transistor 95 and then divided by dividing resistors R1 and R2, is input to the non-inverting input terminal.

The source power for the differential amplifier circuit 97 and voltage reference circuit V ref 99 is supplied from the input terminal V in 91. The differential amplifier circuit 97, voltage reference circuit V ref 99 and dividing resistor R 2 are grounded.

The PNP bipolar transistor disclosed herein is thus used as the component transistor 311 incorporated into the present voltage stabilizer. This facilitates to decrease the size of an output driver, and to miniaturize the chip area yet attaining high withstand voltages.

When an input voltage from the terminal 91 is decreased in the present circuit, the resultant voltage is output in proportion with the division by the divider. In such a case, a constant voltage output is obtained by changing the on resistance of the PNP bipolar transistor 95 depending on the current supplied to the external load.

This can be achieved by comparing the reference voltage from the voltage reference circuit V ref with a feedback voltage from the dividing resistors, R1 and R2, by means of the differential amplifier circuit 97.

Figure 30:
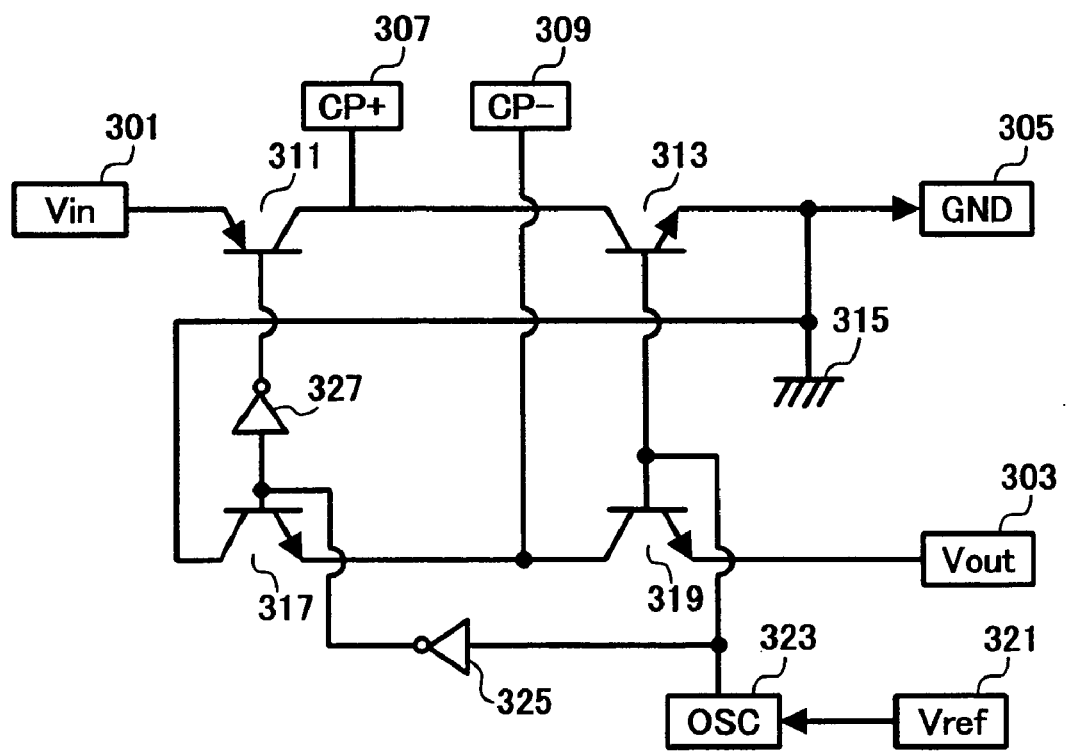
FIG. 30 is an electrical schematic diagram illustrating an inverting type charge pump DC/DC converter incorporating bipolar transistors disclosed herein according to another exemplary embodiment.

FIG. 30 is an electrical schematic diagram illustrating an inverting type charge pump DC/DC converter incorporating bipolar transistors disclosed herein according to another embodiment disclosed herein.

Referring to FIG. 30, the DC/DC inverter includes at least an input terminal V in 301, an inverting output terminal V out 303, a ground terminal GND 305, a charge capacity positive terminal CP+ 307, and a charge capacity negative terminal CP– 309. A capacitor (not shown) as an external component is further included between the charge capacity positive terminal CP+ 307 and the charge capacity negative terminal CP– 309.

Additionally provided between input terminal V in 301 and ground terminal GND 305 in order are a PNP bipolar transistor 311 and an NPN bipolar transistor 313. The charge capacity positive terminal CP+ 307 is connected between PNP bipolar transistor 311 and NPN bipolar transistor 313. The junction between NPN bipolar transistor 313 and ground terminal GND 305 is connected to the ground potential 315.

In addition, NPN bipolar transistors 317 and 319 are provided in order between the ground potential 315 and output terminal 303. The charge capacity negative terminal 309 is connected between the NPN bipolar transistors 317 and 319.

An oscillator OSC 323 is also provided to transmit two voltages by turns, one being the same voltage as that of the input terminal 301 (V in voltage) and the other the same as that of the ground terminal 305(GND voltage), after comparing with the reference voltage output from a voltage reference circuit V ref 321.

An output terminal of the oscillator OSC 323 is connected, to respective bases of NPN bipolar transistors 313 and 319 directly, to the gate electrode of NPN bipolar transistor 317 by way of an inverter 325, and to the base of PNP bipolar transistor 311 by way of inverters 325 and 327.

This inverting type charge pump DC/DC converter operates so as to exert the switching operations of the four transistors 311, 313, 317 and 319 by applying voltages from the oscillator 323 to respective bases of these transistors, to generate the current by charging and discharging the capacitor connected between the charge capacity positive terminal 307 and the charge capacity negative terminal 309, and to output to the output terminal 303 the voltage generated by inverting the voltage input from the input terminal 301.

At least one of the bipolar transistors disclosed herein is thus used as the component transistors such as the PNP 311, and the NPN bipolar transistors, 113, 115 and 117, incorporated into the present voltage stabilizer. This facilitates to decrease the size of an output driver and miniaturize the chip area yet attaining high withstand voltages.

Upon transmitting the GND voltage from the oscillator OSC 323, the PNP bipolar transistor 311 and the NPN bipolar transistor 317 are turned on, while the NPN bipolar transistors, 113 and 119, are turned off. During this period, the charge is accumulated in the capacitor connected between the charge capacity positive terminal CP+ 307 and the charge capacity negative terminal CP– 309.

In contrast, on transmitting the V in voltage from the oscillator OSC 323, the PNP bipolar transistor 311 and the NPN bipolar transistor 317 are turned off, while the NPN bipolar transistors, 113 and 119, are turned on. The capacitor then dissipates the charge previously accumulated. Since the potential of the output terminal V out 303 is kept lower than the ground terminal 105, a voltage is now obtained, which is inverted from the voltage generated by the previously accumulated charge, and then output to the output terminal 73.

By repeating the above steps, therefore, the current flow can be maintained with the voltage inverted from the voltage input.

While the bipolar transistors disclosed herein are used as the components for forming the circuits such as the voltage stabilizer and DC/DC converter according to the embodiments in reference to FIGS. 29 and 30, the circuit is not limited to those described above, but may also be adapted to any circuits incorporating bipolar transistors.

The semiconductor device fabrication and process steps set forth in the present description may therefore be implemented using suitable host computers and terminals incorporating appropriate processors programmed according to the teachings disclosed herein, as will be appreciated to those skilled in the relevant arts.

Therefore, the present disclosure also includes a computer-based product which may be hosted on a storage medium and include instructions which can be used to program a processor to perform a process in accordance with the present disclosure. The storage medium can include, but is not limited to, any type of disk including floppy disks, optical disks, CD-ROMS, magneto-optical disks, ROMs, RAMs, EPROMs, EEPROMS, flash memory, magnetic or optical cards, or any type of media suitable for storing electronic instructions.

It is apparent from the above description including the examples, the devices and methods disclosed herein have several advantages over similar devices and methods previously known.

Although these advantages are described earlier in this disclosure, they are summarized as follows with respect to the MOS structures disclosed herein.

(1) Since the drain of the LDMOS transistor is formed in the drain well region, having a partial overlap with one of the sides of the gate electrode, an appropriate drain threshold and also low on resistance can be obtained.

(2) The LDMOS semiconductor is formed in a semiconductor substrate, including at least a medium concentration drain region having an impurity concentration smaller than that of a channel well region. As a result, an undue decrease in the effective channel length can be obviated, which may be caused during thermal diffusion process steps for forming both medium concentration drain region and channel well region.

(3) Two regions for forming the P-channel type LDMOS transistor and the P-channel type MOS transistor, respectively, are preferably formed simultaneously in an N-type isolation well region in the semiconductor substrate. Also, a P-type drain well region for forming the P-channel type LDMOS transistor and a P-type well region for forming a conventional N-channel type MOS transistor are formed simultaneously in the N-type isolation well region. As a result, process steps can be simplified.

(4) The semiconductor device incorporating N-type LDMOS transistor and a conventional P-channel type MOS transistor is fabricated, in which an N-type drain well region for forming the N-channel type LDMOS transistor and an N-type well region for forming the conventional P-channel type MOS transistor are formed simultaneously in P conductivity type substrate. As a result, process steps can be simplified.

(5) Although P conductivity type of semiconductor substrates are utilized for forming the above semiconductor devices, N conductivity type of substrates may alternatively be used to form semiconductor devices including components of the opposite conductivity type. As a result, process steps can be simplified.

(6) When both LDMOS transistor and conventional N-channel type MOS transistor are incorporated into the semiconductor device, the gate oxide layer formed contiguously under the LDMOS transistor has a thickness smaller than that of the conventional MOS transistor. This facilitates to decrease the on resistance for the LDMOS transistor.

(7) In the power source unit incorporating the LDMOS transistor disclosed herein, the area for output driver can be decreased because of reduced on resistance values of the transistor.

(8) In the charge pump type DC/DC converter incorporating the LDMOS transistor disclosed herein as at least one of the integrated switches, the chip area required for resistors in practical products can be decreased, since reduced on resistance values facilitate to increase current supply.

(9) Since the drain of the LDMOS transistor is formed spatially separated from the gate electrode having a depth smaller than that of medium concentration drain region or channel well region, an appropriate drain threshold and also low on resistance can be obtained. Since the source is self-aligned with respect to the gate electrode, source resistance values can be reduced and transistor characteristics are stabilized.

In addition, the medium concentration drain region is formed in the self-aligned manner with respect to the gate electrode. As a result, the drain resistance values can be reduced and transistor characteristics are stabilized. Furthermore, since the channel well region is formed in the self-aligned manner with respect to the gate electrode, transistor characteristics of the LDMOS transistor can be stabilized.

(10) In the methods for fabricating the semiconductor device, the step of thermally diffusing impurity ions during the formation of the medium concentration drain region is carried out following ion implantation steps. This gives rise to an increase in the region of the medium concentration drain compared with the region formed without thermal diffusion, to thereby result in an increase in the number of ions possibly introduced in the region. As a result, the resistance of the medium concentration drain region can be decreased along with a decrease in drain resistance yet maintaining high withstand voltages.

(11) In the methods for fabricating the semiconductor device, the step of thermally diffusing impurity ions for forming the medium concentration drain region is carried out simultaneously with the step of thermally diffusing impurity ions for forming the channel well region. As a result, the medium concentration drain region can be increased without including any additional thermal diffusion step.

(12) Also, in the method for fabricating the semiconductor device, the number of impurity ions implanted for forming the channel well region is greater than that for forming the medium concentration drain region. As a result, an undue decrease in the effective channel length can be obviated, which may be caused during thermal diffusion process steps for forming both medium concentration drain region and channel well region.

(13) When both LDMOS and PchMOS transistors are incorporated into the semiconductor device, the P-type polysilicon gate electrode is made of polysilicon layer having a thickness of at least 500 nm and a concentration of the P-type impurity ions ranging from $2.0 \times 10^{18}$ to $1.0 \times 10^{19}$ $cm^{-3}$, and thermal diffusion process steps following the ion implantation for forming the channel well region are carried out at a temperature ranging from 1050 to 1100° C. for a period of time ranging from 100 to 500 min.

As a result, the punch-through of P-type impurities through the gate oxide layer can be prevented, and the decrease in PchMOS withstand voltage values can be obviated.

(14) The method for fabricating the semiconductor device may include a further step for forming the P-type polysilicon gate electrode by first forming a polysilicon layer without including impurity ions on the gate oxide, forming the silicon oxide layer on the polysilicon layer to a thickness ranging from 25 to 50 nm, and subsequently doping P-type impurity ions by implanting through the silicon oxide layer such that an impurity concentration in the polysilicon layer reach the above noted concentration ranging from $2.0 \times 10^{18}$ to $1.0 \times 10^{19}$ $cm^{-3}$.

As a result, the punch-through of P-type ions through the gate oxide layer can be prevented and the impurity concentration in the resultant polysilicon gate electrode can be determined accurately.

Although several advantages are described earlier with respect to the bipolar transistors disclosed herein, they are summarized as follows.

(1) The bipolar transistor structure is further provided with the wiring for connecting the gate electrode with the base to be equipotential one another, to thereby be able to decrease the base width. In addition, since a forward-biased voltage results between the base and emitter, as indicated earlier, a high voltage does not appear at the gate electrode of the transistor.

As a result, the breakdown of the gate dielectric layer can be prevented even when a high voltage such as, for example, the source potential is applied, whereby stable operation characteristics are achieved for the bipolar transistor.

(2) The bipolar transistor structure is alternatively provided with the wiring for connecting the gate electrode with the emitter to be equipotential one another, to thereby be able to decrease the base width. In addition, since a forward-biased voltage results between the base and gate electrode, a forward-biased voltage is applied to the gate electrode.

The breakdown of the gate dielectric layer, therefore, can be prevented even when a high voltage such as, for example, the source potential is applied, whereby stable operation characteristics are achieved for the bipolar transistor.

(3) The high concentration ohmic diffusion layer for collector and the gate electrode are preferably formed spatially separated one another in the transistor. This facilitates to suppress the gate modulation effect, and to further increase threshold voltages.

(4) During the formation of the high concentration ohmic diffusion layer for connecting the collector and the gate electrode spatially separated one another, a medium concentration collector is further provided in the collector in intermediate between the gate electrode and the high concentration ohmic diffusion layer for connecting collector, which is made of a diffusion layer of the first conductivity type having an impurity concentration larger than the collector, and smaller than the high concentration ohmic diffusion layer for connecting collector.

As a result, a collector resistance between the high concentration ohmic diffusion layer for connecting the collector and gate electrode can be reduced, and the current amplification factor can be increased in the high current range.

(5) Since the bipolar transistor disclosed herein is utilized in the power source unit for outputting a constant voltage through voltage comparison and feedback operations, the area for output driver can be reduced yet maintaining high threshold voltages.

(6) Since the bipolar transistor disclosed herein is utilized as at least one of its internal switches in the charge pump type DC/DC converter capable of outputting a persistent current flow, the chip area required for resistors in practical products can be decreased yet maintaining high threshold voltages.

(7) In the methods for fabricating the bipolar transistor herein disclosed, the base and emitter are formed in the self-aligned manner with respect to the gate electrode. This facilitates to determine the current amplification factor of the transistor with the lateral bipolar transistor structure, and also the base width as small as predetermined, through which most of the current flow exists.

In addition, the dispersion in alignment of the base width during photolithographic process steps can be made small enough to be disregarded. The bipolar transistor with high-efficiency can therefore be formed with a reduced ship area.

(9) Also, in the methods for fabricating the bipolar transistor herein, the medium concentration collector is formed in the collector in the self-aligned manner with respect to the gate electrode on the other side of the gate electrode from the base. The position of the medium concentration collector is therefore determined by the edge of the gate electrode. As a result, the dispersion, in alignment during photolithographic process steps, of the distance between the medium concentration collector and the base can be made small enough to be disregarded.

Obviously, additional modifications and variations of the present invention are possible in light of the above teachings. It is therefore to be understood that within the scope of the appended claims, the invention may be practiced otherwise than as specifically described herein.

This document claims priority and contains subject matter related to Japanese Patent Applications No. 2001-195380 and 2001-219446, filed with the Japanese Patent Office on Jun. 27, 2001 and Jul. 19, 2001, respectively, the entire contents of which are hereby incorporated by reference.

What is claimed as new and desired to be protected by Letters Patent of the United States is:

1. A power source unit comprising a circuit which outputs a constant voltage by comparing an output voltage with a reference voltage and which provides feedback of said output voltage to an input of said circuit, said circuit comprising:
    an LDMOS (lateral double-diffusion MOS) transistor, said LDMOS transistor comprising:
    a semiconductor substrate;
    a gate oxide layer formed on said semiconductor substrate having a uniform thickness;
    a gate electrode formed on said gate oxide layer;
    a drain well region of a first conductivity type formed in a region including said gate electrode;
    a channel well region of a second conductivity type opposite to that of said first conductivity type with an impurity concentration larger than that of said drain well region, formed in said drain well region having a partial overlap with said gate electrode;
    a source of said first conductivity type formed contiguously to one side of said gate electrode in said channel well region;
    a medium concentration drain region of said first conductivity type with an impurity concentration larger than that of said drain well region formed in said drain well region, having a partial overlap with another side of said gate electrode; and
    a drain of said first conductivity type with an impurity concentration larger than that of said medium concentration drain region, formed in said medium concentration drain region spatially separated from said gate electrode.

2. The power source unit according to claim 1, wherein said medium concentration drain region has an impurity concentration smaller than that of said channel well region.

3. The power source unit according to claim 1, further comprising:
    a conventional P-channel type MOS transistor; and
    a conventional N-channel type MOS transistor;
    wherein said semiconductor substrate is of P-conductivity type;
    said LDMOS transistor is of P-channel type;
    two regions for forming therein said P-channel type LDMOS transistor and said P-channel type MOS transistor, respectively, are formed simultaneously in an N-type isolation well region in said semiconductor substrate; and
    a P-type drain well region for forming said P-channel type LDMOS transistor and a P-type well region for forming said conventional N-channel type MOS transistor are formed simultaneously in said N-type isolation well region in said semiconductor substrate.

4. The power source unit according to claim 3, wherein said gate oxide layer formed contiguously under said P-channel type LDMOS transistor has a thickness smaller than that of said conventional P-channel type and N-channel type MOS transistors, wherein said thickness of conventional P-channel and N-channel type MOS transistors is approximately 65 nm thick.

5. The power source unit according to claim 1, further comprising:
    a conventional P-channel type MOS transistor,
    wherein said semiconductor substrate is of P-conductivity type;
    said LDMOS transistor is of N-channel type; and
    an N-type drain well region for forming said N-channel type LDMOS transistor and an N-type well region for forming said conventional P-channel type MOS transistor are formed simultaneously in said semiconductor substrate.

6. The power source unit according to claim 5, wherein said gate oxide layer formed contiguously under said N-channel type LDMOS transistor has a thickness smaller than that of said conventional P-channel type MOS transistor, wherein said thickness of conventional P-channel type MOS transistor is approximately 65 nm thick.

7. The power source unit according to claim 1, further comprising:
a conventional P-channel type MOS transistor; and
a conventional N-channel type MOS transistor;
wherein said semiconductor substrate is of N-conductivity type;
said LDMOS transistor is of N-channel type;
two regions for forming therein said N-channel type LDMOS transistor and said N-channel type MOS transistor, respectively, are formed simultaneously in a P-type isolation well region in said semiconductor substrate; and
an N-type drain well region for forming said N-channel type LDMOS transistor and an N-type well region for forming said conventional P-channel type MOS transistor are formed simultaneously in said P-type isolation well region in said semiconductor substrate.

8. The power source unit according to claim 7, wherein said gate oxide layer formed contiguously under said N-channel type LDMOS transistor has a thickness smaller than that of said conventional P-channel type and N-channel type MOS transistors, wherein said thickness of conventional P-channel and N-channel type MOS transistors is approximately 65 nm thick.

9. The power source unit according to claim 1, further comprising:
a conventional N-channel type MOS transistor;
wherein said semiconductor substrate is of N-conductivity type;
said LDMOS transistor is of P-channel type; and
a P-type drain well region for forming said P-channel type LDMOS transistor and a P-type well region for forming said conventional N-channel type MOS transistor are formed simultaneously in said semiconductor substrate.

10. The power source unit according to claim 9, wherein said gate oxide layer formed contiguously under said P-channel type LDMOS transistor has a thickness smaller than that of said conventional N-channel type MOS transistor, wherein said thickness of conventional N-channel type MOS transistor is approximately 65 nm thick.

11. A charge pump-type DC/DC converter unit which outputs a constant current flow by charging and discharging a capacitor which is performed through switching operations by a plurality of integrated switches, wherein at least one of said plurality of integrated switches is an LDMOS transistor comprising:
an LDMOS (lateral double-diffusion MOS) transistor, said LDMOS transistor comprising:
a semiconductor substrate;
a gate oxide layer formed on said semiconductor substrate having a uniform thickness;
a gate electrode formed on said gate oxide layer;
a drain well region of a first conductivity type formed in a region including said gate electrode;
a channel well region of a second conductivity type opposite to that of said first conductivity type with an impurity concentration larger than that of said drain well region, formed in said drain well region having a partial overlap with said gate electrode;
a source of said first conductivity type formed contiguously to one side of said gate electrode in said channel well region;
a medium concentration drain region of said first conductivity type with an impurity concentration larger than that of said drain well region formed in said drain well region, having a partial overlap with another side of said gate electrode; and
a drain of said first conductivity type with an impurity concentration larger than that of said medium concentration drain region, formed in said medium concentration drain region spatially separated from said gate electrode.

12. The charge pump-type DC/DC converter unit according to claim 11, wherein said medium concentration drain region has an impurity concentration smaller than that of said channel well region.

13. The charge pump-type DC/DC converter unit according to claim 11, further comprising:
a conventional P-channel type MOS transistor; and
a conventional N-channel type MOS transistor;
wherein said semiconductor substrate is of P-conductivity type;
said LDMOS transistor is of P-channel type;
two regions for forming therein said P-channel type LDMOS transistor and said P-channel type MOS transistor, respectively, are formed simultaneously in an N-type isolation well region in said semiconductor substrate; and
a P-type drain well region for forming said P-channel type LDMOS transistor and a P-type well region for forming said conventional N-channel type MOS transistor are formed simultaneously in said N-type isolation well region in said semiconductor substrate.

14. The charge pump-type DC/DC converter unit according to claim 13, wherein said gate oxide layer formed contiguously under said P-channel type LDMOS transistor has a thickness smaller than that of said conventional P-channel type and N-channel type MOS transistors, wherein said thickness of conventional P-channel and N-channel type MOS transistors is approximately 65 nm thick.

15. The charge pump-type DC/DC converter unit according to claim 11, further comprising:
a conventional P-channel type MOS transistor, wherein said semiconductor substrate is of P-conductivity type;
said LDMOS transistor is of N-channel type; and
an N-type drain well region for forming said N-channel type LDMOS transistor and an N-type well region for forming said conventional P-channel type MOS transistor are formed simultaneously in said semiconductor substrate.

16. The charge pump-type DC/DC converter unit according to claim 15, wherein said gate oxide layer formed contiguously under said N-channel type LDMOS transistor has a thickness smaller than that of said conventional P-channel type MOS transistor, wherein said thickness of conventional P-channel type MOS transistor is approximately 65 nm thick.

17. The charge pump-type DC/DC converter unit according to claim 11, further comprising:
a conventional P-channel type MOS transistor; and
a conventional N-channel type MOS transistor;
wherein said semiconductor substrate is of N-conductivity type;
said LDMOS transistor is of N-channel type;

two regions for forming therein said N-channel type LDMOS transistor and said N-channel type MOS transistor, respectively, are formed simultaneously in a P-type isolation well region in said semiconductor substrate; and an N-type drain well region for forming said N-channel type LDMOS transistor and an N-type well region for forming said conventional P-channel type MOS transistor are formed simultaneously in said P-type isolation well region in said semiconductor substrate.

18. The charge pump-type DC/DC converter unit according to claim 17, wherein said gate oxide layer formed contiguously under said N-channel type LDMOS transistor has a thickness smaller than that of said conventional P-channel type and N-channel type MOS transistors, wherein said thickness of conventional P-channel and N-channel type MOS transistors is approximately 65 nm thick.

19. The charge pump-type DC/DC converter unit according to claim 11, further comprising:

a conventional N-channel type MOS transistor;

wherein said semiconductor substrate is of N-conductivity type;

said LDMOS transistor is of P-channel type; and a P-type drain well region for forming said F-channel type LDMOS transistor and a P-type well region for forming said conventional N-channel type MOS transistor are formed simultaneously in said semiconductor substrate.

20. The charge pump-type DC/DC converter unit according to claim 19, wherein said gate oxide layer formed contiguously under said P-channel type LDMOS transistor has a thickness smaller than that of said conventional N-channel type MOS transistor, wherein said thickness of conventional N-channel type MOS transistor is approximately 65 nm thick.

* * * * *